US012369317B2

(12) United States Patent
Zhang

(10) Patent No.: US 12,369,317 B2
(45) Date of Patent: Jul. 22, 2025

(54) THREE-DIMENSIONAL MEMORY DEVICES HAVING A SUPPORT STACK COMPRISING A SACRIFICIAL DIELECTRIC LAYER, AND FABRICATING METHODS THEREOF

(71) Applicant: Yangtze Memory Technologies Co., Ltd., Hubei (CN)

(72) Inventor: Kun Zhang, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 613 days.

(21) Appl. No.: 17/736,409

(22) Filed: May 4, 2022

(65) Prior Publication Data

US 2023/0282280 A1 Sep. 7, 2023

Related U.S. Application Data

(63) Continuation of application No. PCT/CN2022/078977, filed on Mar. 3, 2022.

(51) Int. Cl.
*H10B 41/27* (2023.01)
*G11C 16/04* (2006.01)
(Continued)

(52) U.S. Cl.
CPC ......... *H10B 41/27* (2023.02); *G11C 16/0483* (2013.01); *H01L 23/5283* (2013.01); *H10B 41/35* (2023.02); *H10B 41/40* (2023.02); *H10B 43/27* (2023.02); *H10B 43/35* (2023.02); *H10B 43/40* (2023.02)

(58) Field of Classification Search
CPC ..... H01L 23/5283; H10B 41/20; H10B 41/27; H10B 41/35; H10B 41/40; H10B 41/41; H10B 41/50; H10B 43/20; H10B 43/27; H10B 43/30; H10B 43/35; H10B 43/40; H10B 43/50; G11C 16/0483
See application file for complete search history.

(56) References Cited

U.S. PATENT DOCUMENTS

| | | |
|---|---|---|
| 2018/0301374 A1 | 10/2018 | Masamori et al. |
| 2021/0035965 A1* | 2/2021 | Mizutani ................ H01L 25/18 |
| 2021/0375912 A1 | 12/2021 | Zhang et al. |

OTHER PUBLICATIONS

International Search Report and Written Opinion of the International Searching Authority directed to International Patent Application No. PCT/CN2022/078977, mailed Jul. 29, 2022; 13 pages.

* cited by examiner

*Primary Examiner* — Cheung Lee
(74) *Attorney, Agent, or Firm* — Hanley, Flight & Zimmerman, LLC

(57) ABSTRACT

A method for forming a 3D memory device is provided. The method comprises forming an array wafer including a core array region, a staircase region, and a periphery region. Forming the array wafer includes forming an alternating dielectric stack on a first substrate, forming a plurality of channel structures in the alternating dielectric stack in the core array region, each channel structure including a functional layer and a channel layer, forming a staircase structure in the staircase region, and forming a plurality of dummy channel structures. The method further comprises bonding a CMOS wafer to the array wafer; and removing the first substrate; removing a portion of functional layer of each channel structure to expose channel layer, and doping the exposed portion of the channel layer.

19 Claims, 43 Drawing Sheets

(51) Int. Cl.
*H01L 23/528* (2006.01)
*H10B 41/35* (2023.01)
*H10B 41/40* (2023.01)
*H10B 43/27* (2023.01)
*H10B 43/35* (2023.01)
*H10B 43/40* (2023.01)

THREE-DIMENSIONAL MEMORY DEVICES HAVING A SUPPORT STACK COMPRISING A SACRIFICIAL DIELECTRIC LAYER, AND FABRICATING METHODS THEREOF

CROSS-REFERENCE TO RELATED APPLICATIONS

This application claims priority to PCT Application No. PCT/CN2022/078977, filed on Mar. 3, 2022, which is incorporated herein by reference in its entirety.

BACKGROUND

Embodiments of the present disclosure relate to three-dimensional (3D) memory devices and fabrication methods thereof.

Planar memory cells are scaled to smaller sizes by improving process technology, circuit designs, programming algorithms, and fabrication processes. However, as feature sizes of the memory cells approach a lower limit, planar processes and fabrication techniques become challenging and costly. As a result, memory density for planar memory cells approaches an upper limit.

A 3D memory architecture can address the upper density limitation in planar memory cells. The 3D memory architecture includes a memory array and peripheral devices for controlling signals to and from the memory array.

BRIEF SUMMARY

Embodiments of method for forming gate structures of 3D memory devices and fabrication methods thereof are disclosed herein.

Disclosed is a method for forming a three-dimensional (3D) NAND memory device, comprising: forming an array wafer including a core array region, a staircase region, and a periphery region, comprising: forming an alternating dielectric stack on a first substrate, forming a plurality of channel structures in the alternating dielectric stack in the core array region, each channel structure including a functional layer and a channel layer, forming a staircase structure in the staircase region, and forming a plurality of dummy channel structures, and bonding a CMOS wafer to the array wafer; and removing the first substrate; removing a portion of functional layer of each channel structure to expose channel layer, and doping the exposed portion of the channel layer.

In some embodiments, the method can further comprises: before forming the alternating dielectric stack, forming a support stack on the first substrate, wherein the alternating dielectric stack is formed on the support stack; and before removing the portion of functional layer of each channel structure, removing portions of the support stack.

In some embodiments, forming the plurality of dummy channel structures comprises: forming the plurality of dummy channel structures penetrating the alternating dielectric stack and the support stack, and extending into the first substrate.

In some embodiments, forming the plurality of dummy channel structures comprises: forming the plurality of dummy channel structures penetrating the alternating dielectric stack without penetrating the support stack.

In some embodiments, forming the array wafer further comprises: forming a plurality of slits penetrating the alternating dielectric stack and the support stack; and forming an array common source contact in each slit.

In some embodiments, the method can further comprises: transforming the alternating dielectric stack into an alternating conductor/dielectric stack.

In some embodiments, forming the array wafer further comprises: forming a plurality of word line contacts in the staircase region; and forming a plurality of peripheral contacts in the peripheral region.

In some embodiments, forming the array wafer further comprises: forming an array joint layer including a plurality of interconnect contacts; wherein the CMOS wafer is bonded to the array joint layer of the array wafer.

In some embodiments, bonding the CMOS wafer to the array wafer comprises: preparing the CMOS wafer including a second substrate, a peripheral circuit layer on the second substrate, and a CMOS joint layer on the peripheral circuit layer; and bonding the CMOS joint layer of the CMOS wafer to the array joint layer of the array wafer to form a bonded structure.

In some embodiments, the method can further comprises: forming the support stack comprises: forming a sacrificial dielectric layer on the first substrate; forming a first semiconductor layer on the sacrificial dielectric layer; and forming a second semiconductor layer on the first semiconductor layer.

In some embodiments, removing the first substrate and portions of the support stack comprises: removing the first substrate by using the sacrificial dielectric layer as an etch stop layer; removing portions of the sacrificial dielectric layer in the core array region and periphery region; and removing portions of the first semiconductor layer in the core array region and periphery region.

In some embodiments, the method can further comprises: removing the portion of functional layer of each channel structure comprises: removing portions of a barrier layer, a storage layer, and a tunneling layer of each channel structure that are located above the second semiconductor layer; and simultaneously removing the portions of the sacrificial dielectric layer in the staircase region.

In some embodiments, the method can further comprises: forming a supplementary semiconductor layer electrically connected with the doped portion of the channel layer of each channel structure.

In some embodiments, the method can further comprises: forming a pad layer on the supplementary semiconductor layer and electrically connected with the channel layer of each channel structure.

In some embodiments, forming the alternating dielectric stack comprises: forming a plurality of dielectric layer pairs stacked on the support stack, each dielectric layer pair including a first dielectric layer and a second dielectric layer different from first dielectric layer.

In some embodiments, transforming the alternating dielectric stack into the alternating conductor/dielectric stack comprises: removing the plurality of second dielectric layers in the alternating dielectric stack through the slits to form a plurality of horizontal trenches; and forming a gate structure in each horizontal trench.

Another aspect of the three-dimensional (3D) memory device, comprising: a CMOS wafer; and an array wafer connected on the CMOS wafer, the array wafer including a core array region, a staircase region, and a periphery region, comprising: an alternating conductor/dielectric stack, including a staircase structure in the staircase region, and a plurality of channel structures in the alternating conductor/dielectric stack in the core array region, each channel structure including a functional layer and a channel layer, and the channel layer including a doped portion, a plurality of dummy channel structures penetrating the alternating conductor/dielectric stack, and a support stack in the staircase region.

In some embodiments, the device can further comprises: a supplementary semiconductor layer electrically connected with the doped portion of the channel layer of each channel structure; and a pad layer on the supplementary semiconductor layer and electrically connected with the channel layer of each channel structure.

In some embodiments, an upper end of each dummy channel structure is in contact with the supplementary semiconductor layer.

In some embodiments, an upper end of each dummy channel structure is in contact with a first semiconductor layer of the support stack.

In some embodiments, the device can further comprises: a plurality of slits penetrating the alternating conductor/dielectric stack; and an array common source contact in each slit and electrically connected to the supplementary semiconductor layer.

In some embodiments, the array wafer further comprises: a plurality of word line contacts in the staircase region; and a plurality of peripheral contacts in the peripheral region.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 1 illustrates a schematic diagram of a 3D memory device in a perspective view in accordance with some embodiments of the present disclosure.

Figure 1:
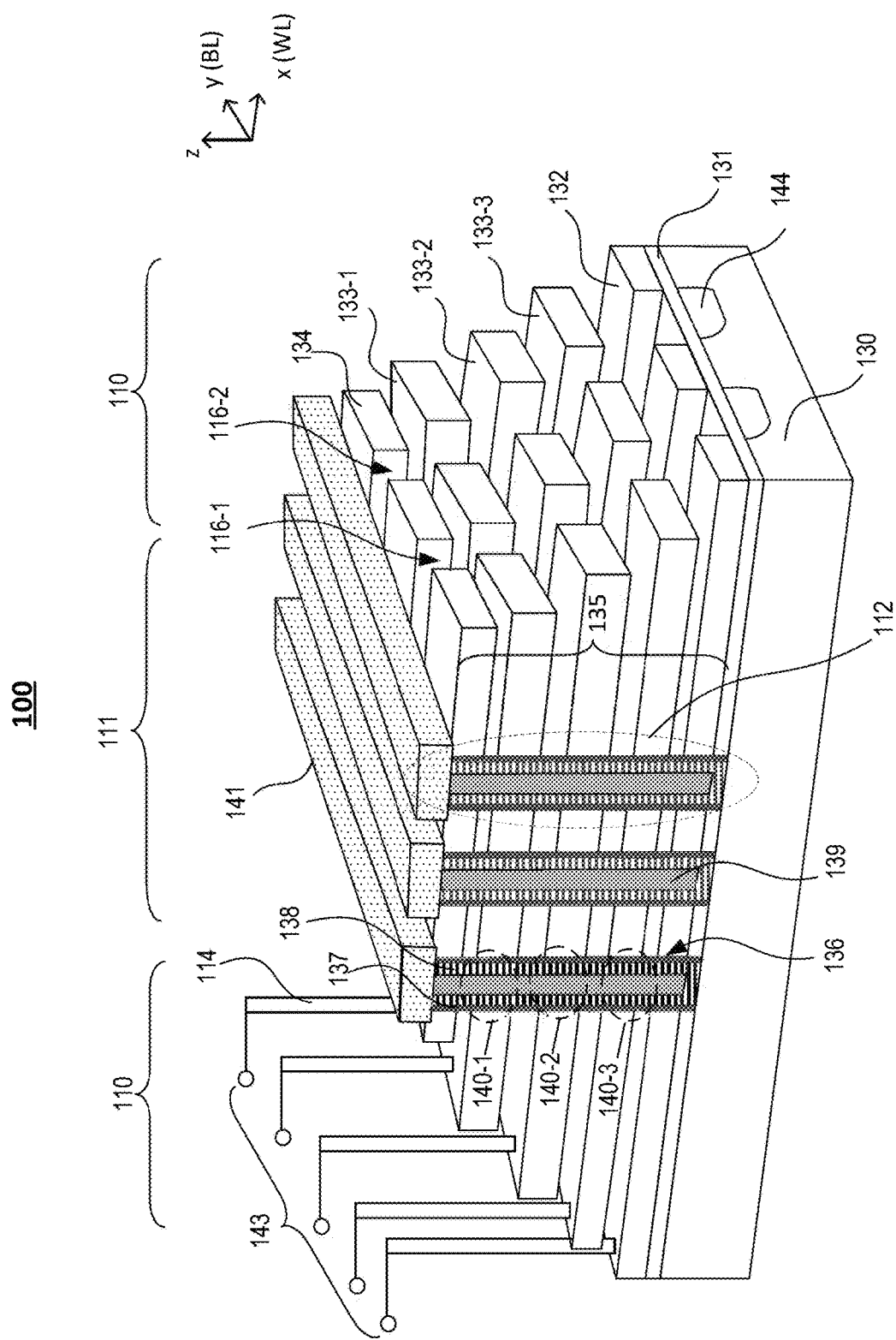
FIG. 1 illustrates a schematic perspective of an exemplary three-dimensional (3D) memory die, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

As semiconductor technology advances, three-dimensional (3D) memory devices, such as 3D NAND memory devices, keep scaling more oxide/nitride (ON) layers. Generally, in some methods for forming a 3D memory device, a complementary metal-oxide-semiconductor wafer ("CMOS wafer" hereinafter) is bonded with a memory cell array wafer ("array wafer" hereinafter) to form a framework of the 3D memory device. In a multiple decks of oxide/nitride (ON) stacks configuration, it becomes difficult to control the overlay of the etching process to form the channel holes and/or gate line slits in the 3D memory devices that have a substantial depth. As the channel hole aspect ratio increases, channel hole etching becomes exponentially slower. Further, the process capability control of the formed channel holes, including bow-free, straight profile, critical dimension (CD) uniformity, minimal twisting, etc., tend to be more challenging. If the overlay of the multi-deck channel hole etching process is not controlled well, potential damages to the channel side wall and bottom layers may occur to result in word line to array common source leakage. In such case, difficulties of forming epitaxial layers on the bottom of channel holes and/or gate line slits.

Accordingly, a new 3D memory device and a fabricating method thereof are provided to address such issues. It is noted that, the 3D memory device can be a part of a non-monolithic 3D memory device, in which components (e.g., the CMOS devices and the memory cell array device) are formed separately on different wafers and then bonded in a face-to-face manner. In some embodiments, the array wafer is flipped and faces down towards the CMOS wafer for hybrid bonding, so that in the bonded non-monolithic 3D memory device, the array wafer is above the CMOS wafer. It is understood that in some other embodiments, the array wafer remains as the substrate of the bonded non-monolithic 3D memory device, and the CMOS wafer is flipped and faces down towards the array wafer for hybrid bonding.

FIG. 1 illustrates a perspective view of a portion of an exemplary three-dimensional (3D) memory array structure 100, according to some existing 3D NAND memory. The memory array structure 100 includes a substrate 130, an insulating film 131 over the substrate 130, a tier of bottom select gates (BSGs) 132 over the insulating film 131, and a plurality of tiers of control gates 133, also referred to as "word lines" (WLs) stacking on top of the BSGs 132 to form a film stack 135 of alternating conductive and dielectric layers. The dielectric layers adjacent to the tiers of control gates are not shown in FIG. 1 for clarity.

The control gates of each tier are separated by slit structures 116-1 and 116-2 through the film stack 135. The memory array structure 100 also includes a tier of top select gates (TSGs) 134 over the stack of control gates 133. The stack of TSGs 134, control gates 133 and BSGs 132 is also referred to as "gate electrodes." The memory array structure 100 further includes memory strings 112 and doped source line regions 144 in portions of substrate 130 between adjacent BSGs 132. Each memory strings 112 includes a channel hole 136 extending through the insulating film 131 and the film stack 135 of alternating conductive and dielectric layers. Memory strings 112 also includes a memory film 137 on a sidewall of the channel hole 136, a channel layer 138 over the memory film 137, and a core filling film 139 surrounded by the channel layer 138. A memory cell 140 can be formed at the intersection of the control gate 133 and the memory string 112. A portion of the channel layer 138 underneath the control gate 133 is also referred to as the channel of the memory cell 140. The memory array structure 100 further includes a plurality of bit lines (BLs) 141 connected with the memory strings 112 over the TSGs 134. The memory array structure 100 also includes a plurality of metal interconnect lines 143 connected with the gate electrodes through a plurality of contact structures 114. The edge of the film stack 135 is configured in a shape of staircase to allow an electrical connection to each tier of the gate electrodes.

In FIG. 1, for illustrative purposes, three tiers of control gates 133-1, 133-2, and 133-3 are shown together with one tier of TSG 134 and one tier of BSG 132. In this example, each memory string 112 can include three memory cells 140-1, 140-2 and 140-3, corresponding to the control gates 133-1, 133-2 and 133-3, respectively. The number of control gates and the number of memory cells can be more than three to increase storage capacity. The memory array structure 100 can also include other structures, for example, TSG cut structures, common source contacts and dummy memory strings, etc. These structures are not shown in FIG. 1 for simplicity.

Figure 2:
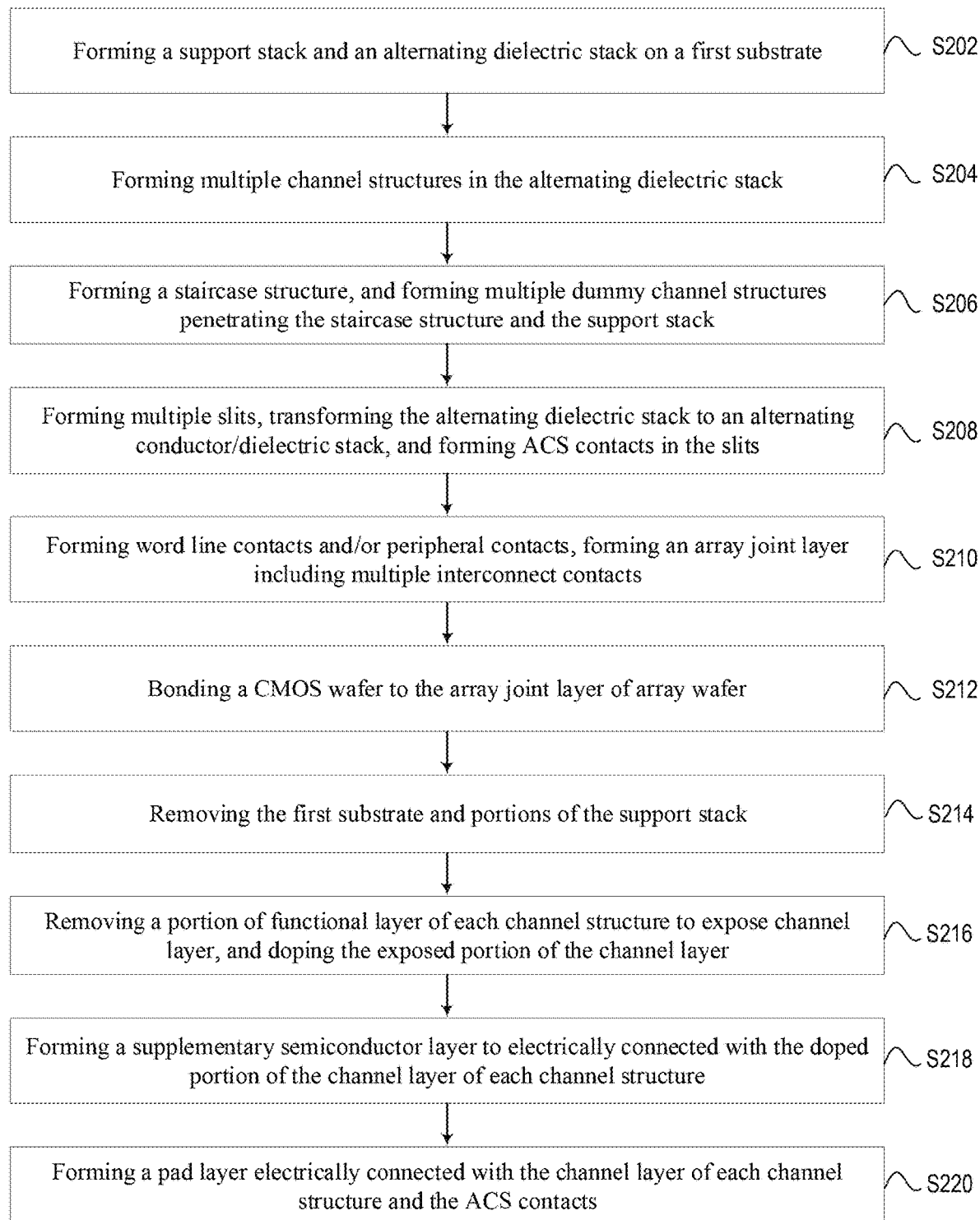
FIG. 2 illustrate flow diagrams of an exemplary method for forming a 3D memory device, according to some embodiments of the present disclosure.
Figure 3A:
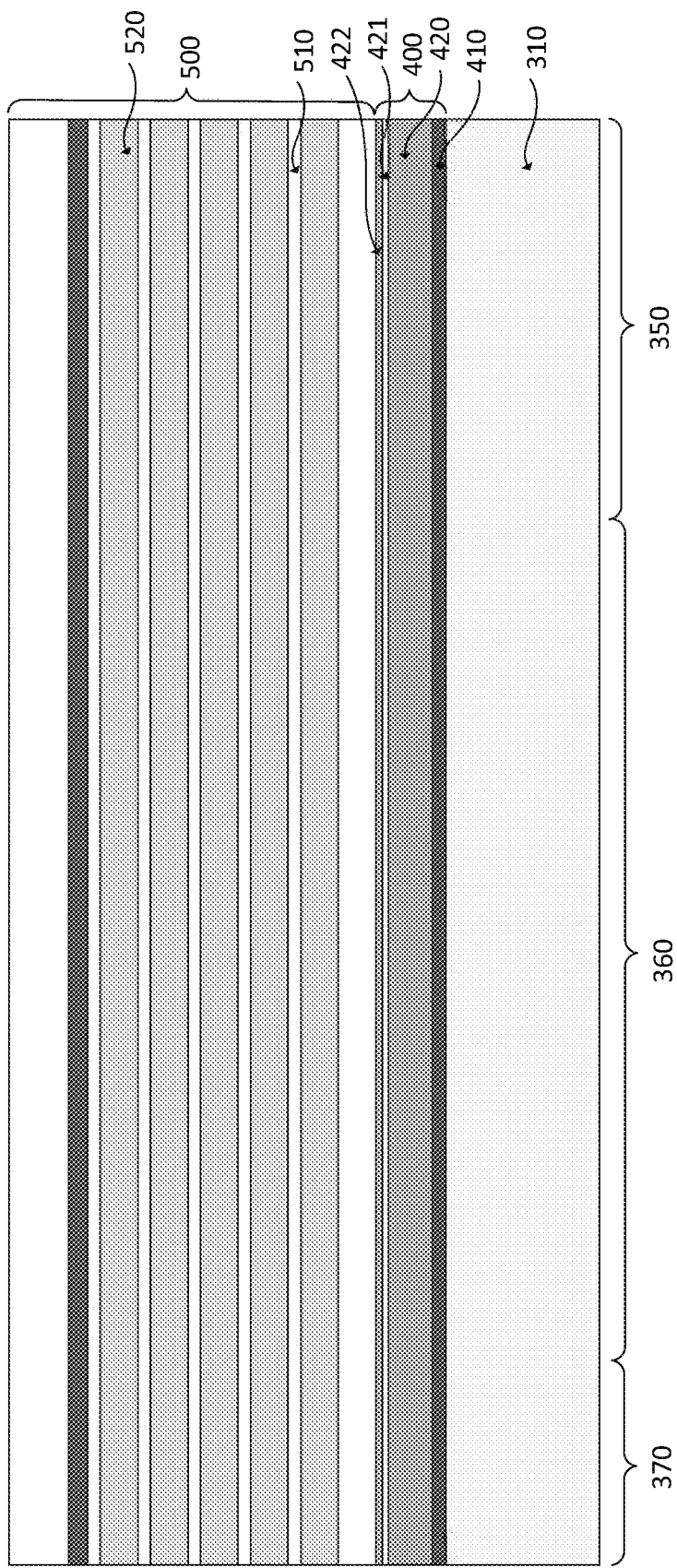
FIGS. 3A-3T illustrate schematic cross-sectional views of an exemplary 3D memory device at certain fabricating stages of the method shown in FIG. 2 according to some embodiments of the present disclosure.
Figure 3B:
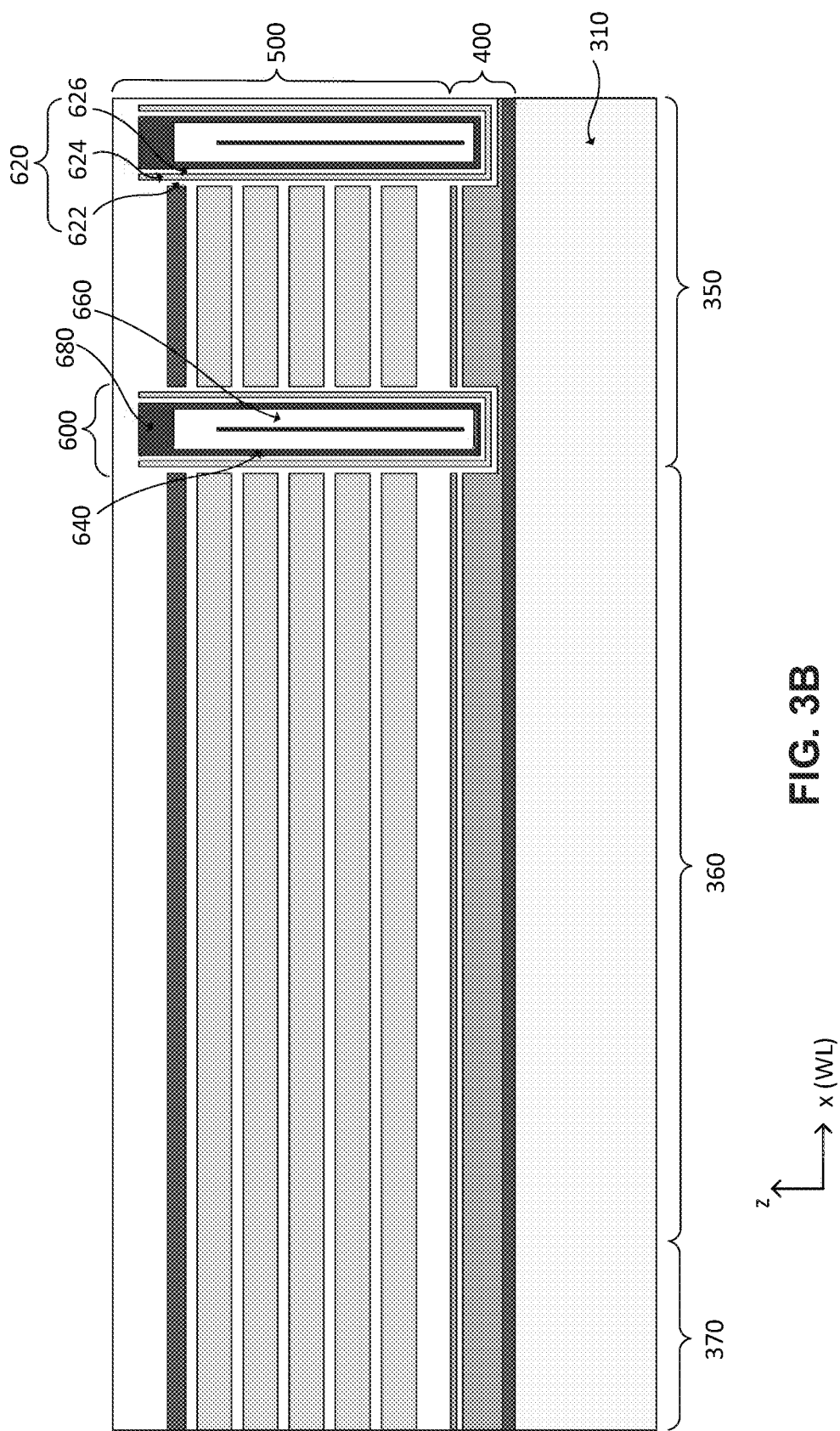

Referring to FIG. 2, a flow diagram of an exemplary method for forming a 3D memory device is illustrated in accordance to some embodiments of the present disclosure. It should be understood that the operations and/or steps shown in FIG. 2 are not exhaustive and that other operations can be performed as well before, after, or between any of the illustrated operations. FIGS. 3A-3T illustrate schematic cross-sectional views of an exemplary 3D memory device at certain fabricating stages of the method shown in FIG. 2 according to some embodiments of the present disclosure.

As shown in FIG. 2, the method starts at operation S202, in which a support stack and an alternating dielectric stack can be formed on a first substrate. In some embodiments as shown in FIG. 3A, the formed structure can include a core array region 350, a staircase region 360 and a periphery region 370.

In some embodiments, the first substrate 310 be any suitable semiconductor substrate having any suitable structure, such as a monocrystalline single-layer substrate, a polycrystalline silicon (polysilicon) single-layer substrate, a polysilicon and metal multi-layer substrate, etc.

A support stack 400 can be formed on the first substrate 310. The support stack 400 can include a sacrificial dielectric layer 410, a first semiconductor layer 420, a second semiconductor layer 422, and an intermediate layer 421 between the first semiconductor layer 420 and the second semiconductor layer 422. In some embodiments, the sacrificial dielectric layer 410 can be ax oxide layer, such as a silicon oxide layer. The first and second semiconductor layers 420 and 422 can be amorphous silicon layers separated by an insulating layer as the intermediate layer. Some portions of the sacrificial dielectric layer 410 and first semiconductor layer 420 can be removed in subsequent processes. The support stack 400 are extended in a lateral direction that is parallel to a surface of the first substrate 310. In some embodiments, the support stack 400 can be formed by one or more thin film deposition processes including, but not limited to, CVD, PVD, ALD, or any combination thereof.

An alternating dielectric stack 500 can be formed on the support stack 400. The alternating dielectric stack 500 can including a plurality of dielectric layer pairs. Each dielectric layer pair of the alternating dielectric stack 500 can include a first dielectric layer 510 and a second dielectric layer 520 that is different from first dielectric layer 510. In some embodiments, the first dielectric layers 510 can be used as insulating layers, and the second dielectric layer 520 can be used as sacrificial layers, which are to be removed in the subsequent processes.

The plurality of first dielectric layers 510 and second dielectric layers 520 are extended in a lateral direction that is parallel to a surface of the first substrate 310. In some embodiments, there are more layers than the dielectric layer pairs made of different materials and with different thicknesses in the alternating dielectric stack 500. The alternating dielectric stack 500 can be formed by one or more thin film deposition processes including, but not limited to, CVD, PVD, ALD, or any combination thereof.

In some embodiments, the alternating dielectric stack 500 can include a plurality of oxide/nitride layer pairs. Each dielectric layer pair includes a layer of silicon oxide 510 and a layer of silicon nitride 520. The plurality of oxide/nitride layer pairs are also referred to herein as an "alternating oxide/nitride stack." That is, in the alternating dielectric stack 500, multiple oxide layers 510 and multiple nitride layers 520 alternate in a vertical direction. In other words, except a top and a bottom layer of a given alternating oxide/nitride stack, each of the other oxide layers 510 can be sandwiched by two adjacent nitride layers 520, and each of the nitride layers 520 can be sandwiched by two adjacent oxide layers 510.

Oxide layers 510 can each have the same thickness or have different thicknesses. For example, a thickness of each oxide layer can be in a range from about 10 nm to about 150 nm. Similarly, nitride layers 520 can each have the same thickness or have different thicknesses. For example, a thickness of each nitride layer can be in a range from about 10 nm to about 150 nm. In some embodiments, a total thickness of the alternating dielectric stack 500 can be larger than 1000 nm. It is noted that, the thickness ranges are provided for illustration, and should not be construed to limit the scope of the appended claims.

It is noted that, in the present disclosure, the oxide layers 510 and/or nitride layers 520 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 500 can include any suitable number of layers of the oxide layers 510 and the nitride layers 520. In some embodiments, a total number of layers of the oxide layers 510 and the nitride layers 520 in the alternating dielectric stack 500 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair. For example, a bottom layer and a top layer in the alternating dielectric stack 500 can be oxide layers 510.

As shown in FIG. 2, the method proceeds to operation S204, in which multiple channel structures can be formed in the alternating dielectric stack in the core array region. In some embodiments as shown in FIG. 3B, each channel structure 600 can include a channel hole extending vertically through the alternating dielectric stack 500, a functional layer 620 on the sidewall of the channel hole, a channel layer 640 between the functional layer 620 and a filling structure 660, and a channel plug 680 on a top of the channel hole. The multiple channel structures 600 can be arranged as an array in the alternating dielectric stack in the core array region 350.

In some embodiments, fabrication processes to form the channel structure include forming multiple channel holes that extend vertically through the alternating dielectric stack 500 to expose the first semiconductor layers 420 of the support stack 400. The channel hole can have a high aspect ratio, and can be formed by etching the alternating dielectric stack 500, and a subsequent cleaning process. The etching process to form the channel hole can be a wet etching, a dry etching, or a combination thereof.

In some embodiments, fabrication processes to form a functional layer 620 on the sidewall of the channel hole. The functional layer 620 can be a composite dielectric layer, such as a combination of a barrier layer 622, a storage layer 624, and a tunneling layer 626. The functional layer 620, including the barrier layer 622, the storage layer 624, and the tunneling layer 626, can be formed by one or more thin film deposition processes, such as ALD, CVD, PVD, any other suitable processes, or any combination thereof.

The barrier layer 622 can be formed between the storage layer 624 and the sidewall of the channel hole. The barrier layer 622 can be used for blocking the outflow of the electronic charges. In some embodiments, the barrier layer 622 can be a silicon oxide layer or a combination of silicon oxide/silicon nitride/silicon oxide (ONO) layers. In some embodiments, the barrier layer 622 includes high dielectric constant (high k-value) dielectrics (e.g., aluminum oxide). In some embodiments, a thickness of the barrier layer 622 can be in a range from about 3 nm to about 20 nm.

The storage layer 624 can be formed between the tunneling layer 626 and the barrier layer 622. Electrons or holes from the channel layer can tunnel to the storage layer 624 through the tunneling layer 626. The storage layer 624 can be used for storing electronic charges (electrons or holes) for memory operation. The storage or removal of charge in the storage layer 624 can impact the on/off state and/or a conductance of the semiconductor channel. The storage layer 624 can include one or more films of materials including, but are not limited to, silicon nitride, silicon oxynitride, a combination of silicon oxide and silicon nitride, or any combination thereof. In some embodiments, the storage layer 624 can include a nitride layer formed by using one or more deposition processes. In some embodiments, a thickness of the storage layer 624 can be in a range from about 3 nm to about 20 nm.

The tunneling layer 626 can be formed on the sidewall of the storage layer 624. The tunneling layer 626 can be used for tunneling electronic charges (electrons or holes). The tunneling layer 626 can include dielectric materials including, but not limited to, silicon oxide, silicon nitride, silicon oxynitride, or any combination thereof. In some embodiments, the tunneling layer 130 can be an oxide layer formed by using a deposition process. In some embodiments, a thickness of the tunneling layer 626 can be in a range from about 3 nm to about 20 nm.

In some embodiments, fabrication processes to form the channel structure 600 further include forming a channel layer 640 covering the sidewall of the functional layer 720, as shown in FIG. 3B. In some embodiments, the channel layer 640 can be an amorphous silicon layer or a polysilicon layer formed by using a thin film deposition process, such as ALD, CVD, PVD, or any other suitable process. In some embodiments, a thickness of the channel layer 640 can be in a range from about 5 nm to 20 nm.

In some embodiments, fabrication processes to form the channel structure 600 further include forming a filling structure 660 to cover the channel layer 640 and fill the channel hole, as shown in FIG. 3B. In some embodiments, the filling structure 660 can be an oxide layer formed by using any suitable deposition process, such as ALD, CVD, PVD, etc. In some embodiments, the filling structure 660 can include one or more air gaps.

In some embodiments, fabrication processes to form the channel structure 600 further include forming a channel plug 680 at a top of each channel hole, as shown in FIG. 3B. The channel plug 680 can be in contact with the channel layer 640 in each channel hole. The material of the channel plugs 680 can include any suitable conductive material, such as Si, W, etc. The channel plugs 680 can be formed by using any suitable deposition process, and a following CMP process.

As shown in FIG. 2, the method proceeds to operation S206, in which portions of the alternating dielectric stack in the staircase region can be removed to form a staircase structure, and a plurality of dummy channel structures can be formed in the staircase region to penetrate the staircase structure and the support stack. An insulating layer can be formed in the staircase region to cover the staircase structure.

Figure 3C:
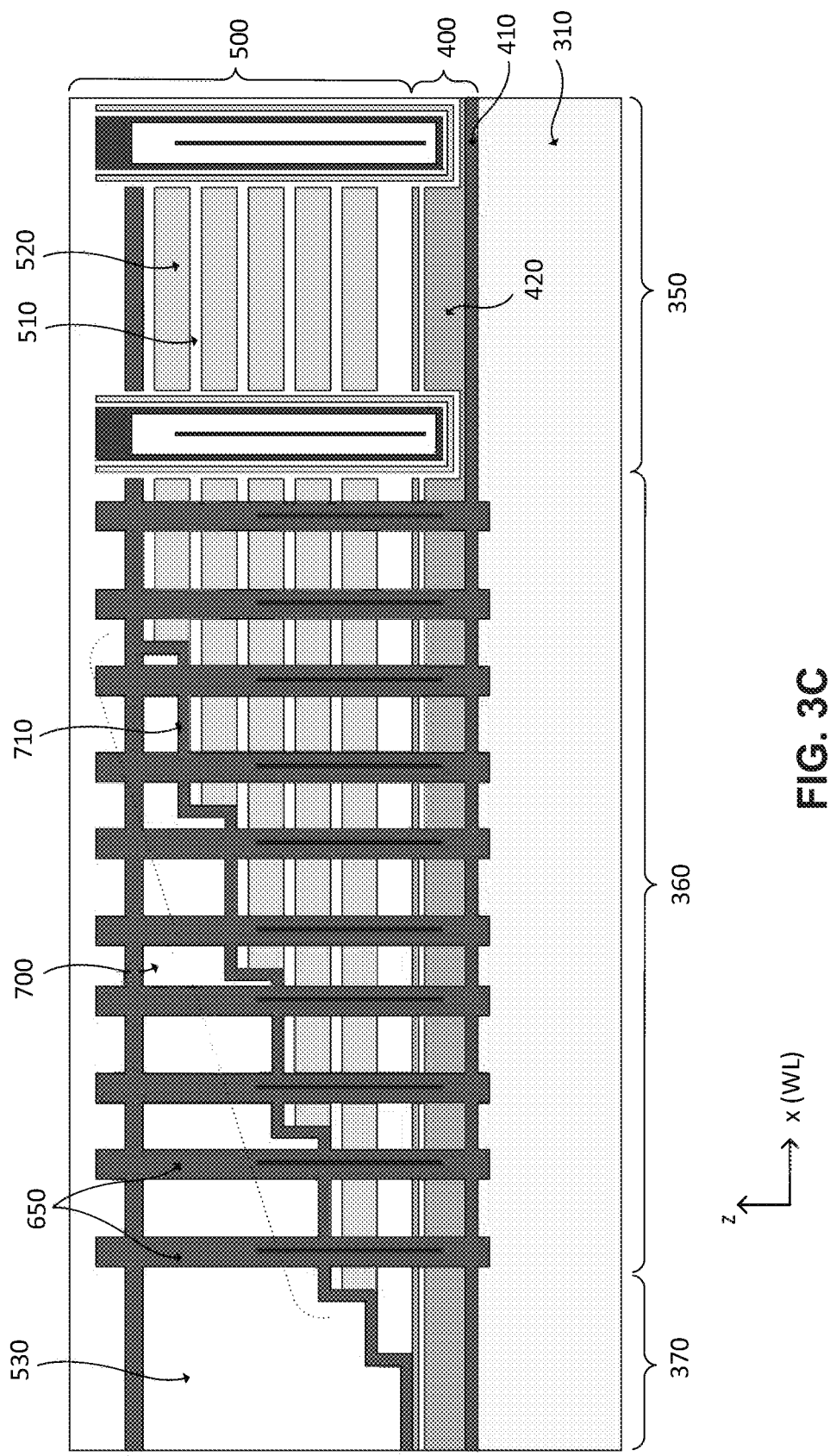

As shown in FIG. 3C, portions of the alternating dielectric stack 500 can be removed to form a staircase structure 700 in the staircase region 360. Multiple etch-trim processes can be performed repeatedly to form a set of steps. In some embodiments, each step can include one or more dielectric layer pairs. A staircase insulating layer 710 can be formed to cover the set of steps.

In some embodiments, the etch-trim processes can include a set of repeating etch-trim processes to form the staircase structure 700 including a set of steps at the edge the alternating dielectric stack 500.

Specifically, for forming each step, a photoresist layer (not shown) can be used as a mask to expose a portion of the top surface of the alternating dielectric stack 500. For forming the first step, a width of the exposed top surface of the alternating dielectric stack 500 can be a step width. In some embodiments, an anisotropic etching process, such as a reactive ion etching (RIE) process, or other suitable dry/wet etching process, can be performed to remove the exposed layer (e.g., the second dielectric layer 520) that is exposed through the mask (i.e., the photoresist layer). The etching process can stop on the next lower layer (e.g., the first dielectric layer 510). The pattern in the mask (i.e., the photoresist layer) is then transferred to the layer (e.g., the second dielectric layer 520) that has been etched. The exposed next lower layers (e.g., the first dielectric layers 610) can be then removed by another etching process that stops on the next lower layers (e.g., the second dielectric layer 520). As such, the first step can be created on the first two top layers of the alternating dielectric stack 500.

Next, the mask (i.e., the photoresist layer) can be reduced in size by removing a portion of the mask (also known as "trimming") above the alternating dielectric stack 500, such as by an isotropic etching process, to expose another step width of the alternating dielectric stack 500. The method can proceed by subjecting the structure to two anisotropic etching processes, including removing exposed portions of the two exposed layers (e.g., two second dielectric layers 520), and subsequently removing exposed portions of the two exposed next lower layers (e.g., the first dielectric layers 510). As such, the first step can be lowered to the third and fourth top layers of the alternating dielectric stack 500, and a second step can be created on the first two top layers of the alternating dielectric stack 500.

In some embodiments, the successive reduction in size of the mask (i.e., the photoresist layer) and the two-step etching processes (also referred as etch-trim processes) can be repeated such that the staircase structure 700 including a set of steps can be formed in the staircase region, as shown in FIG. 3C. The photoresist layer can be then removed. In some embodiments, the removal process can include any suitable etching processes and cleaning processes.

As shown in FIG. 3C, a staircase insulating layer 710 can be formed to cover the staircase structure 700. In some embodiments, a deposition process can be performed to form the staircase insulating layer 710. In some embodiments, a filling insulating structure 530 can be formed to cover the alternating dielectric stack 500 including the staircase structure 700. A CMP process can be performed to planarize the top surface of the filling insulating structure 530.

As shown in FIG. 3C, multiple dummy channel structures 650 can be formed in the staircase region 360. In embodiments, the dummy channel structures 650 can be formed in any suitable positions in the core array region 350, the staircase region 360 and/or the periphery region 370. In some embodiments, fabrication processes to form the dummy channel structures 650 can include etching the filling insulating structure 530, the staircase insulating layer 710, the alternating dielectric stack 500, and the support stack 400 to form multiple dummy channel holes. The multiple dummy channel holes can penetrate the filling insulating structure 530, the staircase insulating layer 710, the alternating dielectric stack 500, and the support stack 400, and can extend into the first substrate 310. A deposition process can then be performed to fill the multiple dummy channel holes with any suitable dielectric material, such as $SiO_2$. As such, multiple dummy channel structures 650 can be formed to provide mechanical support for the 3D memory array structures.

As shown in FIG. 2, the method proceeds to operation S208, in which multiple slits can be formed in the alternating dielectric stack and extending along a word line direction, the second dielectric layers in the alternating dielectric stack can be replaced by multiple gate structures, and one or more array common source (ACS) contacts can be formed in each of the multiple slits.

Figure 3D:
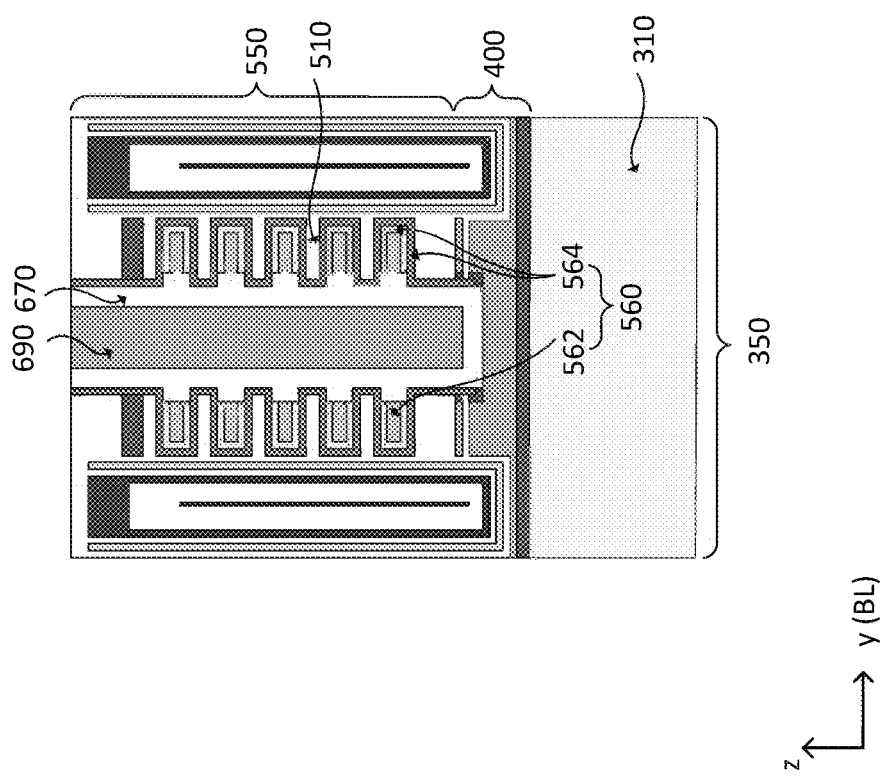

As shown in cross-sectional view of core array region 350 in y-z plane in FIG. 3D, in some embodiments, each of the multiple slits can vertically penetrate through the alternating dielectric stack 500 and extend vertically into the first semiconductor layers 420 of the support stack 400, and can extend laterally in a straight line along a word line direction between two arrays of channel structures 600. The multiple slits can be formed by forming a mask layer (not shown) over the alternating dielectric stack 500 and patterning the mask using, e.g., photolithography, to form openings corresponding to the multiple slits in the patterned mask layer. A suitable etching process, e.g., dry etch and/or wet etch, can be performed to remove portions of the alternating dielectric stack 500 exposed by the openings until the multiple slits expose the first semiconductor layers 420. The mask layer can be removed after the formation of the multiple slits.

In some embodiments, the second dielectric layers 520 in the alternating dielectric stack 500 can be replaced by multiple gate structures 560. After the replacement, the alternating dielectric stack 500 can become an alternating dielectric/conductive stack 550. In some embodiments, the second dielectric layers 520 in the alternating dielectric stack 500 can be removed through the multiple slits. As described above, the second dielectric layers 520 in the alternating dielectric stack 500 are used as sacrificial layers, and are removed by used any suitable etching process, e.g., an isotropic dry etch or a wet etch. The etching process can have sufficiently high etching selectivity of the material of the second dielectric layers 520 over the materials of the first dielectric layers 510, such that the etching process can have minimal impact on the first dielectric layers 510. The isotropic dry etch and/or the wet etch can remove second dielectric layers 520 in various directions to expose the top and bottom surfaces of each first dielectric layer 510. As such, multiple horizontal trenches can then be formed between first dielectric layers 510. Each of the multiple horizontal trenches can extend in a horizontal direction, and can be used as a space for a gate structure 560 to be formed in the subsequent processes. It is noted that, the term "horizontal/horizontally" used herein means nominally parallel to a lateral surface of a substrate.

In some embodiments, the second dielectric layers 520 include silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10 V. In some embodiments, the second dielectric layers 520 include silicon nitride and the etchant of the wet etch includes phosphoric acid. After the second dielectric layers 520 are removed, the multiple slits and multiple horizontal trenches can be cleaned by using any suitable cleaning process. For example, a phosphoric acid rinsing process can be performed to remove the impurities on the inner wall of the horizontal trenches. In some embodiments, a rinsing temperature can be in a range from about 100° C. to about 200° C., and a rinsing time can be in a range from about 10 minutes to about 100 minutes.

In some embodiments, multiple gate structures 560 can be formed in each horizontal trench, as shown in FIG. 3D. In some embodiments, each gate structure 560 can include a gate electrode 564 wrapped by one or more insulating films 564. The one or more insulating films 564 can be used as one or more gate dielectric layers for insulating the respective word line (i.e., gate electrode).

In some embodiments, the one or more insulating films 564 can be formed to cover the exposed surfaces of the horizontal trenches with one or more suitable insulating materials. For example, one or more suitable deposition processes, such as CVD, PVD, and/or ALD, can be utilized to deposit the one or more insulating materials into the horizontal trenches. In some embodiments, a recess etching process and/or a CMP process can be used to remove excessive insulating material(s). The one or more insulating materials can include any suitable materials that provide electric insulating function.

In some embodiments, the gate electrode 562 can be formed in each horizontal trench. The gate electrode 562 can be formed by filling the horizontal trenches with a suitable gate electrode metal material. The gate electrodes 562 can provide the base material for the word lines. The gate electrode metal material can include any suitable conductive material, e.g., tungsten, aluminum, copper, cobalt, or any combination thereof, for forming the word lines. The gate electrode material can be deposited into horizontal trenches using a suitable deposition method such as CVD, PVD, plasma-enhanced CVD (PECVD), sputtering, metal-organic chemical vapor deposition (MOCVD), and/or ALD.

In some embodiments, portions of the multiple gate structures 560 can be removed by a recess etching process. In some embodiments, in order to ensure the insulation between multiple gates, a recess etching process, such as a wet etching process, can be performed to remove the exposed portions of the multiple gate structures 560. In doing so, a recess can be formed in each horizontal trench adjacent to the sidewalls of the silt.

In some embodiments, a gate line spacer (GLSP) layer 670 can be formed on both side walls of each slit. The GLSP layer 670 can be used to provide electrical insulation between the multiple gate structures 560 and one or more array common source (ACS) contacts 690 formed in subsequent processes. In some embodiments, the GLSP layer 670 can be formed by using any suitable deposition process, such as an atomic layer deposition (ALD) process to deposit a low temperature oxide material or a high temperature oxide material to fill the multiple slits 440.

In some embodiments, as shown in FIG. 3D, one or more ACS contacts 690 can be formed to vertically penetrate the GLSP layer 670, and be in electrical contact with the first semiconductor layer 420 of the support stack 400. A fabricating process for forming the one or more ACS contacts 690 include performing an etching process to remove one or more portions of the GLSP layer 670 to form one or more vertical holes or trenches that exposes the first semiconductor layer 420 of the support stack 400. A deposition process can then be performed to fill the one or more vertical holes or trenches with any suitable conductive material, such as metal materials including tungsten, aluminum, copper, polysilicon, silicides, and/or combinations thereof, etc. The conductive material can be deposited into the vertical trench using any suitable deposition method such as CVD, PVD, PECVD, MOCVD, and/or ALD. A CMP process can be performed to planarize the top surfaces of the one or more ACS contacts 690.

Figure 3E:
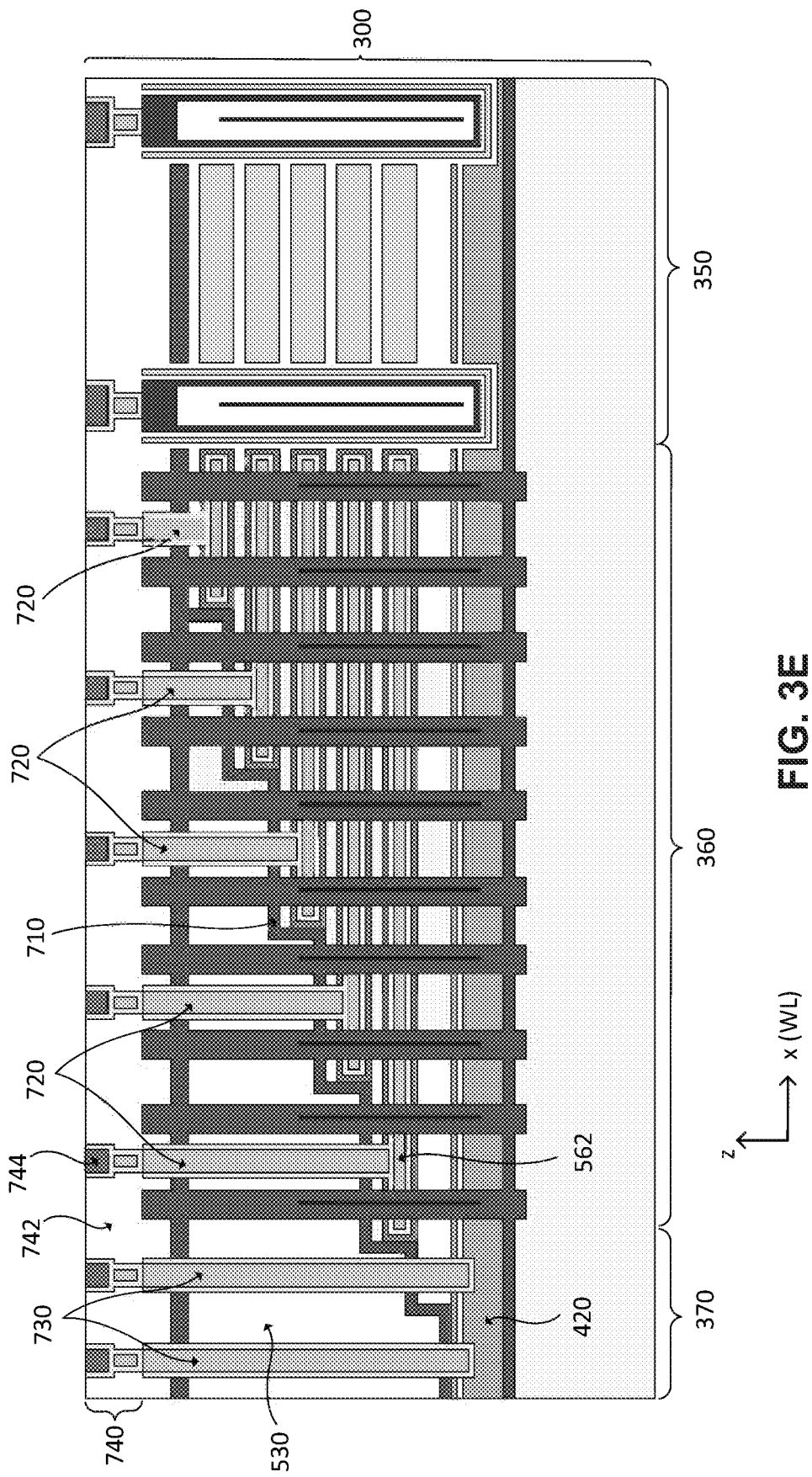

As shown in FIG. 2, the method proceeds to operation S210, in which a plurality of word line contacts and/or peripheral contacts can be formed, and an array joint layer including a plurality of interconnect contacts can be formed. As such, the array wafer 300 is formed, as shown in FIG. 3E (cross-sectional view in x-z plane) and FIG. 3F (cross-sectional view of core array region 350 in y-z plane).

In some embodiments, the multiple word line contacts 720 can be formed in the staircase region 360, and/or the multiple peripheral contacts 730 in the periphery region 370. In some embodiments, an end (e.g., the upper end) of each word line contact 720 or peripheral contact 730 is flush with one another, e.g., on the top surface of the filling insulating structure 530 in which the word line contacts 720 and/or peripheral contacts 730 are formed. Another end (e.g., the lower end) of each word line contact 720 or peripheral contact 730 can be in contact with the respective array wafer structure. For example, the lower end of each word line contacts 720 can be in contact with corresponding gate electrode 562 (word line) in one level of staircase structure 700, and the lower end of each peripheral contact 730 can be in contact with the first semiconductor layer 420 of the support stack 400.

It is understood that, a fabricating process for forming the plurality of word line contacts 720 and/or peripheral contacts 730 can include multiple processes, for example, photolithography, etching, thin film deposition, and CMP. For example, the plurality of word line contacts 720 and/or peripheral contacts 730 can be formed through the filling insulating structure 530 by first deep etching vertical openings (e.g., by wet etching and/or dry etching), followed by filling the vertical openings with conductor materials using ALD, CVD, PVD, any other suitable processes, or any combination thereof. The conductor materials used for filling the vertical openings can include, but are not limited to, W, Co, Cu, Al, polysilicon, silicides, or any combination thereof. In some embodiments, other conductor materials are also used to fill the openings to function as a barrier layer, an adhesion layer, and/or a seed layer.

In some embodiments, the plurality of word line contacts 720, peripheral contacts 730, and/or the one or more ACS contacts 690, can be simultaneously formed in the same contact forming process. In some embodiments, each process in the contact forming process needs to be performed only once for all of the word line contacts 720, peripheral contacts 730, and one or more ACS contacts 690. For example, a single lithography process can be performed to pattern the masks for all the openings of the word line contacts 720, peripheral contacts 730, and one or more ACS contacts 690; a single etching process can be performed to etch all the openings of the word line contacts 720, peripheral contacts 730, and one or more ACS contacts 690; a single deposition process can be performed to fill all the openings of the word line contacts 720, peripheral contacts 730, and one or more ACS contacts 690 with the same conductor materials.

Figure 3F:
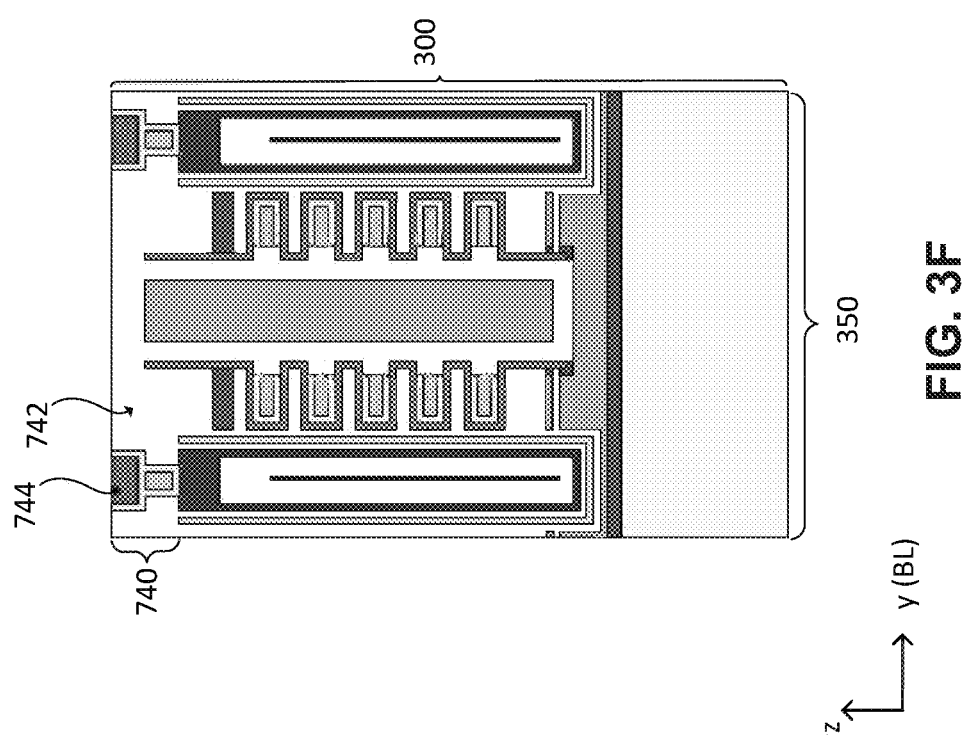

As shown in FIGS. 3E and 3F, an array joint layer 740 can include multiple interconnect contacts 744 embedded in a dielectric layer 742, and can be formed above the filling insulating structure 530. The upper end of each interconnect contact 744 can be flush with one another at the top surface of dielectric layer 742, and the lower end of each interconnect contact 744 can be flush with one another at the bottom surface of the dielectric layer 742, and can be in contact with the upper end of a corresponding word line contact 720, peripheral contact 730, or ACS contact 690.

The dielectric layer 742 can be formed by one or more thin film deposition processes, such as ALD, CVD, PVD, any other suitable processes, or any combination thereof. Dielectric layer 742 can include dielectric materials, including, but not limited to, silicon oxide, silicon nitride, silicon oxynitride, or any combination thereof. The interconnect contacts 744 can be formed through dielectric layer 742 by first etching vertical openings (e.g., by wet etching and/or dry etching), followed by filling the openings with conductor materials using ALD, CVD, PVD, any other suitable processes, or any combination thereof. The conductor materials used to fill the interconnect contacts 742 can include, but are not limited to, W, Co, Cu, Al, polysilicon, silicides, or any combination thereof. In some embodiments, other conductor materials are used to fill the openings to function as a barrier layer, an adhesion layer, and/or a seed layer.

In some embodiments, the array joint layer 740 can include multiple sub-layers, and each interconnect contact 744 can include multiple sub-contacts formed in the multiple sub-layers. For example, the multiple sub-contacts can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof, and can be formed in multiple contact forming processes. For example, fabrication processes to form the multiple sub-contacts can include forming one or more conductive layers and one or more contact layers in the corresponding sub-layers of dielectric layer 325. The conductive layers and the conductor contact layers can be formed by any suitable known back-end-of-line (BEOL) methods. In some embodiments, all interconnect contacts 744 in the array joint layer 740 can be simultaneously formed in the same contact forming processes.

Figure 3G:
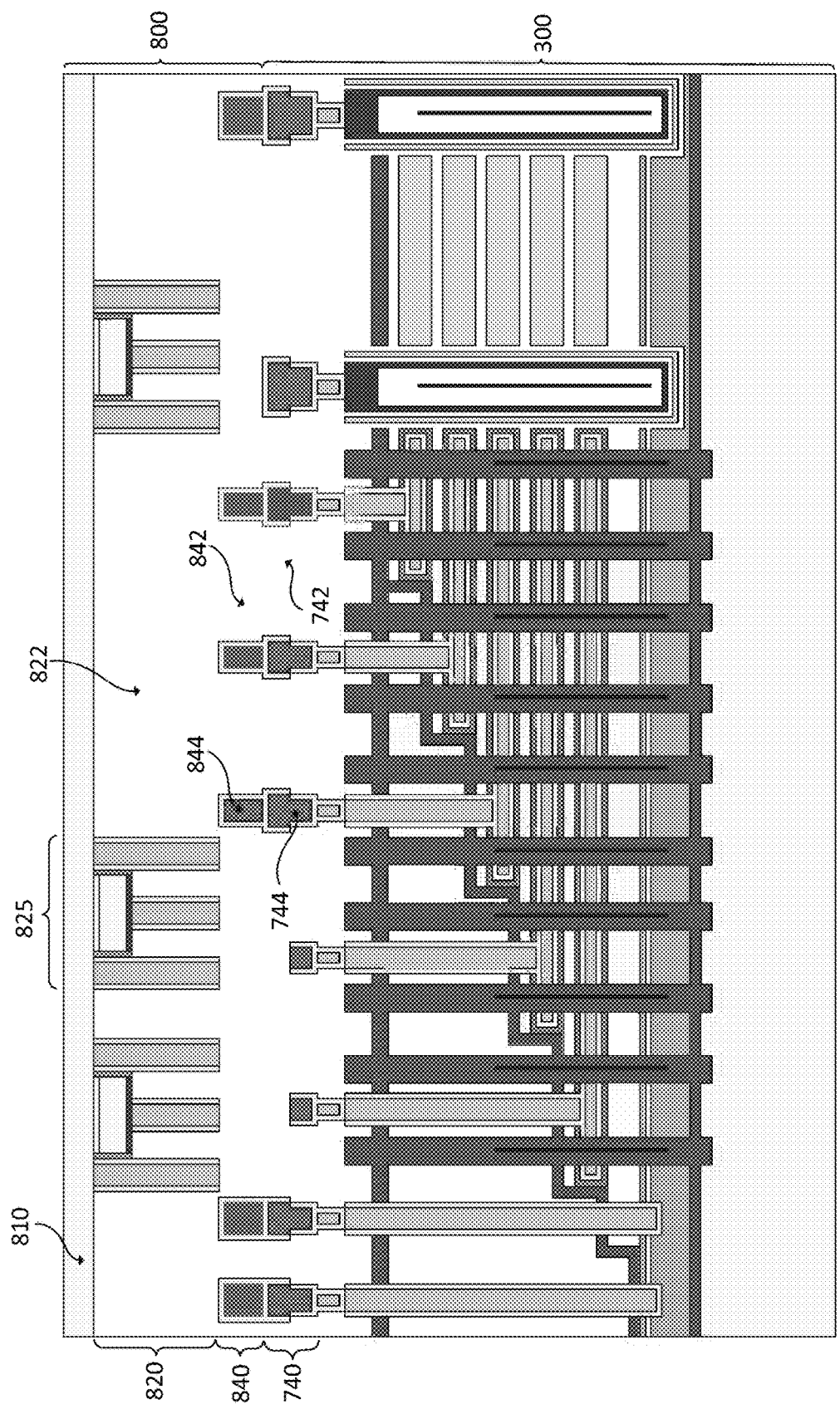

Referring back to FIG. 2, the method processed to operation S212, in which an CMOS wafer can be bonded on the array wafer. As shown in FIG. 3G (cross-sectional view in x-z plane) and FIG. 3H (cross-sectional view of core array region 350 in y-z plane), the CMOS wafer 800 can include a second substrate 810, a peripheral circuit layer 820 on the second substrate 810, and a CMOS joint layer 840 on the peripheral circuit layer 820.

In some embodiments, the second substrate 810 can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. Second substrate 510 can be a single layer substrate or a multi-layer substrate, for example, a monocrystalline single-layer substrate, a polycrystalline silicon (polysilicon) single-layer substrate, a polysilicon and metal multi-layer substrate, etc. In some embodiments, second substrate 810 is a thinned substrate (e.g., a semiconductive layer), which was thinned by grinding, wet/dry etching, chemical mechanical polishing (CMP), or any combination thereof.

Figure 3H:
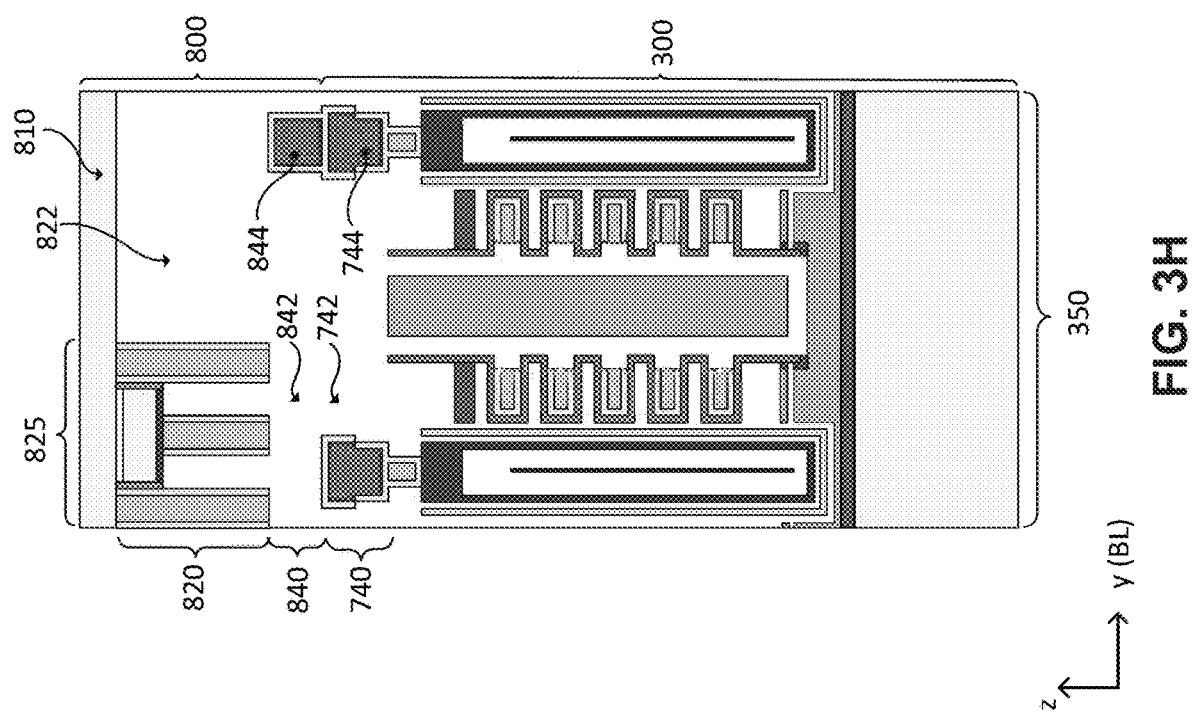

The peripheral circuit layer 820 formed on the second substrate 810 can include one or more peripheral circuits including any suitable digital, analog, and/or mixed-signal peripheral circuits used for facilitating the operation of the 3D memory device. For example, the one or more peripheral circuits can include one or more of a page buffer, a decoder (e.g., a row decoder and a column decoder), a latch, a sense amplifier, a driver, a charge pump, a current or voltage reference, or any active or passive components of the circuits (e.g., transistors, diodes, resistors, or capacitors). In some embodiments as shown in FIGS. 3G and 3H, the one or more peripheral circuits can include multiple CMOS devices 825 formed using complementary metal-oxide-semiconductor (CMOS) technology.

CMOS joint layer 840 can include a dielectric layer 842 and interconnect contacts 844 embedded in the dielectric layer 842, and can be formed above the peripheral circuit layer 820. The dielectric layer 842 can be formed by one or more thin film deposition processes, such as ALD, CVD, PVD, any other suitable processes, or any combination thereof. Dielectric layer 842 can include dielectric materials, including, but not limited to, silicon oxide, silicon nitride, silicon oxynitride, or any combination thereof. The interconnect contacts 844 can be formed through dielectric layer 842 by first etching vertical openings (e.g., by wet etching and/or dry etching), followed by filling the openings with conductor materials using ALD, CVD, PVD, any other suitable processes, or any combination thereof. The conductor materials used to fill the interconnect contacts 844 can include but are not limited to, W, Co, Cu, Al, polysilicon, silicides, or any combination thereof. In some embodiments, other conductor materials are used to fill the openings to function as a barrier layer, an adhesion layer, and/or a seed layer.

In some embodiments, the CMOS joint layer 840 can include multiple sub-layers, and each interconnect contact 844 can include multiple sub-contacts formed in the multiple sub-layers respectively. For example, the multiple sub-contacts can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof, and can be formed in multiple contact forming processes. For example, fabrication processes to form the multiple sub-contacts can include forming one or more conductive layers and one or more contact layer in the dielectric layer 842. The conductive layers and the conductor contact layers can be formed by any suitable known front-end-of-line (FEOL) methods. In some embodiments, all interconnect contacts 844 in CMOS joint layer 840 can be simultaneously formed in the same contact forming processes.

In some embodiments, the array wafer 300 and the CMOS wafer 800 can be bonded together. As shown in FIGS. 3G and 3H, the CMOS wafer 800 can be faced down and joined with the array wafer 300 by bonding the CMOS joint layer 840 of the CMOS wafer 800 to the array joint layer 740 of the array wafer 300.

The bonding interface is between the array joint layer 740 and the CMOS joint layer 840. Therefore, the bonding interface includes both the interface between two dielectric layers (e.g., between a silicon nitride layer and a silicon oxide layer) and the interface between two conductive layers (e.g., between two metal layers). In some embodiments, one or more interconnect contacts 744 and 844 can be contacted with each other at the bonding interface for electrical connection.

In some embodiments, the hybrid bonding between the array wafer 300 and the CMOS wafer 800 can include any suitable bonding processes or combinations thereof. For example, the bonding interface can be formed by chemical bonds between the dielectric layers and/or the conductive layers on both sides of the bonding interface. As another example, the bonding interface can be formed by physical interaction (e.g., inter-diffusion) between the dielectric layers and/or the conductive layers on both sides of the bonding interface. In some embodiments, the bonding interface can be formed after a plasma treatment or a thermal treatment of the surfaces from both sides of the bonding interface prior to the bonding process.

Referring back to FIG. 2, the method processed to operation S214, in which the first substrate can be removed, and portions of the support stack can be removed.

Figure 3I:
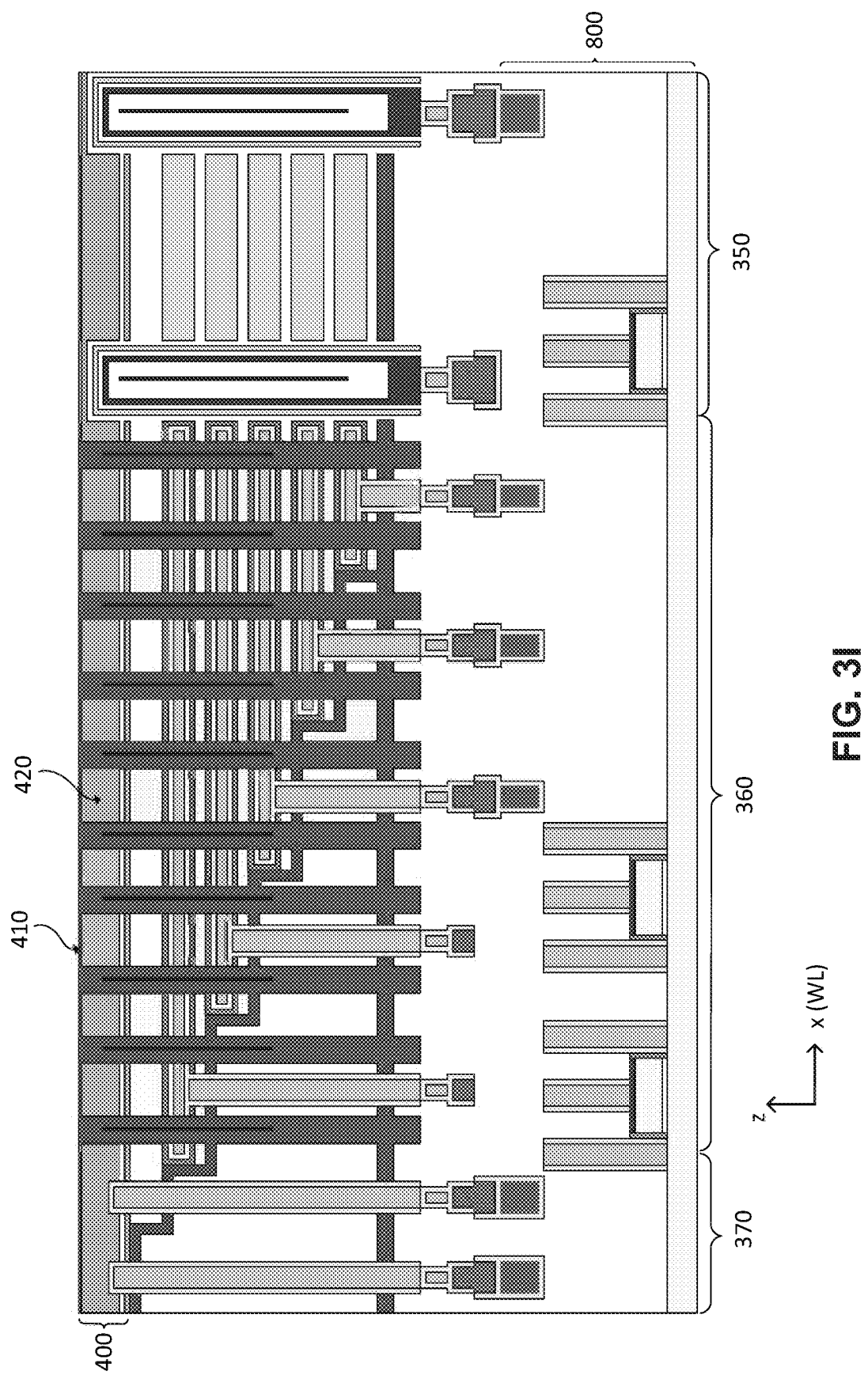
Figure 3J:
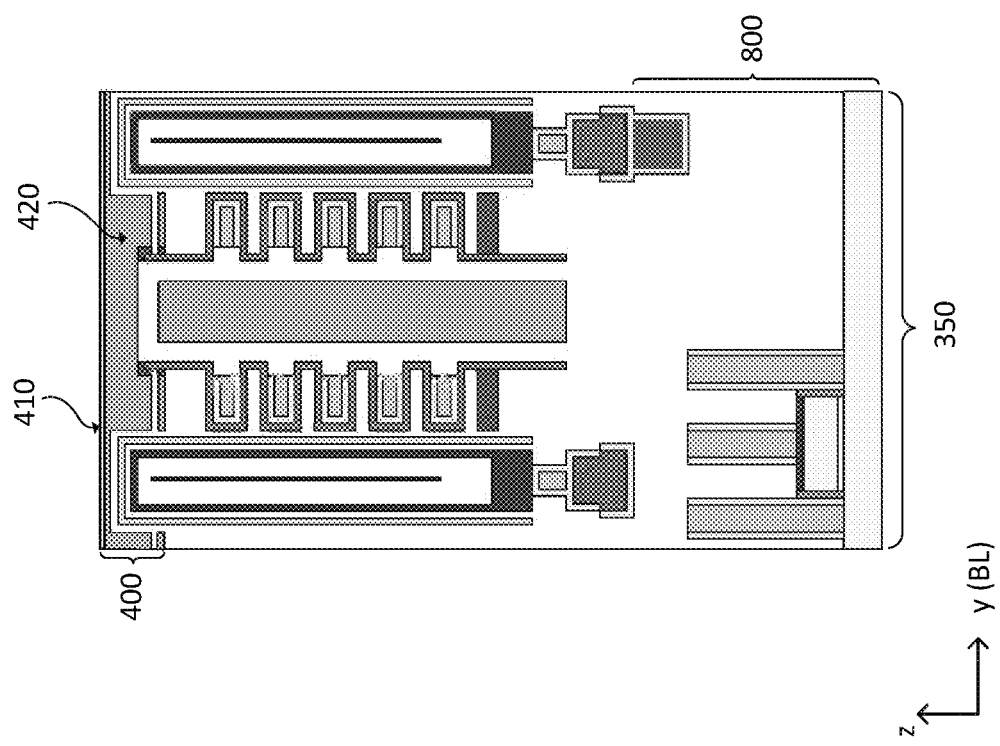

In some embodiments, operation S214 can include flipping over the bonded structure as shown in FIGS. 3G and 3H, such that the COMS wafer 800 is on a lower side and the array wafer 300 is on an upper side, as shown in FIG. 3I (cross-sectional view in x-z plane) and FIG. 3J (cross-sectional view of core array region 350 in y-z plane). In some embodiments, operation S214 can further include removing the first substrate 310 of the array wafer 300 by processes including, but not limited to, wafer grinding, dry etch, wet etch, CMP, any other suitable processes, or any combination thereof.

Figure 3K:
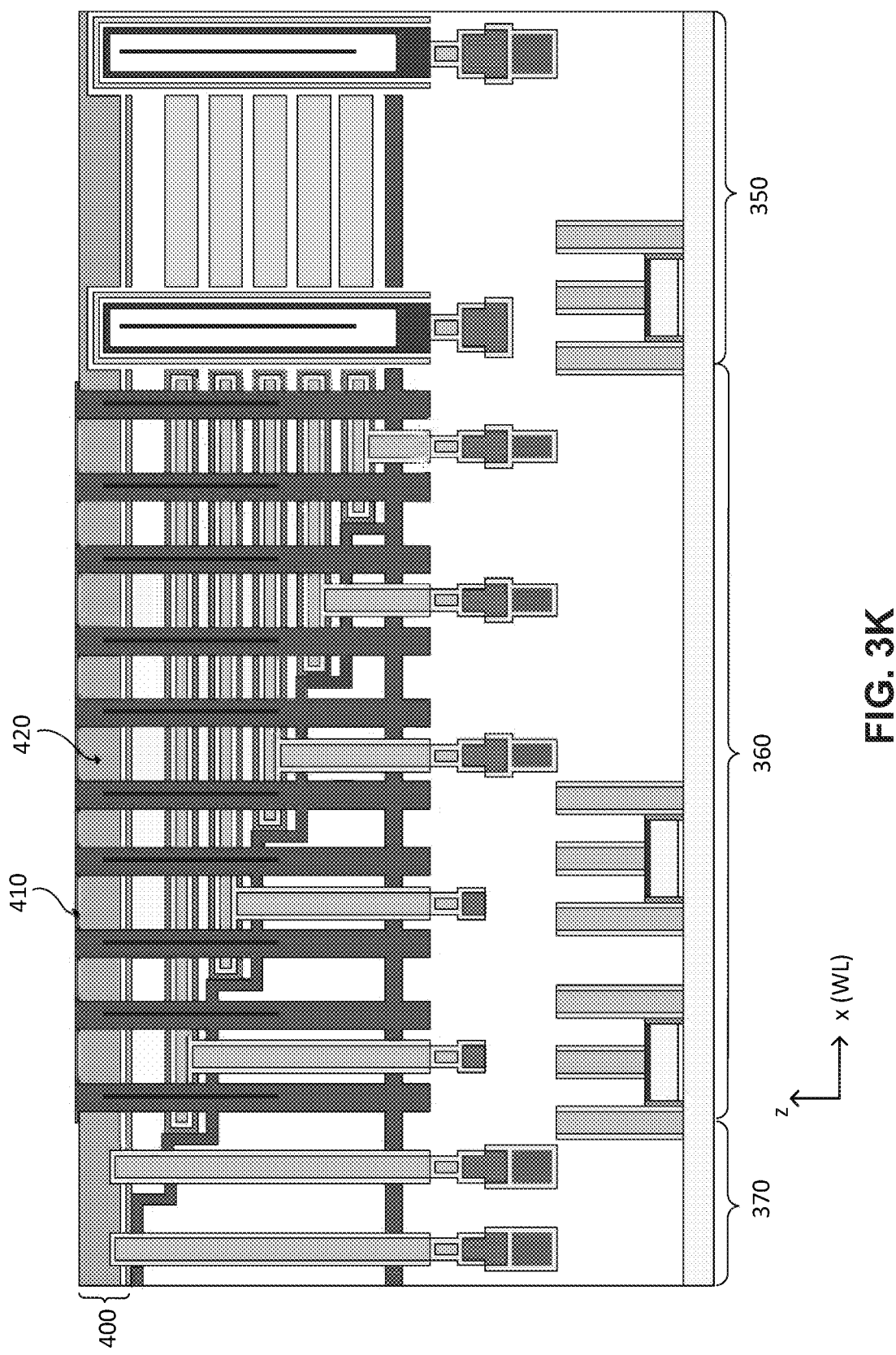
Figure 3L:
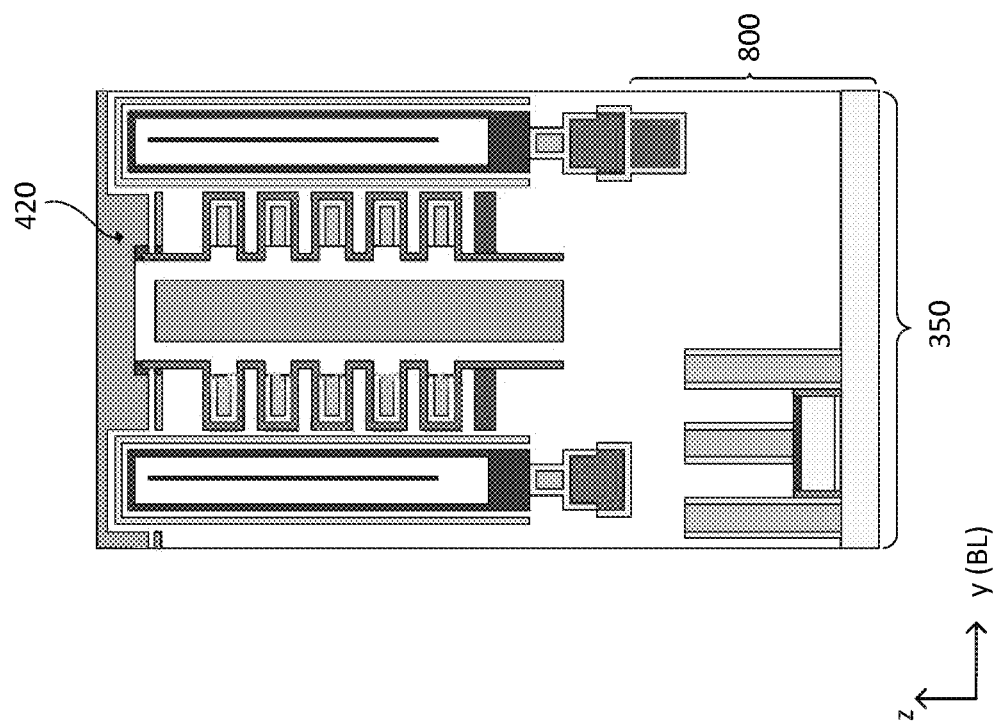

In some embodiments, operation S214 can further include removing portions of the sacrificial dielectric layer 410 in the core array region 350 and periphery region 370 to expose the first semiconductor layer 420, as shown in FIG. 3K (cross-sectional view in x-z plane) and FIG. 3L (cross-sectional view of core array region 350 in y-z plane). Portion of the sacrificial dielectric layer 410 in the staircase region 360 can be remained. It is understood that, the portions of the sacrificial dielectric layer 410 can be removed by any suitable photolithography process. For example, a patterned hard mask (not shown) can be formed on the sacrificial dielectric layer 410, and the portions of the sacrificial dielectric layer 410 can be removed by a wet etching and/or dry etching by using the patterned hard mask layer.

Figure 3M:
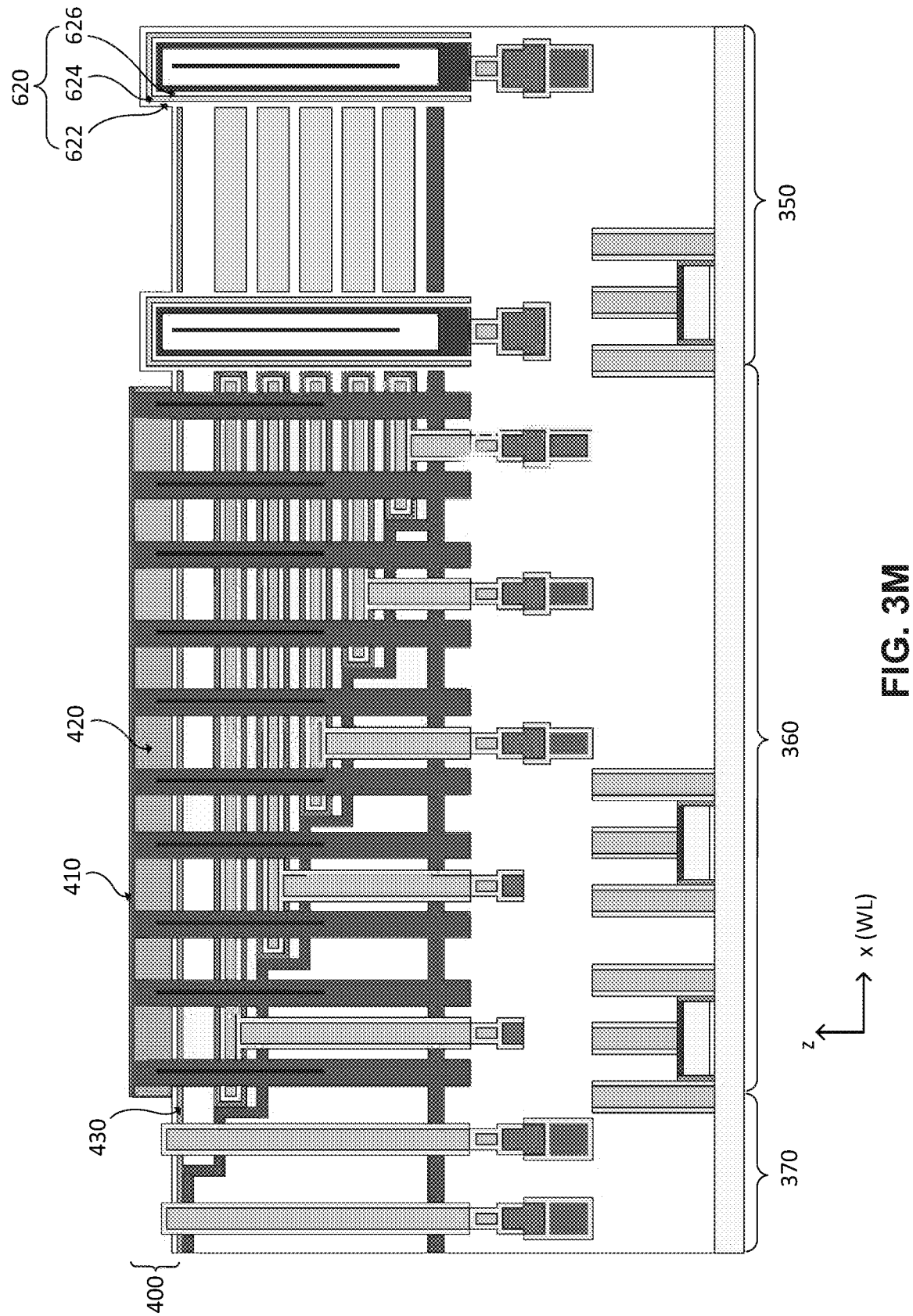
Figure 3N:
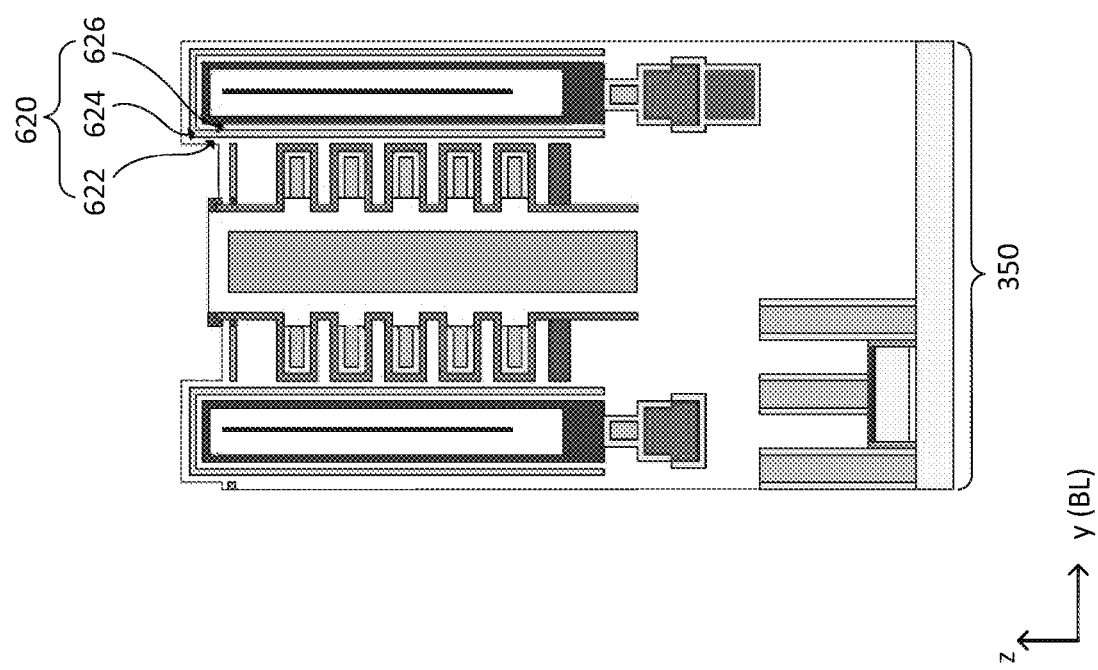

In some embodiments, operation S214 can further include removing portions of the first semiconductor layer 420 in the core array region 350 and periphery region 370, as shown in FIG. 3M (cross-sectional view in x-z plane) and FIG. 3N (cross-sectional view of core array region 350 in y-z plane). For example, using the remaining portion of the sacrificial dielectric layer 410 in the staircase region 360 as a mask, the portions of the first semiconductor layer 420 in the core array region 350 and periphery region 370 can be removed by a wet etching.

Referring back to FIG. 2, the method processed to operation S216, in which a portion of the functional layer of each channel structure can be removed to expose a portion of the channel layer of the channel structure, and the exposed portion of the channel layer can be doped.

Figure 3O:
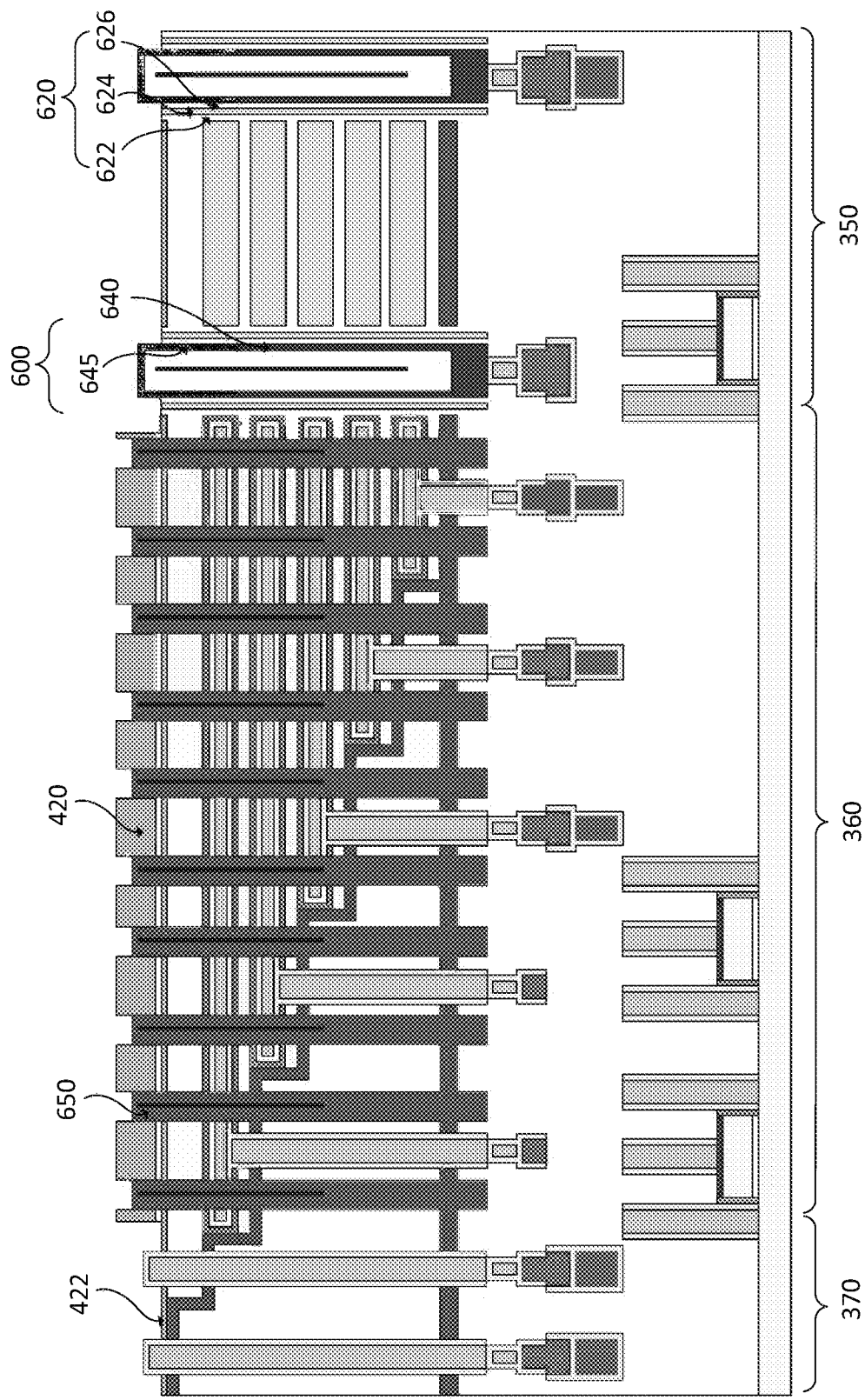
Figure 3P:
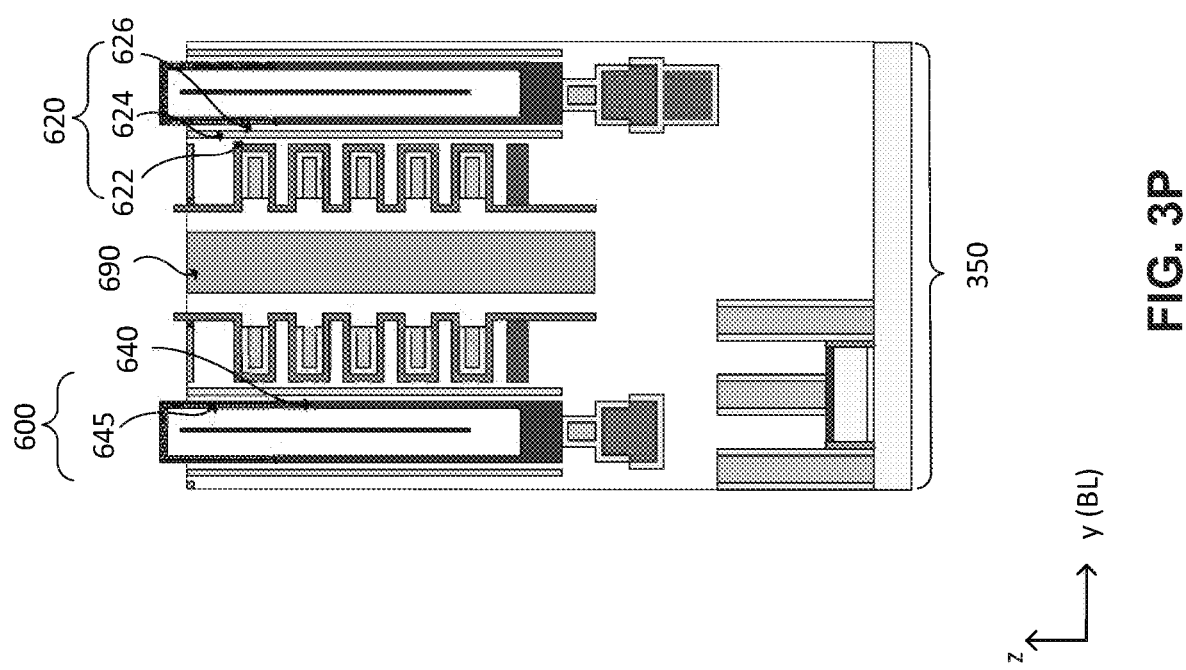

As shown in FIG. 3O (cross-sectional view in x-z plane) and FIG. 3P (cross-sectional view of core array region 350 in y-z plane), an upper portion of the functional layer 620 of each channel structure 600 can be removed. As described above, the functional layer 620 is a composite dielectric layer including a barrier layer 622, a storage layer 624, and a tunneling layer 626. As such, using the second semiconductor layer 422 as an etch stop layer, one or more selective etching processes can be performed to remove portions of the barrier layer 622, storage layer 624, and tunneling layer 626 of each channel structure 600 that are located above the second semiconductor layer 422. In some embodiments, the remaining portion of the sacrificial dielectric layer 410 in the staircase region 360 can be removed in the one or more selective etching processes, and an portion of each dummy channel structure 650 can also be removed during the one or more selective etching processes to form a recess, as shown in FIG. 3O.

After the one or more selective etching processes, the channel layer 640 of each channel structure 600 can be exposed for a subsequent ion implantation (IMP) process to form a doped channel layer 645, as shown in FIGS. 3O and 3P. In some embodiments, a portions of the channel layer 640 may be doped with p-type dopants (e.g., boron, indium, gallium, etc.), or n-type dopants (e.g., phosphorus, arsenic, etc.), or combinations thereof. For p-type in-situ doping, p-type doping precursors, such as, but not limited to, diborane ($B_2H_6$) and boron trifluoride ($BF_3$), can be used. For n-type in-situ doping, n-type doping precursors, such as, but not limited to, $PH_3$ and $AsH_3$, can be used.

Referring back to FIG. 2, the method processed to operation S218, in which a supplementary semiconductor layer can be formed to electrically connect with the doped channel layer of each channel structure.

Figure 3Q:
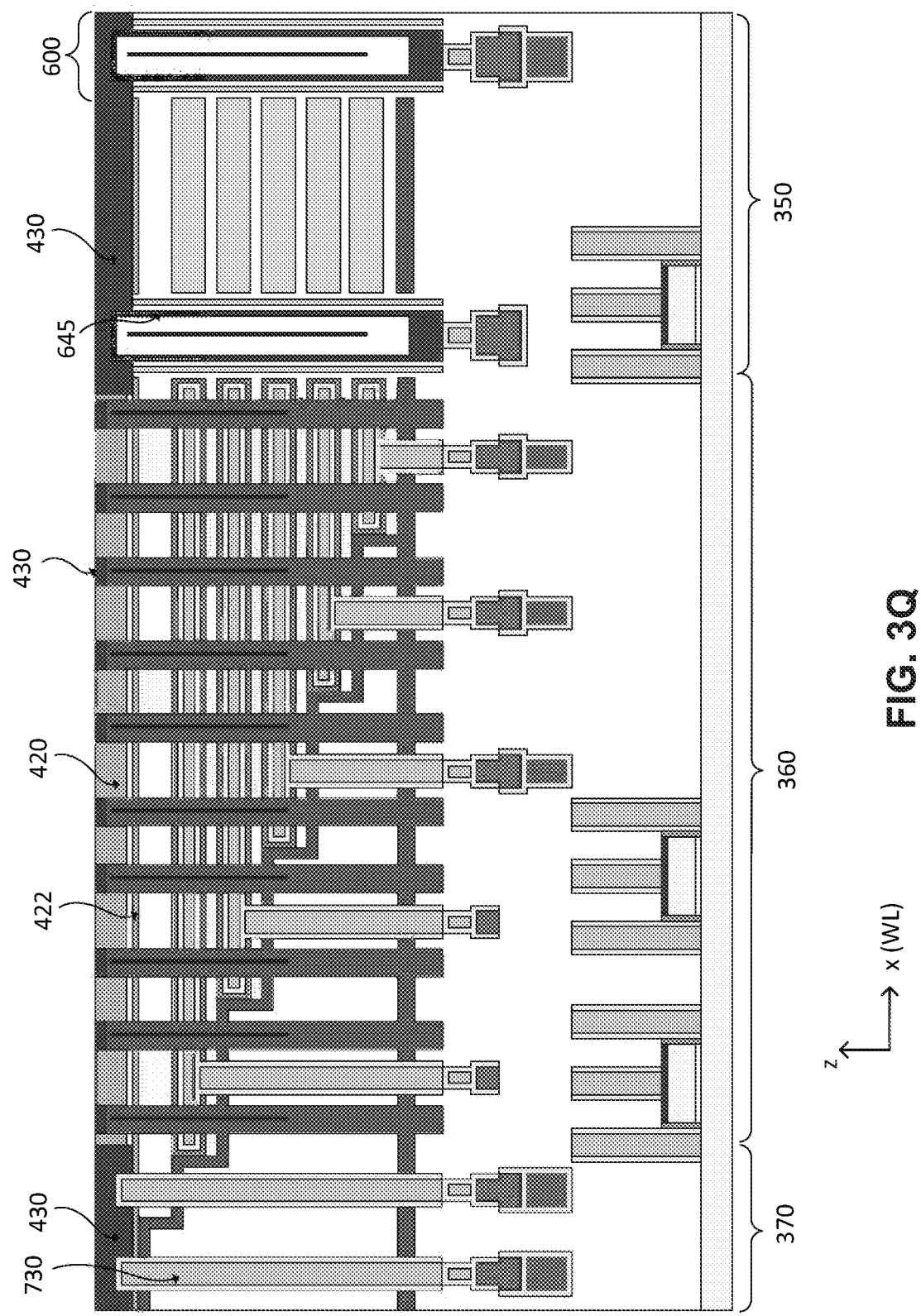
Figure 3R:
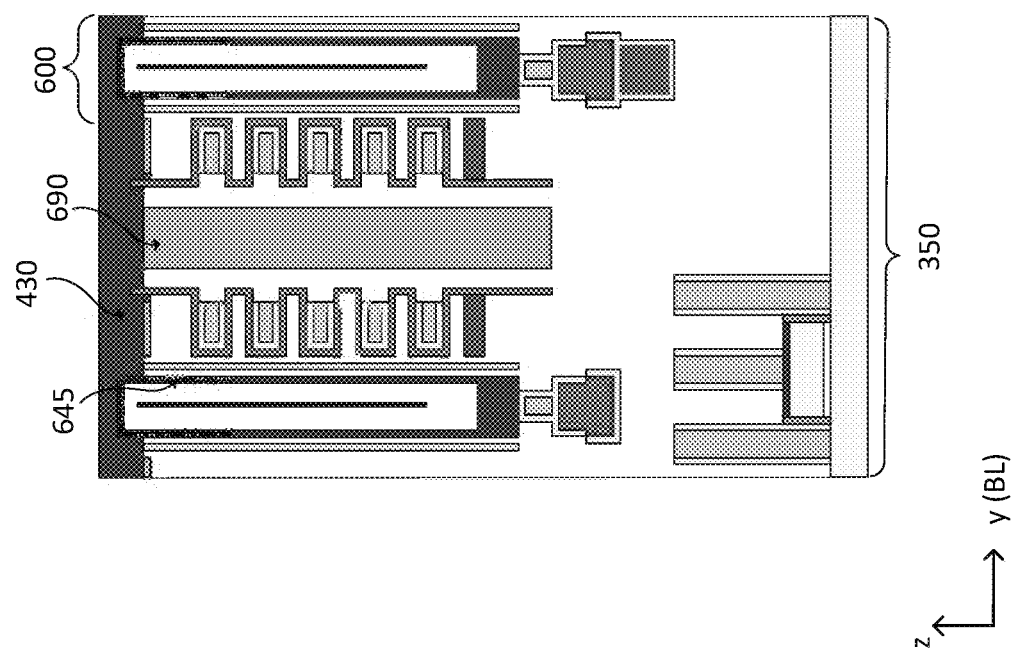

As shown in FIG. 3Q (cross-sectional view in x-z plane) and FIG. 3R (cross-sectional view of core array region 350 in y-z plane), the supplementary semiconductor layer 430 can be formed in the core array region 350 to electrically connected with the doped channel layer 645 of each channel structure 600. In some embodiments, the supplementary semiconductor layer 430 can be formed in the core array region 350 to electrically connected with the one or more ACS contacts 690. In some embodiments, the supplementary semiconductor layer 430 can be formed in the periphery region 370 to electrically connected with the multiple peripheral contacts 730. In some embodiments, the supplementary semiconductor layer 430 can be further formed in the staircase region 360 to fill the multiple recesses of dummy channel structures 650.

In some embodiments, fabricating processes of the supplementary semiconductor layer 430 can include depositing or epitaxially growing an silicon layer to cover the top surfaces of the structure as shown in FIGS. 3Q and 3R, and a followed chemical mechanical polishing (CMP) process to coplanarize the top surfaces of the amorphous silicon layer and the remaining portion of the first semiconductor layer 420. In some embodiments, the deposited semiconductor material or epitaxially-grown semiconductor material is the same material as the material of first semiconductor layer 420. In some embodiments, the deposited semiconductor material or epitaxially-grown semiconductor material includes a different material from the material of first semiconductor layer 420. The deposited semiconductor material or epitaxially-grown semiconductor material may include any suitable semiconductor material, such as silicon, germanium and silicon; compound semiconductor materials, such as gallium arsenide, and aluminum gallium arsenide; or a semiconductor alloy, such as silicon germanium and gallium arsenide phosphide.

In some embodiments, when the deposited semiconductor material is amorphous silicon, an activation process can then be performed to transform the amorphous silicon layer to a polycrystalline silicon layer. It is noted that, the activation process is optional, and can be performed in one or more predetermined regions of the structure. In some embodiments, the activation process may not be applied to the staircase region 360, such that the portions of the supplementary semiconductor layer 430 and the first semiconductor layer 420 in the staircase region 360 include amorphous silicon material. In some alternative embodiments, the activation process can be applied to the staircase region 360, such that at least exposed portions of the supplementary semiconductor layer 430 and first semiconductor layer 420 in the staircase region are transformed to polycrystalline silicon material.

Referring back to FIG. 2, the method processed to operation S220, in which a pad layer can be formed on the supplementary semiconductor to electrically connect with the channel layer of each channel structure and the one or more ACS contacts.

Figure 3S:
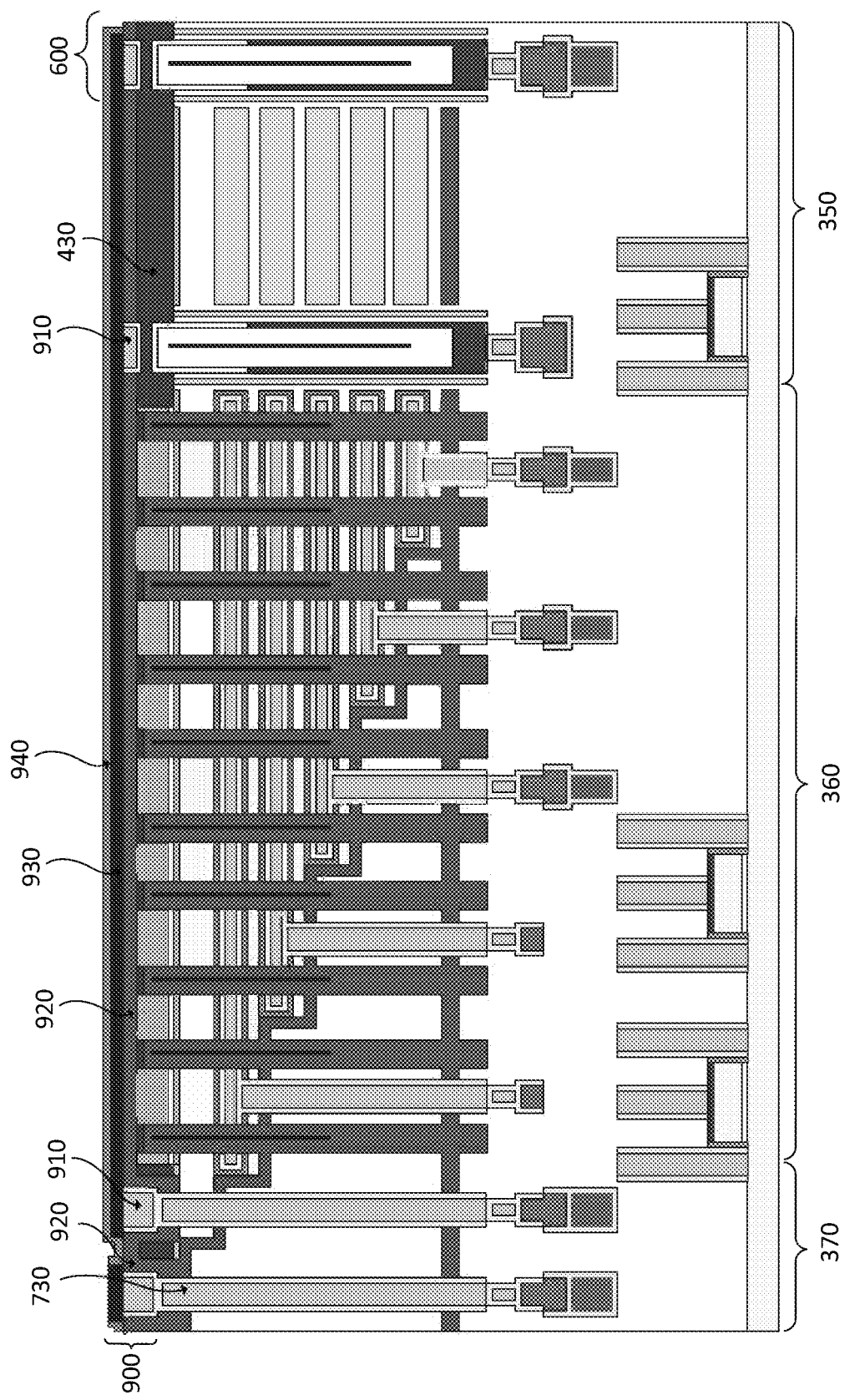
Figure 3T:
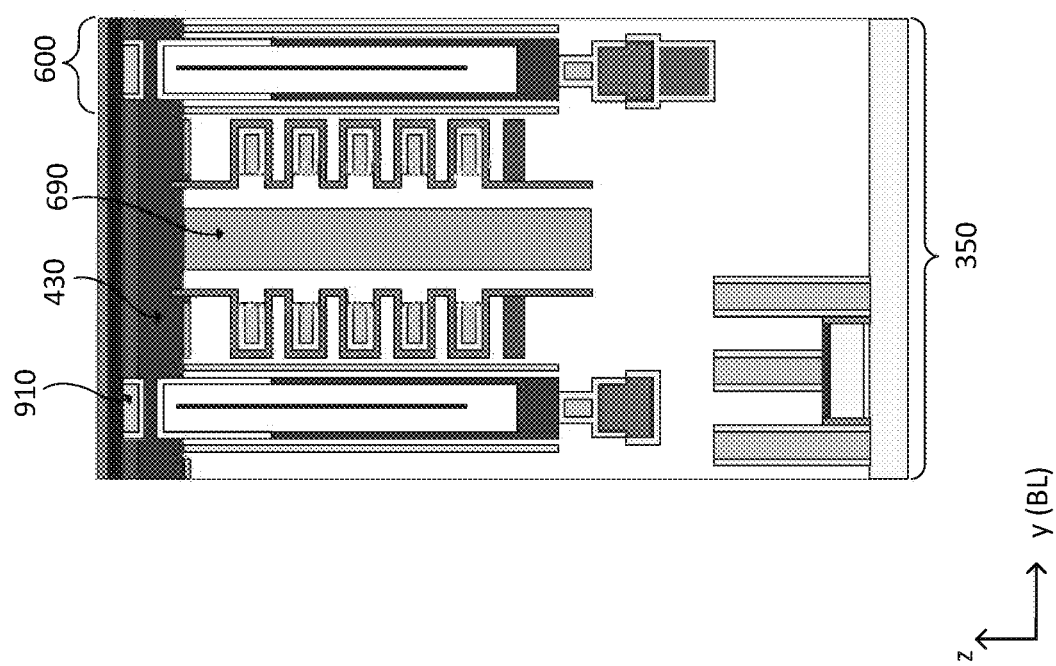

As shown in FIG. 3S (cross-sectional view in x-z plane) and FIG. 3T (cross-sectional view of core array region 350 in y-z plane), the pad layer 900 can include multiple pad structures 910 embedded in a dielectric layer 920 and in electric connection with the corresponding channel structure 600 or peripheral contact 730 respectively. The pad layer 900 can further include a wiring layer 930 on the pad structures 910 and the dielectric layer 920, and a protection layer 940 on the wiring layer 930.

The dielectric layer 920 can include one or more layers of dielectric materials such as silicon oxide, silicon nitride, silicon oxynitride, or any combination thereof, and can be formed by one or more thin film deposition processes, such as ALD, CVD, PVD, any other suitable processes, or any combination thereof. In some embodiments, before forming the dielectric layer 920, the supplementary semiconductor layer 430 in the periphery region 370 can be removed.

Each pad structure 910 can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof. The upper end of each pad structure 910 can be flush with one another at the top surface of dielectric layer 920, and the lower end of each pad structure 910 can be flush with one another at the bottom surface of the dielectric layer 920, and can be in contact with corresponding channel structure 600 or peripheral contact 730.

It is understood that, a contact process for forming the multiple pad structures 910 can include multiple processes, for example, photolithography, etching, thin film deposition, and CMP. In some embodiments, a hard mask layer can be formed on the dielectric layer 920, and multiple vertical through openings can be formed in the dielectric layer 920 by a wet etching and/or dry etching by using the hard mask layer. A followed deposition process can form the multiple pad structures 910 by filling the multiple vertical through openings with conductor materials using ALD, CVD, PVD, any other suitable processes, or any combination thereof. The conductor materials used for filling the multiple vertical through openings can include, but are not limited to, W, Co, Cu, Al, polysilicon, silicides, or any combination thereof.

The wiring layer 930 can be a patterned conductive layer formed on the pad structures 910 and the dielectric layer 920. In some embodiments, fabricating processes of forming wiring layer 930 can include forming a conductive layer over the pad structures 910 and the dielectric layer 920. After that, a resist mask is formed by a photolithography process, and an unnecessary portion is removed by etching to form wirings. In some embodiments, the resist mask used for forming the wiring layer 930 can be formed with an ink-jet method. The wiring layer 930 can be formed with a single-layer structure or a layered structure using any of metal materials such as molybdenum (Mo), titanium (Ti), chromium (Cr), tantalum (Ta), tungsten (W), aluminum (Al), copper (Cu), neodymium (Nd), scandium (Sc), etc., and an alloy material including any of these materials as a main component.

In some embodiments, the protection layer 940 can include an insulating sublayer and a polymer sublayer. The insulating sublayer can be a nitride layer, such as a metal nitride layer. The polymer sublayer can be any suitable nanoconfinement of polymers configured to prevent scratching of or damage to the wiring layer 930.

Figure 4:
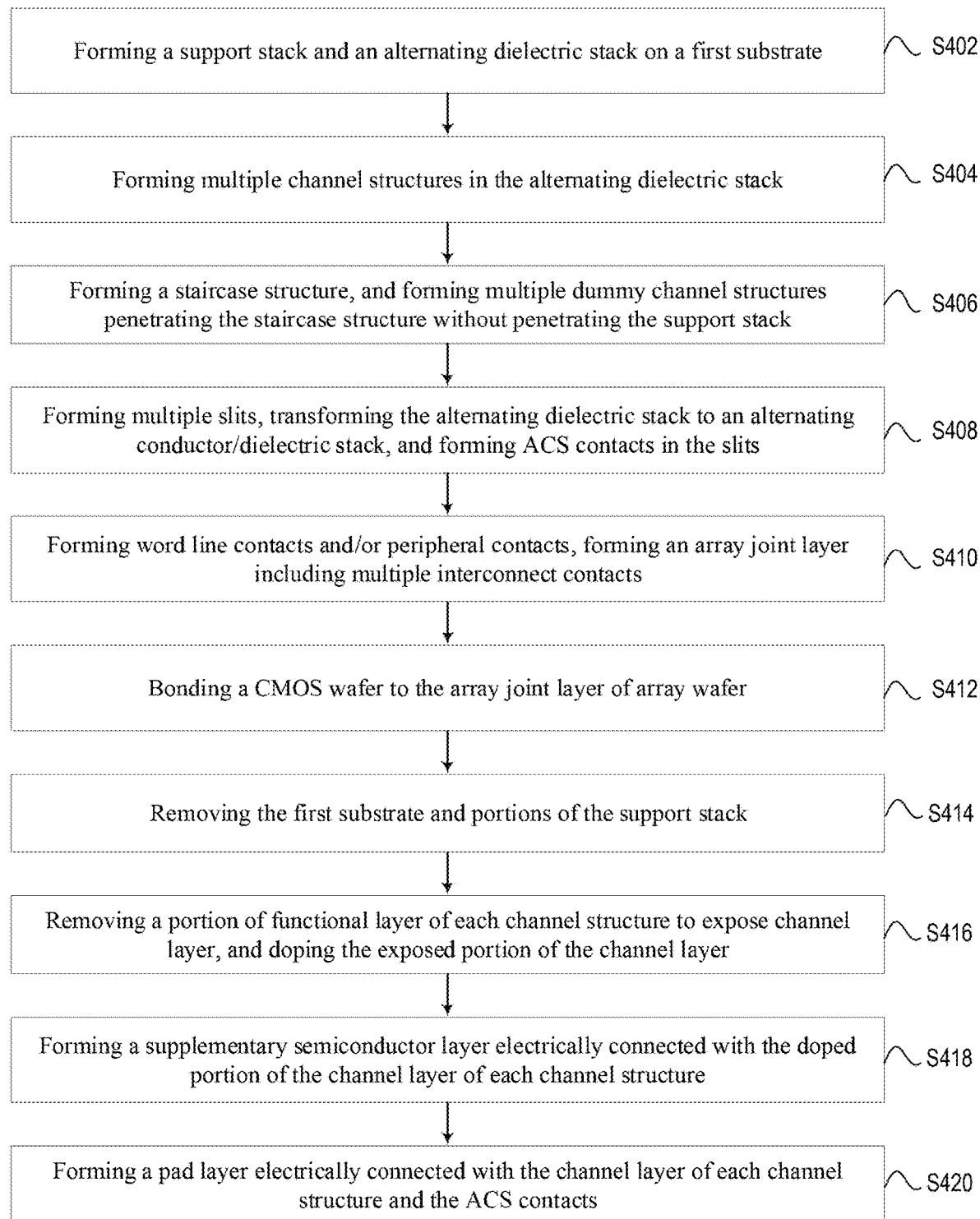
FIG. 4 illustrate flow diagrams of another exemplary method for forming a 3D memory device, according to some other embodiments of the present disclosure.
Figure 5A:
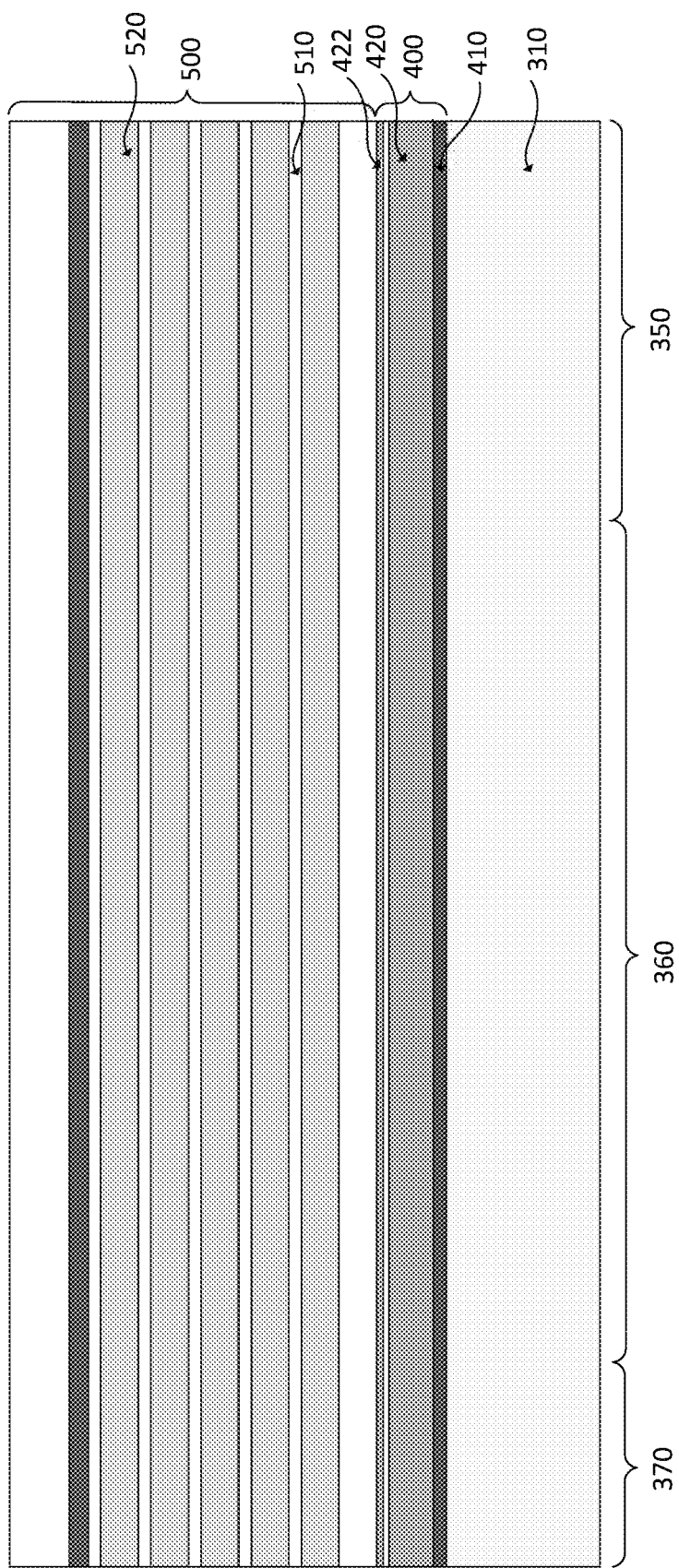
FIGS. 5A-5T illustrate schematic cross-sectional views of an exemplary 3D memory device at certain fabricating stages of the method shown in FIG. 4 according to some embodiments of the present disclosure.
Figure 5B:
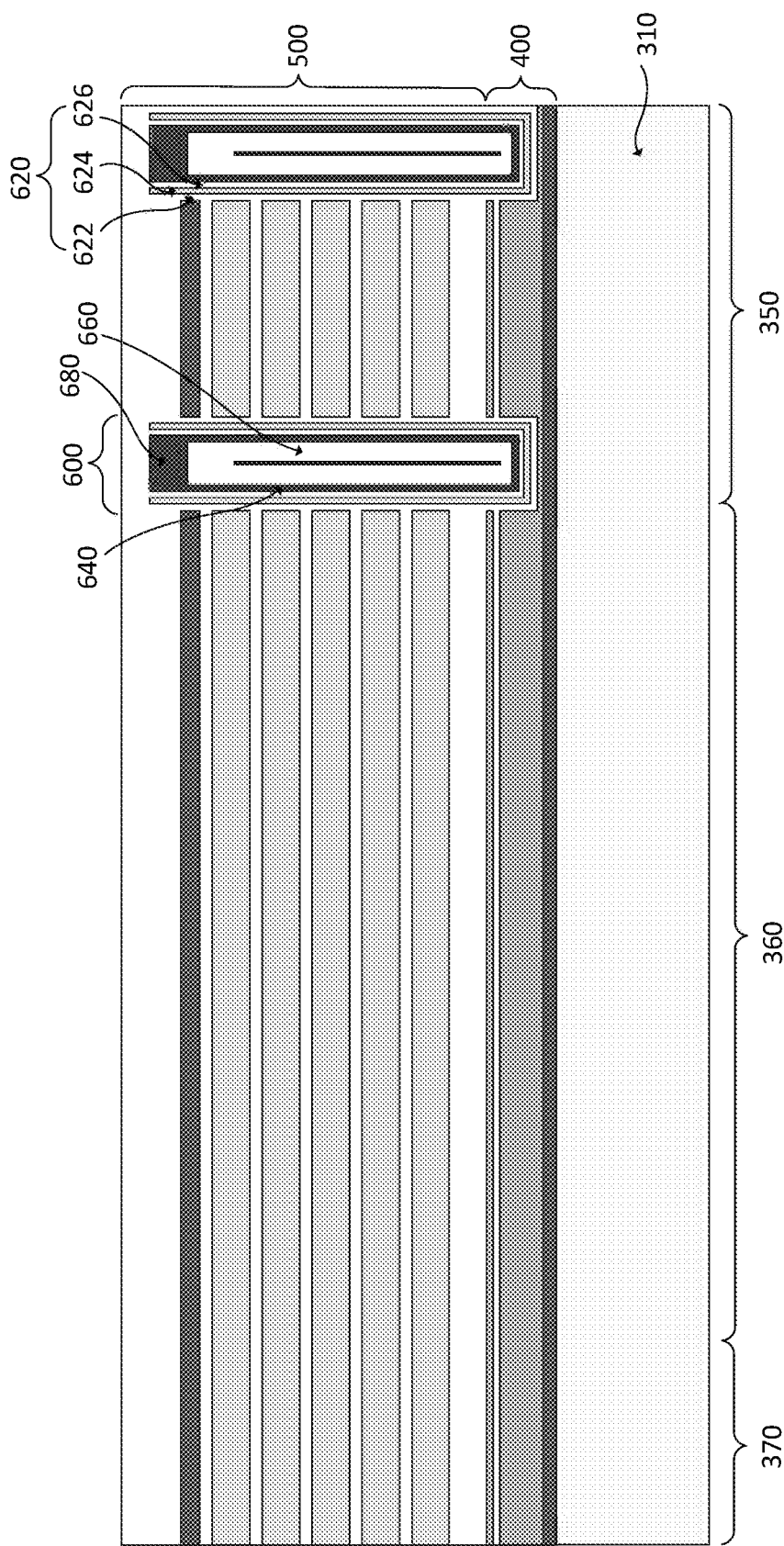

Referring to FIG. 4, a flow diagram of another exemplary method for forming a 3D memory device is illustrated in accordance to some other embodiments of the present disclosure. It should be understood that the operations and/or steps shown in FIG. 4 are not exhaustive and that other operations can be performed as well before, after, or between any of the illustrated operations. FIGS. 5A-5T illustrate schematic cross-sectional views of an exemplary 3D memory device at certain fabricating stages of the method shown in FIG. 4 according to some embodiments of the present disclosure.

As shown in FIG. 4, the method starts at operation S402, in which a support stack and an alternating dielectric stack can be formed on a first substrate. In some embodiments as shown in FIG. 5A, the formed structure can include a core array region 350, a staircase region 360 and a periphery region 370.

In some embodiments, the first substrate 310 be any suitable semiconductor substrate having any suitable structure, such as a monocrystalline single-layer substrate, a polycrystalline silicon (polysilicon) single-layer substrate, a polysilicon and metal multi-layer substrate, etc.

A support stack 400 can be formed on the first substrate 310. The support stack 400 can include a sacrificial dielectric layer 410, a first semiconductor layer 420, a second semiconductor layer 422, and an intermediate layer between the first semiconductor layer 420 and the second semiconductor layer 422. In some embodiments, the sacrificial dielectric layer 410 can be ax oxide layer, such as a silicon oxide layer. The first and second semiconductor layers 420 and 422 can be amorphous silicon layers separated by an insulating layer as the intermediate layer. Some portions of the sacrificial dielectric layer 410 and first semiconductor layer 420 can be removed in subsequent processes. The support stack 400 are extended in a lateral direction that is parallel to a surface of the first substrate 310. In some embodiments, the support stack 400 can be formed by one or more thin film deposition processes including, but not limited to, CVD, PVD, ALD, or any combination thereof.

An alternating dielectric stack 500 can be formed on the support stack 400. The alternating dielectric stack 500 can including a plurality of dielectric layer pairs. Each dielectric layer pair of the alternating dielectric stack 500 can include a first dielectric layer 510 and a second dielectric layer 520 that is different from first dielectric layer 510. In some embodiments, the first dielectric layers 510 can be used as insulating layers, and the second dielectric layer 520 can be used as sacrificial layers, which are to be removed in the subsequent processes.

The plurality of first dielectric layers 510 and second dielectric layers 520 are extended in a lateral direction that is parallel to a surface of the first substrate 310. In some embodiments, there are more layers than the dielectric layer pairs made of different materials and with different thicknesses in the alternating dielectric stack 500. The alternating dielectric stack 500 can be formed by one or more thin film deposition processes including, but not limited to, CVD, PVD, ALD, or any combination thereof.

In some embodiments, the alternating dielectric stack 500 can include a plurality of oxide/nitride layer pairs. Each dielectric layer pair includes a layer of silicon oxide 510 and a layer of silicon nitride 520. The plurality of oxide/nitride layer pairs are also referred to herein as an "alternating oxide/nitride stack." That is, in the alternating dielectric stack 500, multiple oxide layers 510 and multiple nitride layers 520 alternate in a vertical direction. In other words, except a top and a bottom layer of a given alternating oxide/nitride stack, each of the other oxide layers 510 can be sandwiched by two adjacent nitride layers 520, and each of the nitride layers 520 can be sandwiched by two adjacent oxide layers 510.

Oxide layers 510 can each have the same thickness or have different thicknesses. For example, a thickness of each oxide layer can be in a range from about 10 nm to about 150 nm. Similarly, nitride layers 520 can each have the same thickness or have different thicknesses. For example, a thickness of each nitride layer can be in a range from about 10 nm to about 150 nm. In some embodiments, a total thickness of the alternating dielectric stack 500 can be larger than 1000 nm. It is noted that, the thickness ranges are provided for illustration, and should not be construed to limit the scope of the appended claims.

It is noted that, in the present disclosure, the oxide layers 510 and/or nitride layers 520 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 500 can include any suitable number of layers of the oxide layers 510 and the nitride layers 520. In some embodiments, a total number of layers of the oxide layers 510 and the nitride layers 520 in the alternating dielectric stack 500 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair. For example, a bottom layer and a top layer in the alternating dielectric stack 500 can be oxide layers 510.

As shown in FIG. 4, the method proceeds to operation S404, in which multiple channel structures can be formed in the alternating dielectric stack in the core array region. In some embodiments as shown in FIG. 5B, each channel structure 600 can include a channel hole extending vertically through the alternating dielectric stack 500, a functional layer 620 on the sidewall of the channel hole, a channel layer 640 between the functional layer 620 and a filling structure 660, and a channel plug 680 on a top of the channel hole. The multiple channel structures 600 can be arranged as an array in the alternating dielectric stack in the core array region 350.

In some embodiments, fabrication processes to form the channel structure include forming multiple channel holes that extend vertically through the alternating dielectric stack 500 to expose the first semiconductor layers 420 of the support stack 400. The channel hole can have a high aspect ratio, and can be formed by etching the alternating dielectric stack 500, and a subsequent cleaning process. The etching process to form the channel hole can be a wet etching, a dry etching, or a combination thereof.

In some embodiments, fabrication processes to form a functional layer 620 on the sidewall of the channel hole. The functional layer 620 can be a composite dielectric layer, such as a combination of a barrier layer 622, a storage layer 624, and a tunneling layer 626. The functional layer 620, including the barrier layer 622, the storage layer 624, and the tunneling layer 626, can be formed by one or more thin film deposition processes, such as ALD, CVD, PVD, any other suitable processes, or any combination thereof.

The barrier layer 622 can be formed between the storage layer 624 and the sidewall of the channel hole. The barrier layer 622 can be used for blocking the outflow of the electronic charges. In some embodiments, the barrier layer 622 can be a silicon oxide layer or a combination of silicon oxide/silicon nitride/silicon oxide (ONO) layers. In some embodiments, the barrier layer 622 includes high dielectric constant (high k-value) dielectrics (e.g., aluminum oxide). In some embodiments, a thickness of the barrier layer 622 can be in a range from about 3 nm to about 20 nm.

The storage layer 624 can be formed between the tunneling layer 626 and the barrier layer 622. Electrons or holes from the channel layer can tunnel to the storage layer 624 through the tunneling layer 626. The storage layer 624 can be used for storing electronic charges (electrons or holes) for memory operation. The storage or removal of charge in the storage layer 624 can impact the on/off state and/or a conductance of the semiconductor channel. The storage layer 624 can include one or more films of materials including, but are not limited to, silicon nitride, silicon oxynitride, a combination of silicon oxide and silicon nitride, or any combination thereof. In some embodiments, the storage layer 624 can include a nitride layer formed by using one or more deposition processes. In some embodiments, a thickness of the storage layer 624 can be in a range from about 3 nm to about 20 nm.

The tunneling layer 626 can be formed on the sidewall of the storage layer 624. The tunneling layer 626 can be used for tunneling electronic charges (electrons or holes). The tunneling layer 626 can include dielectric materials including, but not limited to, silicon oxide, silicon nitride, silicon oxynitride, or any combination thereof. In some embodiments, the tunneling layer 130 can be an oxide layer formed by using a deposition process. In some embodiments, a thickness of the tunneling layer 626 can be in a range from about 3 nm to about 20 nm.

In some embodiments, fabrication processes to form the channel structure 600 further include forming a channel layer 640 covering the sidewall of the functional layer 720, as shown in FIG. 5B. In some embodiments, the channel layer 640 can be an amorphous silicon layer or a polysilicon layer formed by using a thin film deposition process, such as ALD, CVD, PVD, or any other suitable process. In some embodiments, a thickness of the channel layer 640 can be in a range from about 5 nm to 20 nm.

In some embodiments, fabrication processes to form the channel structure 600 further include forming a filling structure 660 to cover the channel layer 640 and fill the channel hole, as shown in FIG. 5B. In some embodiments, the filling structure 660 can be an oxide layer formed by using any suitable deposition process, such as ALD, CVD, PVD, etc. In some embodiments, the filling structure 660 can include one or more air gaps.

In some embodiments, fabrication processes to form the channel structure 600 further include forming a channel plug 680 at a top of each channel hole, as shown in FIG. 5B. The channel plug 680 can be in contact with the channel layer 640 in each channel hole. The material of the channel plugs 680 can include any suitable conductive material, such as Si, W, etc. The channel plugs 680 can be formed by using any suitable deposition process, and a following CMP process.

As shown in FIG. 4, the method proceeds to operation S406, in which portions of the alternating dielectric stack in the staircase region can be removed to form a staircase structure, and a plurality of dummy channel structures can be formed in the staircase region to penetrate the staircase structure without penetrating the support stack. An insulating layer can be formed in the staircase region to cover the staircase structure.

Figure 5C:
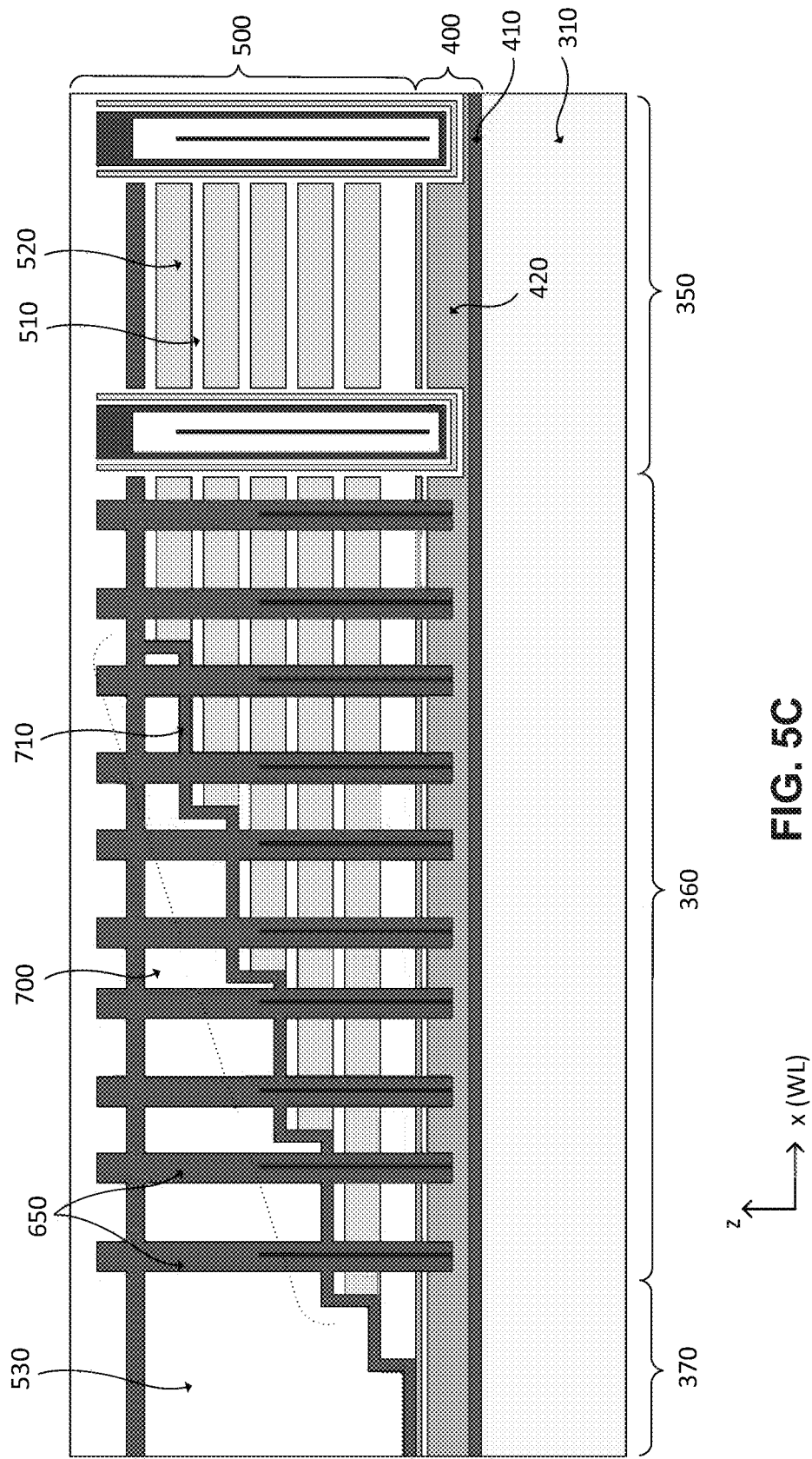

As shown in FIG. 5C, portions of the alternating dielectric stack 500 can be removed to form a staircase structure 700 in the staircase region 360. Multiple etch-trim processes can be performed repeatedly to form a set of steps. In some embodiments, each step can include one or more dielectric layer pairs. A staircase insulating layer 710 can be formed to cover the set of steps.

In some embodiments, the etch-trim processes can include a set of repeating etch-trim processes to form the staircase structure 700 including a set of steps at the edge the alternating dielectric stack 500.

Specifically, for forming each step, a photoresist layer (not shown) can be used as a mask to expose a portion of the top surface of the alternating dielectric stack 500. For forming the first step, a width of the exposed top surface of the alternating dielectric stack 500 can be a step width. In some embodiments, an anisotropic etching process, such as a reactive ion etching (RIE) process, or other suitable dry/wet etching process, can be performed to remove the exposed layer (e.g., the second dielectric layer 520) that is exposed through the mask (i.e., the photoresist layer). The etching process can stop on the next lower layer (e.g., the first dielectric layer 510). The pattern in the mask (i.e., the photoresist layer) is then transferred to the layer (e.g., the second dielectric layer 520) that has been etched. The exposed next lower layers (e.g., the first dielectric layers 610) can be then removed by another etching process that stops on the next lower layers (e.g., the second dielectric layer 520). As such, the first step can be created on the first two top layers of the alternating dielectric stack 500.

Next, the mask (i.e., the photoresist layer) can be reduced in size by removing a portion of the mask (also known as "trimming") above the alternating dielectric stack 500, such as by an isotropic etching process, to expose another step width of the alternating dielectric stack 500. The method can proceed by subjecting the structure to two anisotropic etching processes, including removing exposed portions of the two exposed layers (e.g., two second dielectric layers 520), and subsequently removing exposed portions of the two exposed next lower layers (e.g., the first dielectric layers 510). As such, the first step can be lowered to the third and fourth top layers of the alternating dielectric stack 500, and a second step can be created on the first two top layers of the alternating dielectric stack 500.

In some embodiments, the successive reduction in size of the mask (i.e., the photoresist layer) and the two-step etching processes (also referred as etch-trim processes) can be repeated such that the staircase structure 700 including a set of steps can be formed in the staircase region, as shown in FIG. 5C. The photoresist layer can be then removed. In some embodiments, the removal process can include any suitable etching processes and cleaning processes.

As shown in FIG. 5C, a staircase insulating layer 710 can be formed to cover the staircase structure 700. In some embodiments, a deposition process can be performed to form the staircase insulating layer 710. In some embodiments, a filling insulating structure 530 can be formed to cover the alternating dielectric stack 500 including the staircase structure 700. A CMP process can be performed to planarize the top surface of the filling insulating structure 530.

As shown in FIG. 5C, multiple dummy channel structures 650 can be formed in the staircase region 360. In embodiments, the dummy channel structures 650 can be formed in any suitable positions in the core array region 350, the staircase region 360 and/or the periphery region 370. In some embodiments, fabrication processes to form the dummy channel structures 650 can include etching the filling insulating structure 530, the staircase insulating layer 710, the alternating dielectric stack 500, and portion of the support stack 400 to form multiple dummy channel holes. The multiple dummy channel holes can penetrate the filling insulating structure 530, the staircase insulating layer 710, the alternating dielectric stack 500, and extend into the support stack 400 without penetrating the support stack 400. A deposition process can then be performed to fill the multiple dummy channel holes with any suitable dielectric material, such as $SiO_2$. As such, multiple dummy channel structures 650 can be formed to provide mechanical support for the 3D memory array structures.

As shown in FIG. 4, the method proceeds to operation S408, in which multiple slits can be formed in the alternating dielectric stack and extending in a word line direction, the second dielectric layers in the alternating dielectric stack can be replaced by multiple gate structures, and an array common source (ACS) contact wall sandwiched between two gate line spacer layers can be formed in each of the multiple slits.

Figure 5D:
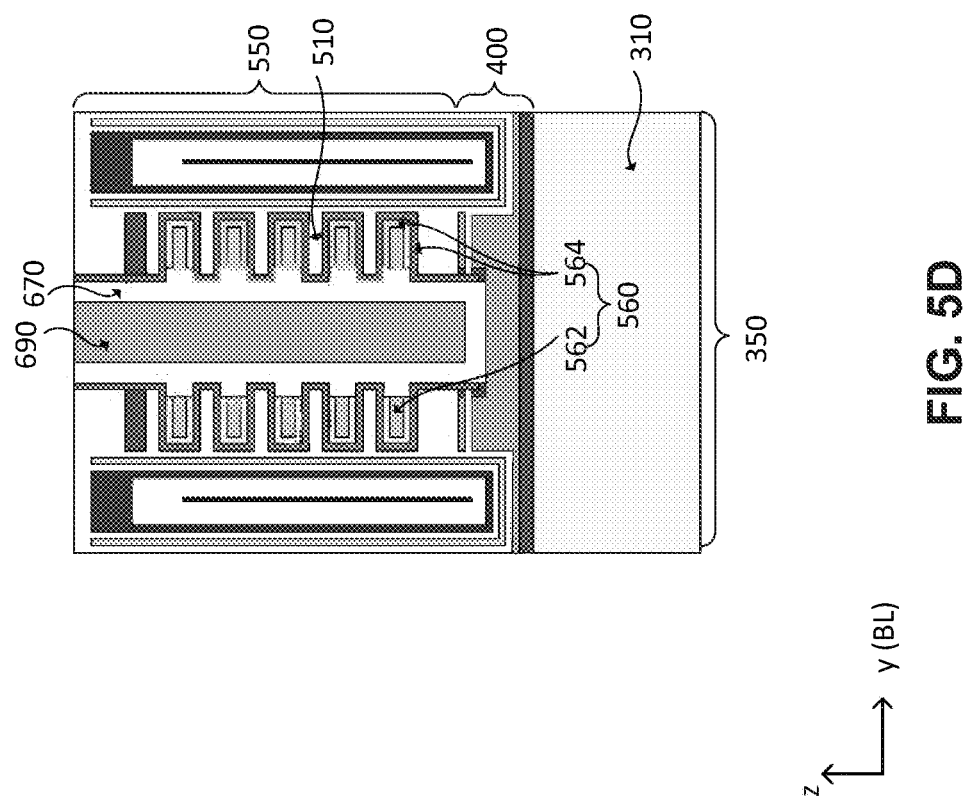

As shown in cross-sectional view of core array region 350 in y-z plane in FIG. 5D, in some embodiments, each of the multiple slits can vertically penetrate through the alternating dielectric stack 500 and extend vertically into the first semiconductor layers 420 of the support stack 400, and can extend laterally in a straight line along a word line direction between two arrays of channel structures 600. The multiple slits can be formed by forming a mask layer (not shown) over the alternating dielectric stack 500 and patterning the mask using, e.g., photolithography, to form openings corresponding to the multiple slits in the patterned mask layer. A suitable etching process, e.g., dry etch and/or wet etch, can be performed to remove portions of the alternating dielectric stack 500 exposed by the openings until the multiple slits expose the first semiconductor layers 420. The mask layer can be removed after the formation of the multiple slits.

In some embodiments, the second dielectric layers 520 in the alternating dielectric stack 500 can be replaced by multiple gate structures 560. After the replacement, the alternating dielectric stack 500 can become an alternating dielectric/conductive stack 550. In some embodiments, the second dielectric layers 520 in the alternating dielectric stack 500 can be removed through the multiple slits. As described above, the second dielectric layers 520 in the alternating dielectric stack 500 are used as sacrificial layers, and are removed by used any suitable etching process, e.g., an isotropic dry etch or a wet etch. The etching process can have sufficiently high etching selectivity of the material of the second dielectric layers 520 over the materials of the first dielectric layers 510, such that the etching process can have minimal impact on the first dielectric layers 510. The isotropic dry etch and/or the wet etch can remove second dielectric layers 520 in various directions to expose the top and bottom surfaces of each first dielectric layer 510. As such, multiple horizontal trenches can then be formed between first dielectric layers 510. Each of the multiple horizontal trenches can extend in a horizontal direction, and can be used as a space for a gate structure 560 to be formed in the subsequent processes. It is noted that, the term "horizontal/horizontally" used herein means nominally parallel to a lateral surface of a substrate.

In some embodiments, the second dielectric layers 520 include silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10 V. In some embodiments, the second dielectric layers 520 include silicon nitride and the etchant of the wet etch includes phosphoric acid. After the second dielectric layers 520 are removed, the multiple slits and multiple horizontal trenches can be cleaned by using any suitable cleaning process. For example, a phosphoric acid rinsing process can be performed to remove the impurities on the inner wall of the horizontal trenches. In some embodiments, a rinsing temperature can be in a range from about 100° C. to about 200° C., and a rinsing time can be in a range from about 10 minutes to about 100 minutes.

In some embodiments, multiple gate structures 560 can be formed in each horizontal trench, as shown in FIG. 5D. In some embodiments, each gate structure 560 can include a gate electrode 564 wrapped by one or more insulating films 564. The one or more insulating films 564 can be used as one or more gate dielectric layers for insulating the respective word line (i.e., gate electrode).

In some embodiments, the one or more insulating films 564 can be formed to cover the exposed surfaces of the horizontal trenches with one or more suitable insulating materials. For example, one or more suitable deposition processes, such as CVD, PVD, and/or ALD, can be utilized to deposit the one or more insulating materials into the horizontal trenches. In some embodiments, a recess etching process and/or a CMP process can be used to remove excessive insulating material(s). The one or more insulating materials can include any suitable materials that provide electric insulating function.

In some embodiments, the gate electrode 562 can be formed in each horizontal trench. The gate electrode 562 can be formed by filling the horizontal trenches with a suitable gate electrode metal material. The gate electrodes 562 can provide the base material for the word lines. The gate electrode metal material can include any suitable conductive material, e.g., tungsten, aluminum, copper, cobalt, or any combination thereof, for forming the word lines. The gate electrode material can be deposited into horizontal trenches using a suitable deposition method such as CVD, PVD, plasma-enhanced CVD (PECVD), sputtering, metal-organic chemical vapor deposition (MOCVD), and/or ALD.

In some embodiments, portions of the multiple gate structures 560 can be removed by a recess etching process. In some embodiments, in order to ensure the insulation between multiple gates, a recess etching process, such as a wet etching process, can be performed to remove the exposed portions of the multiple gate structures 560. In doing so, a recess can be formed in each horizontal trench adjacent to the sidewalls of the silt.

In some embodiments, a gate line spacer (GLSP) layer 670 can be formed on both side walls of each slit. The GLSP layer 670 can be used to provide electrical insulation between the multiple gate structures 560 and one or more array common source (ACS) contacts 690 formed in subsequent processes. In some embodiments, the GLSP layer 670 can be formed by using any suitable deposition process, such as an atomic layer deposition (ALD) process to deposit a low temperature oxide material or a high temperature oxide material to fill the multiple slits 440.

In some embodiments, as shown in FIG. 5D, one or more ACS contacts 690 can be formed to vertically penetrate the GLSP layer 670, and be in electrical contact with the first semiconductor layer 420 of the support stack 400. A fabricating process for forming the one or more ACS contacts 690 include performing an etching process to remove one or more portions of the GLSP layer 670 to form one or more vertical holes or trenches that exposes the first semiconductor layer 420 of the support stack 400. A deposition process can then be performed to fill the one or more vertical holes or trenches with any suitable conductive material, such as metal materials including tungsten, aluminum, copper, polysilicon, silicides, and/or combinations thereof, etc. The conductive material can be deposited into the vertical trench using any suitable deposition method such as CVD, PVD, PECVD, MOCVD, and/or ALD. A CMP process can be performed to planarize the top surfaces of the one or more ACS contacts 690.

Figure 5E:
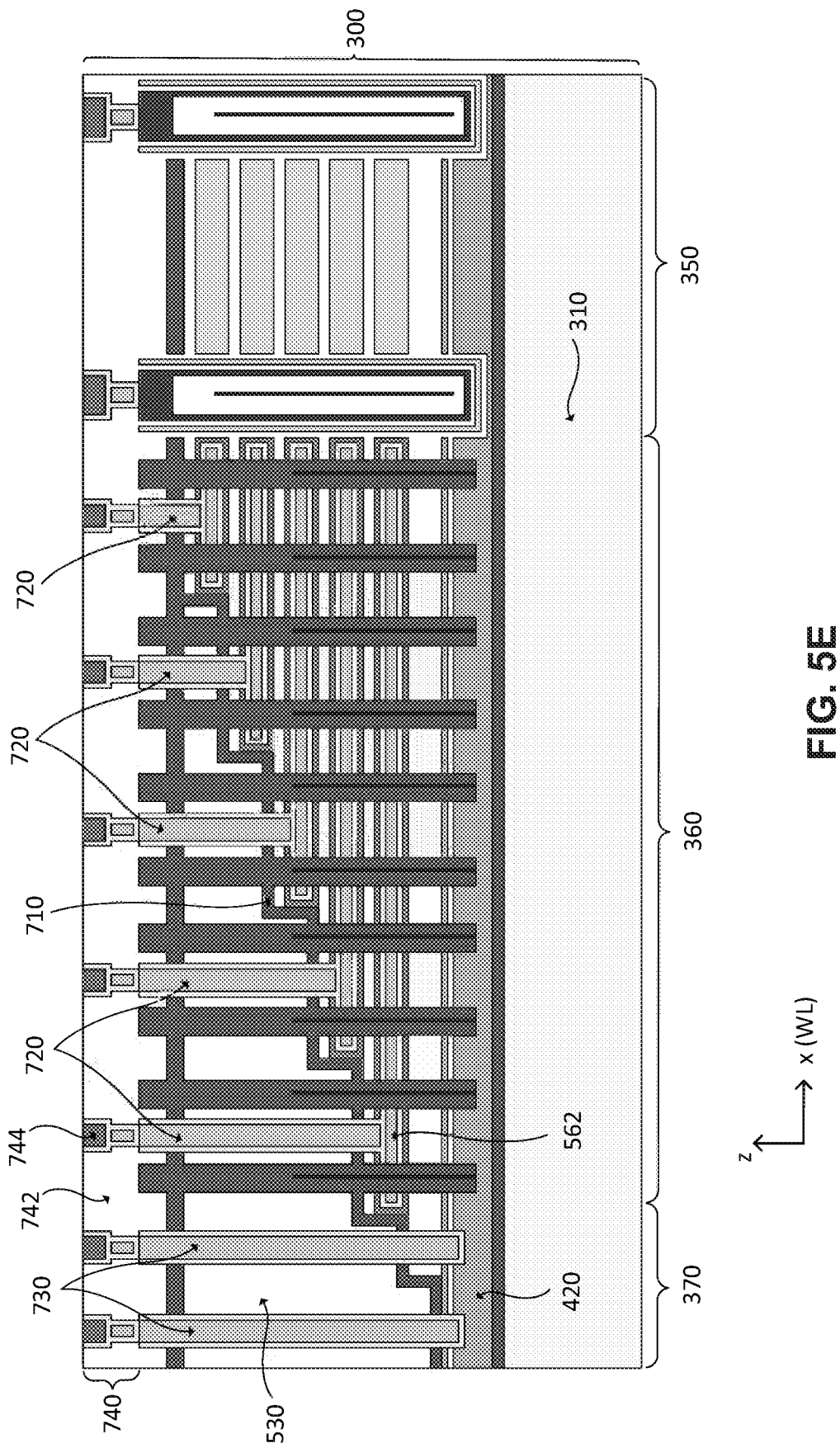

As shown in FIG. 4, the method proceeds to operation S410, in which a plurality of word line contacts and/or peripheral contacts can be formed, and an array joint layer including a plurality of interconnect contacts can be formed. As such, the array wafer 300 is formed, as shown in FIG. 5E (cross-sectional view in x-z plane) and FIG. 5F (cross-sectional view of core array region 350 in y-z plane).

In some embodiments, the multiple word line contacts 720 can be formed in the staircase region 360, and/or the multiple peripheral contacts 730 in the periphery region 370. In some embodiments, an end (e.g., the upper end) of each word line contact 720 or peripheral contact 730 is flush with one another, e.g., on the top surface of the filling insulating structure 530 in which the word line contacts 720 and/or peripheral contacts 730 are formed. Another end (e.g., the lower end) of each word line contact 720 or peripheral contact 730 can be in contact with the respective array wafer structure. For example, the lower end of each word line contacts 720 can be in contact with corresponding gate electrode 562 (word line) in one level of staircase structure 700, and the lower end of each peripheral contact 730 can be in contact with the first semiconductor layer 420 of the support stack 400.

It is understood that, a fabricating process for forming the plurality of word line contacts 720 and/or peripheral contacts 730 can include multiple processes, for example, photolithography, etching, thin film deposition, and CMP. For example, the plurality of word line contacts 720 and/or peripheral contacts 730 can be formed through the filling insulating structure 530 by first deep etching vertical openings (e.g., by wet etching and/or dry etching), followed by filling the vertical openings with conductor materials using ALD, CVD, PVD, any other suitable processes, or any combination thereof. The conductor materials used for filling the vertical openings can include, but are not limited to, W, Co, Cu, Al, polysilicon, silicides, or any combination thereof. In some embodiments, other conductor materials are also used to fill the openings to function as a barrier layer, an adhesion layer, and/or a seed layer.

In some embodiments, the plurality of word line contacts 720, peripheral contacts 730, and/or the one or more ACS contacts 690, can be simultaneously formed in the same contact forming process. In some embodiments, each process in the contact forming process needs to be performed only once for all of the word line contacts 720, peripheral contacts 730, and one or more ACS contacts 690. For example, a single lithography process can be performed to pattern the masks for all the openings of the word line contacts 720, peripheral contacts 730, and one or more ACS contacts 690; a single etching process can be performed to etch all the openings of the word line contacts 720, peripheral contacts 730, and one or more ACS contacts 690; a single deposition process can be performed to fill all the openings of the word line contacts 720, peripheral contacts 730, and one or more ACS contacts 690 with the same conductor materials.

Figure 5F:
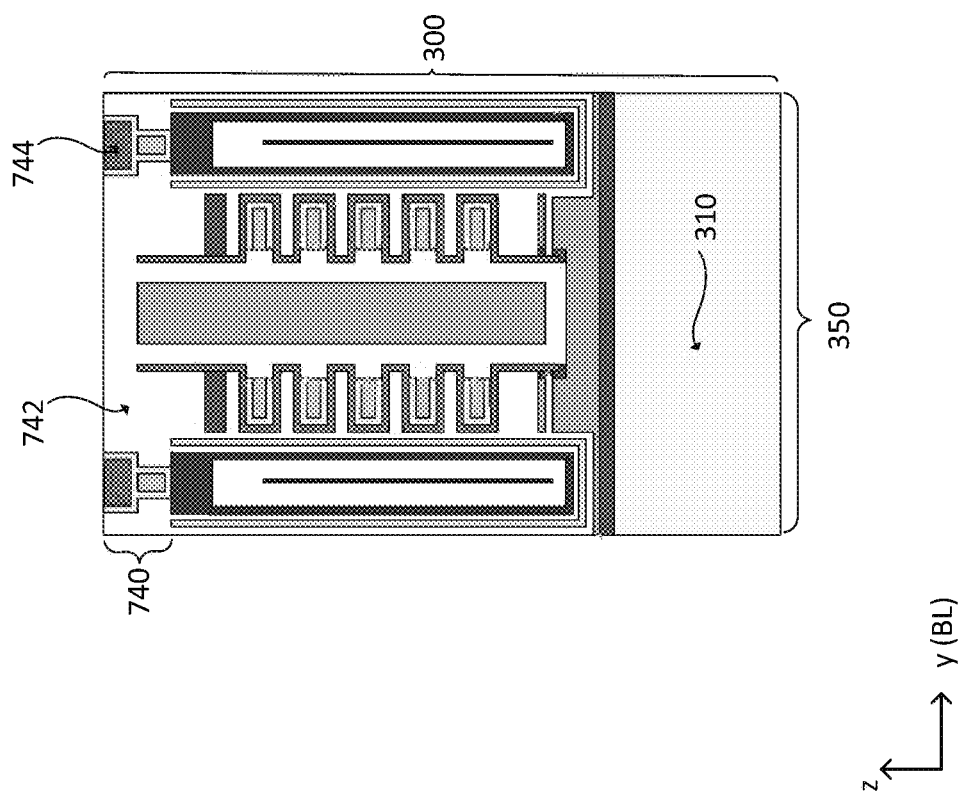

As shown in FIGS. 5E and 5F, an array joint layer 740 can include multiple interconnect contacts 744 embedded in a dielectric layer 742, and can be formed above the filling insulating structure 530. The upper end of each interconnect contact 744 can be flush with one another at the top surface of dielectric layer 742, and the lower end of each interconnect contact 744 can be flush with one another at the bottom surface of the dielectric layer 742, and can be in contact with the upper end of a corresponding word line contact 720, peripheral contact 730, or ACS contact 690.

The dielectric layer 742 can be formed by one or more thin film deposition processes, such as ALD, CVD, PVD, any other suitable processes, or any combination thereof. Dielectric layer 742 can include dielectric materials, including, but not limited to, silicon oxide, silicon nitride, silicon oxynitride, or any combination thereof. The interconnect contacts 744 can be formed through dielectric layer 742 by first etching vertical openings (e.g., by wet etching and/or dry etching), followed by filling the openings with conductor materials using ALD, CVD, PVD, any other suitable processes, or any combination thereof. The conductor materials used to fill the interconnect contacts 742 can include, but are not limited to, W, Co, Cu, Al, polysilicon, silicides, or any combination thereof. In some embodiments, other conductor materials are used to fill the openings to function as a barrier layer, an adhesion layer, and/or a seed layer.

In some embodiments, the array joint layer 740 can include multiple sub-layers, and each interconnect contact 744 can include multiple sub-contacts formed in the multiple sub-layers. For example, the multiple sub-contacts can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof, and can be formed in multiple contact forming processes. For example, fabrication processes to form the multiple sub-contacts can include forming one or more conductive layers and one or more contact layers in the corresponding sub-layers of dielectric layer 325. The conductive layers and the conductor contact layers can be formed by any suitable known back-end-of-line (BEOL) methods. In some embodiments, all interconnect contacts 744 in the array joint layer 740 can be simultaneously formed in the same contact forming processes.

Figure 5G:
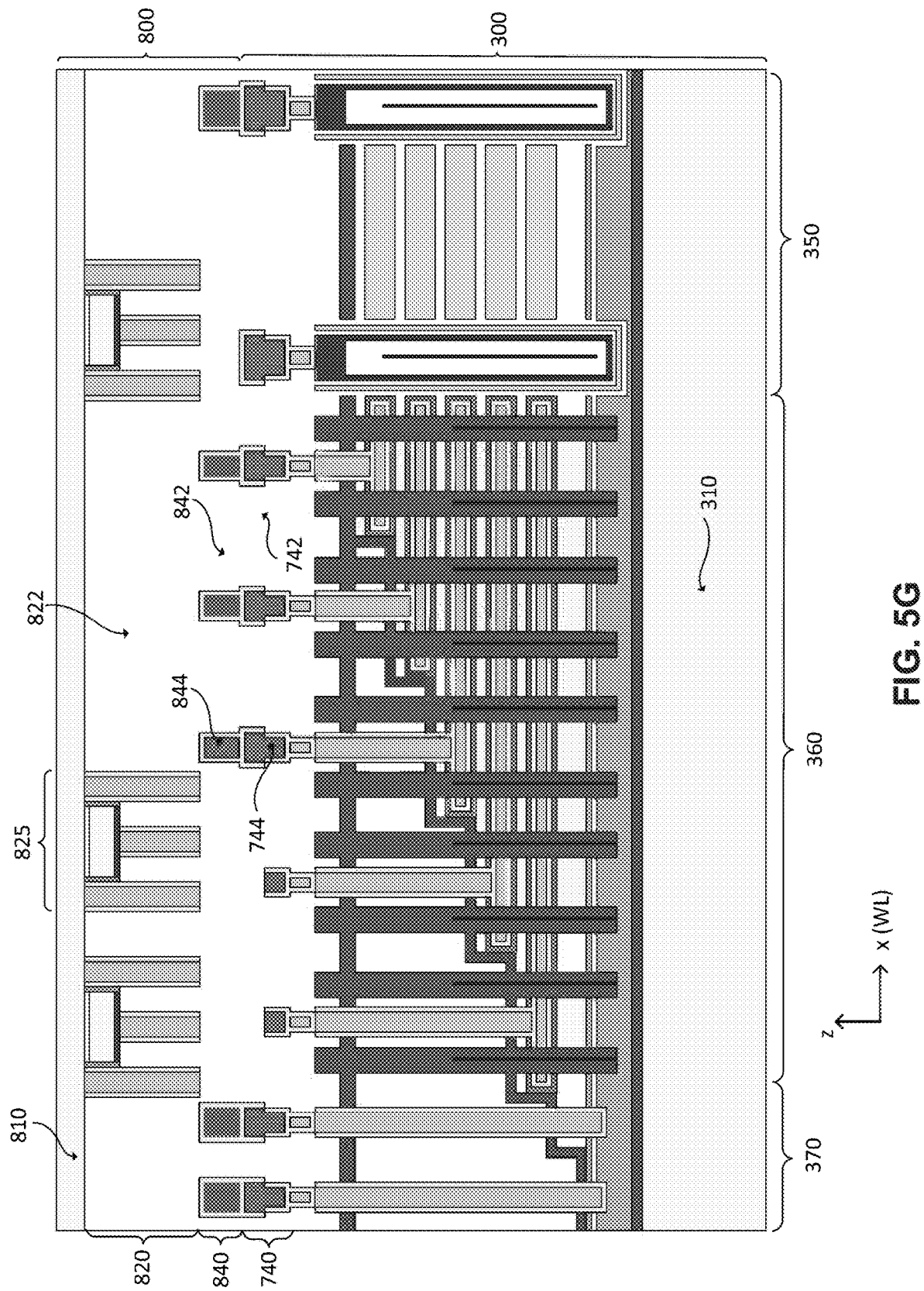

Referring back to FIG. 4, the method processed to operation S412, in which an CMOS wafer can be bonded on the array wafer. As shown in FIG. 5G (cross-sectional view in x-z plane) and FIG. 5H (cross-sectional view of core array region 350 in y-z plane), the CMOS wafer 800 can include a second substrate 810, a peripheral circuit layer 820 on the second substrate 810, and a CMOS joint layer 840 on the peripheral circuit layer 820.

In some embodiments, the second substrate 810 can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. Second substrate 510 can be a single layer substrate or a multi-layer substrate, for example, a monocrystalline single-layer substrate, a polycrystalline silicon (polysilicon) single-layer substrate, a polysilicon and metal multi-layer substrate, etc. In some embodiments, second substrate 810 is a thinned substrate (e.g., a semiconductive layer), which was thinned by grinding, wet/dry etching, chemical mechanical polishing (CMP), or any combination thereof.

Figure 5H:
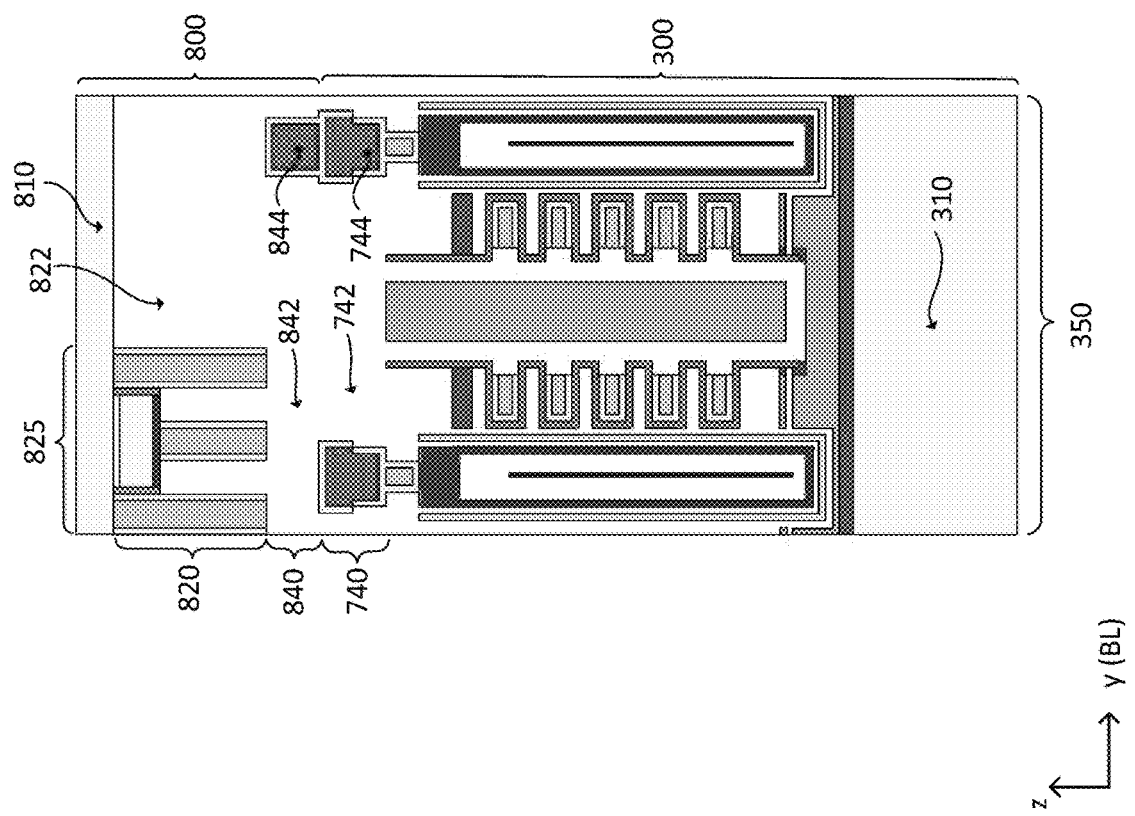

The peripheral circuit layer 820 formed on the second substrate 810 can include one or more peripheral circuits including any suitable digital, analog, and/or mixed-signal peripheral circuits used for facilitating the operation of the 3D memory device. For example, the one or more peripheral circuits can include one or more of a page buffer, a decoder (e.g., a row decoder and a column decoder), a latch, a sense amplifier, a driver, a charge pump, a current or voltage reference, or any active or passive components of the circuits (e.g., transistors, diodes, resistors, or capacitors). In some embodiments as shown in FIGS. 5G and 5H, the one or more peripheral circuits can include multiple CMOS devices 825 formed using complementary metal-oxide-semiconductor (CMOS) technology.

CMOS joint layer 840 can include a dielectric layer 842 and interconnect contacts 844 embedded in the dielectric layer 842, and can be formed above the peripheral circuit layer 820. The dielectric layer 842 can be formed by one or more thin film deposition processes, such as ALD, CVD, PVD, any other suitable processes, or any combination thereof. Dielectric layer 842 can include dielectric materials, including, but not limited to, silicon oxide, silicon nitride, silicon oxynitride, or any combination thereof. The interconnect contacts 844 can be formed through dielectric layer 842 by first etching vertical openings (e.g., by wet etching and/or dry etching), followed by filling the openings with conductor materials using ALD, CVD, PVD, any other suitable processes, or any combination thereof. The conductor materials used to fill the interconnect contacts 844 can include but are not limited to, W, Co, Cu, Al, polysilicon, silicides, or any combination thereof. In some embodiments, other conductor materials are used to fill the openings to function as a barrier layer, an adhesion layer, and/or a seed layer.

In some embodiments, the CMOS joint layer 840 can include multiple sub-layers, and each interconnect contact 844 can include multiple sub-contacts formed in the multiple sub-layers respectively. For example, the multiple sub-contacts can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof, and can be formed in multiple contact forming processes. For example, fabrication processes to form the multiple sub-contacts can include forming one or more conductive layers and one or more contact layer in the dielectric layer 842. The conductive layers and the conductor contact layers can be formed by any suitable known front-end-of-line (FEOL) methods. In some embodiments, all interconnect contacts 844 in CMOS joint layer 840 can be simultaneously formed in the same contact forming processes.

In some embodiments, the array wafer 300 and the CMOS wafer 800 can be bonded together. As shown in FIGS. 5G and 5H, the CMOS wafer 800 can be faced down and joined with the array wafer 300 by bonding the CMOS joint layer 840 of the CMOS wafer 800 to the array joint layer 740 of the array wafer 300.

The bonding interface is between the array joint layer 740 and the CMOS joint layer 840. Therefore, the bonding interface includes both the interface between two dielectric layers (e.g., between a silicon nitride layer and a silicon oxide layer) and the interface between two conductive layers (e.g., between two metal layers). In some embodiments, one or more interconnect contacts 744 and 844 can be contacted with each other at the bonding interface for electrical connection.

In some embodiments, the hybrid bonding between the array wafer 300 and the CMOS wafer 800 can include any suitable bonding processes or combinations thereof. For example, the bonding interface can be formed by chemical bonds between the dielectric layers and/or the conductive layers on both sides of the bonding interface. As another example, the bonding interface can be formed by physical interaction (e.g., inter-diffusion) between the dielectric layers and/or the conductive layers on both sides of the bonding interface. In some embodiments, the bonding interface can be formed after a plasma treatment or a thermal treatment of the surfaces from both sides of the bonding interface prior to the bonding process.

Referring back to FIG. 4, the method processed to operation S414, in which the first substrate can be removed, and portions of the support stack can be removed.

Figure 5I:
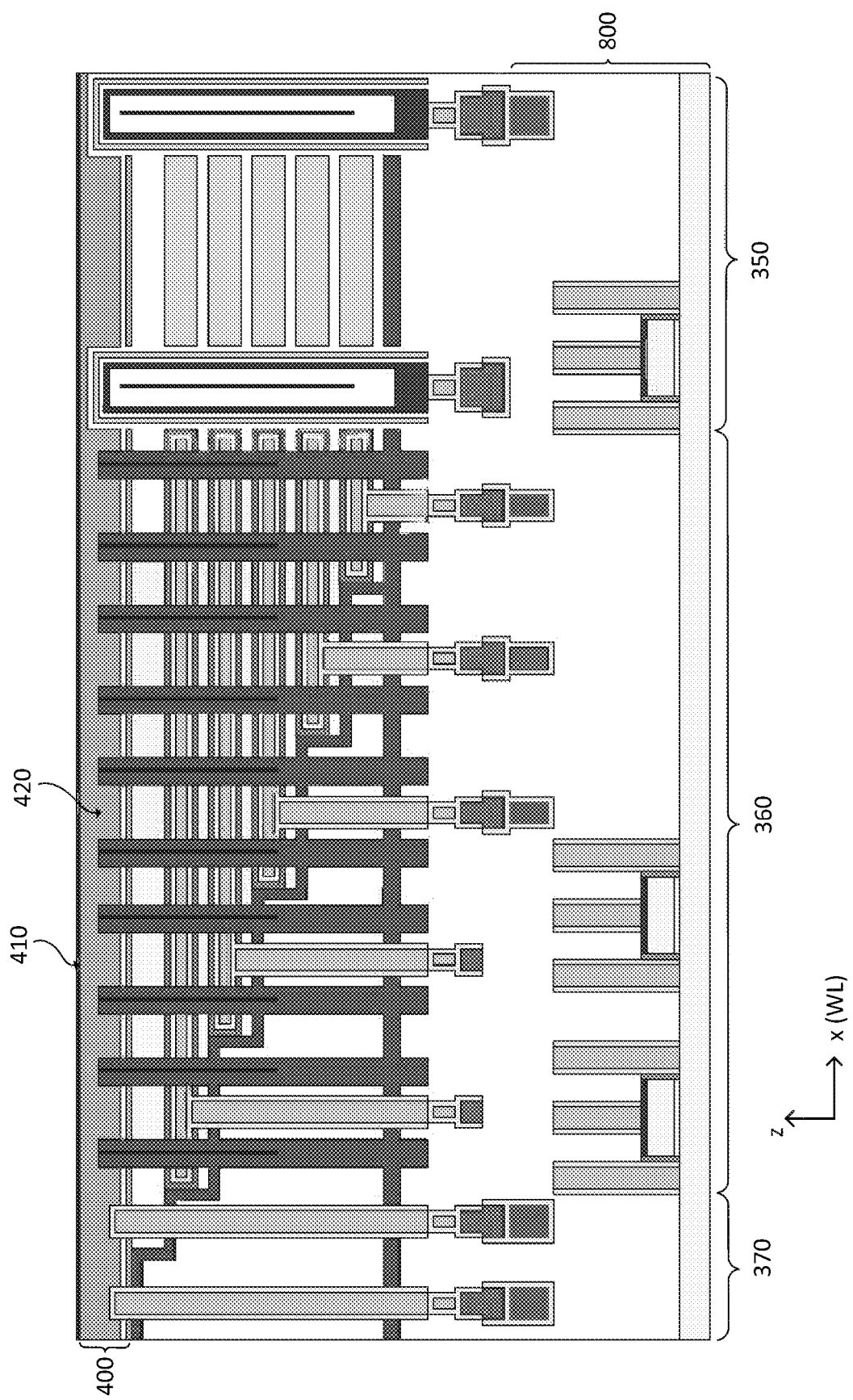
Figure 5J:
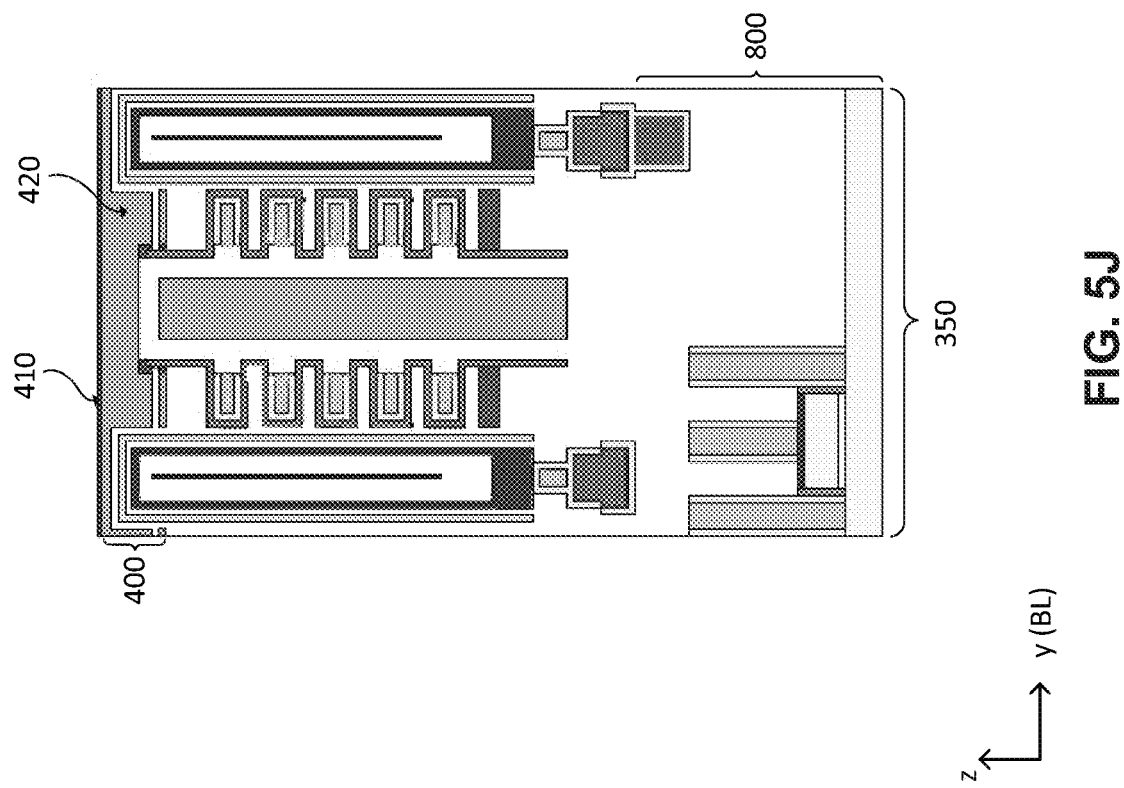

In some embodiments, operation S414 can include flipping over the bonded structure as shown in FIGS. 5G and 5H, such that the COMS wafer 800 is on a lower side and the array wafer 300 is on an upper side, as shown in FIG. 5I (cross-sectional view in x-z plane) and FIG. 5J (cross-sectional view of core array region 350 in y-z plane). In some embodiments, operation S414 can further include removing the first substrate 310 of the array wafer 300 by processes including, but not limited to, wafer grinding, dry etch, wet etch, CMP, any other suitable processes, or any combination thereof.

Figure 5K:
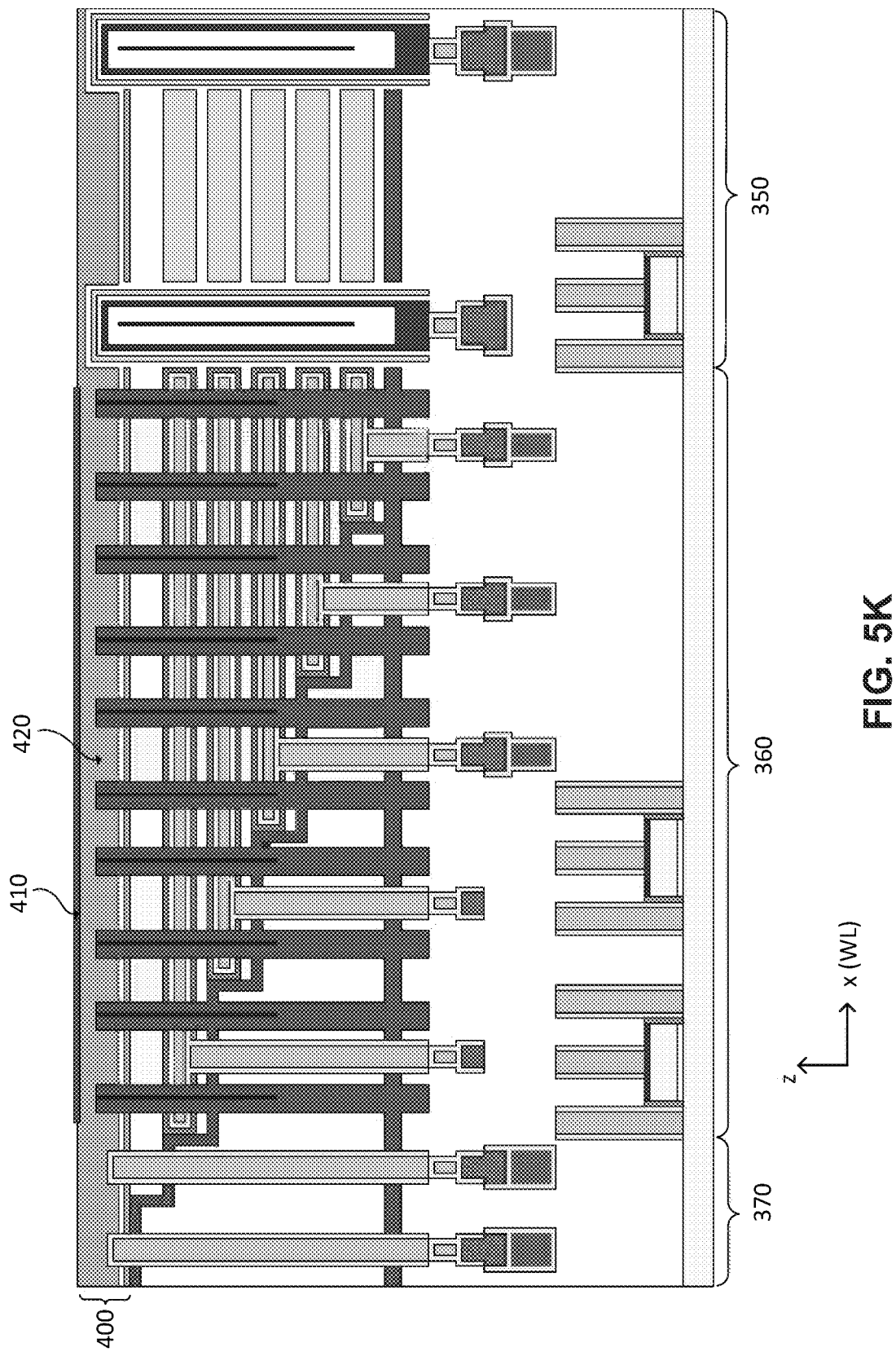
Figure 5L:
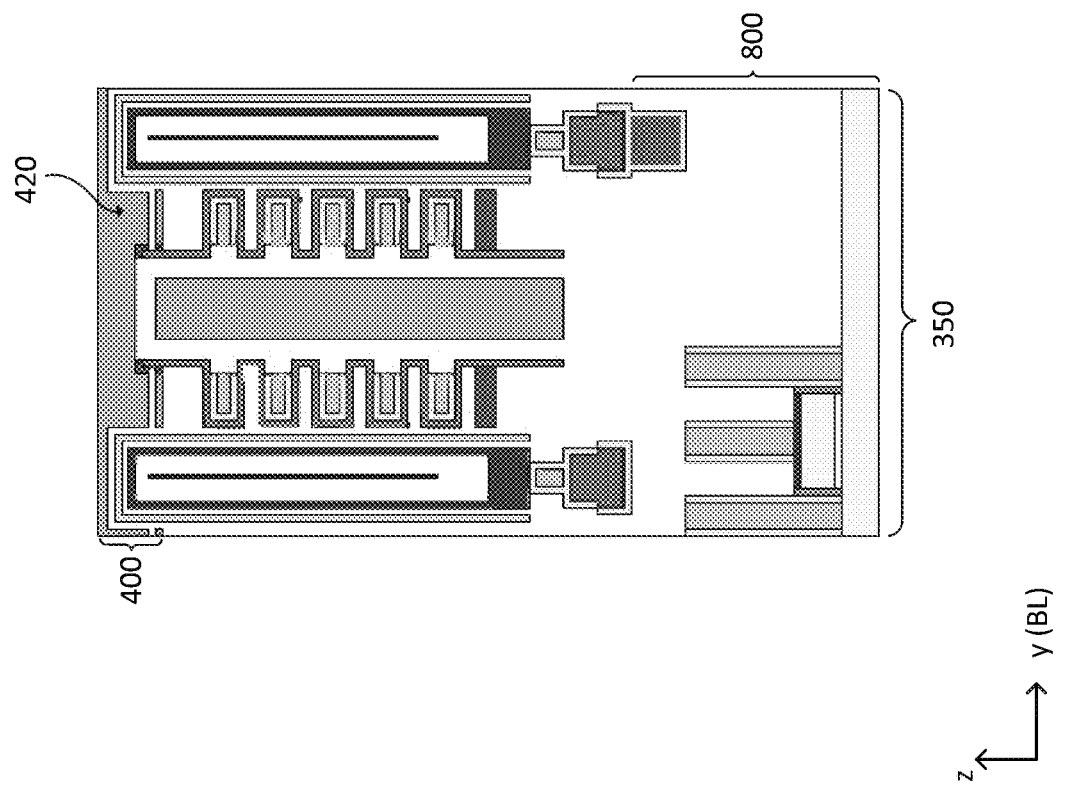

In some embodiments, operation S414 can further include removing portions of the sacrificial dielectric layer 410 in the core array region 350 and periphery region 370 to expose the first semiconductor layer 420, as shown in FIG. 5K (cross-sectional view in x-z plane) and FIG. 5L (cross-sectional view of core array region 350 in y-z plane). Portion of the sacrificial dielectric layer 410 in the staircase region 360 can be remained. It is understood that, the portions of the sacrificial dielectric layer 410 can be removed by any suitable photolithography process. For example, a patterned hard mask (not shown) can be formed on the sacrificial dielectric layer 410, and the portions of the sacrificial dielectric layer 410 can be removed by a wet etching and/or dry etching by using the patterned hard mask layer.

Figure 5M:
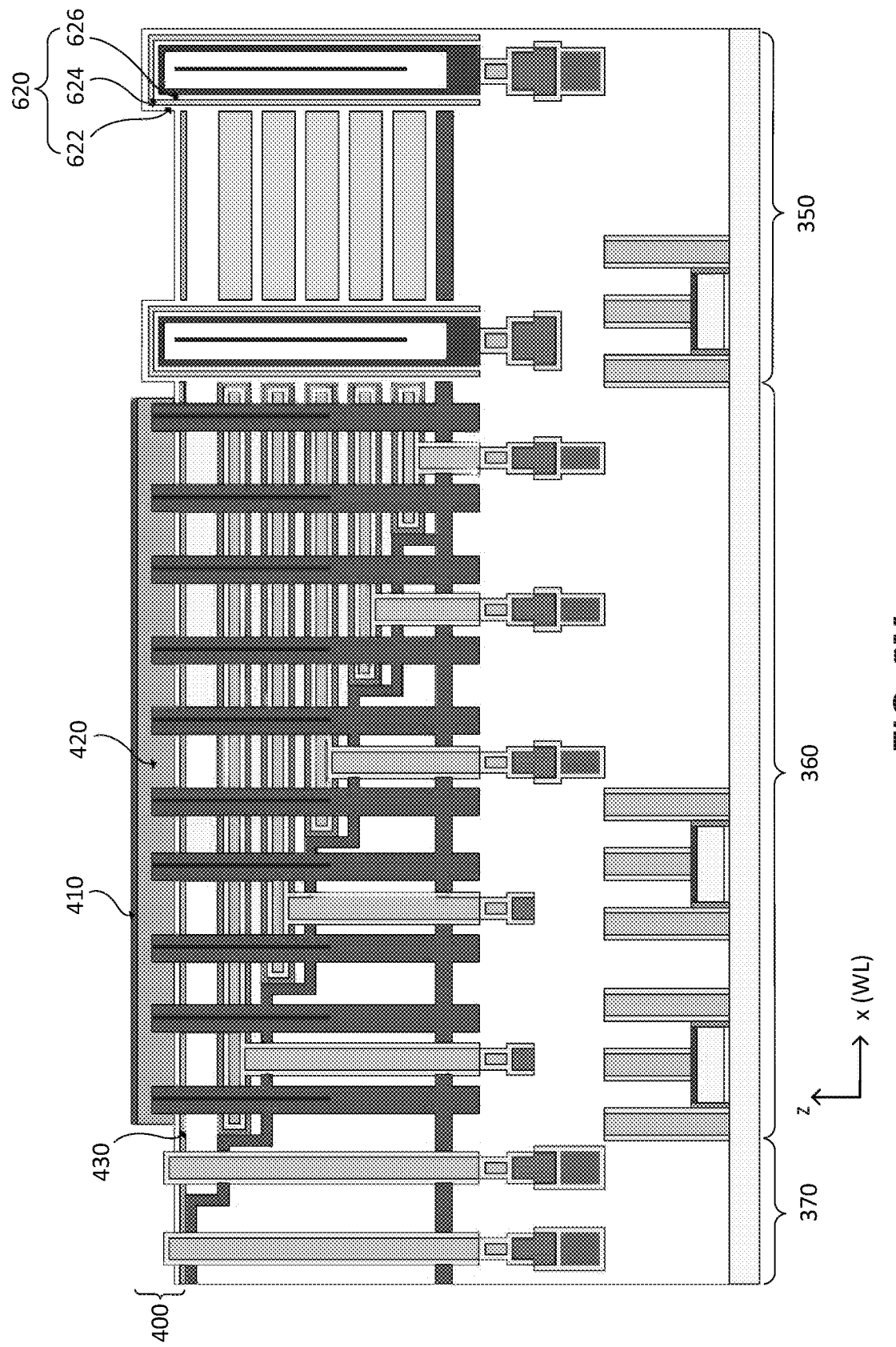
Figure 5N:
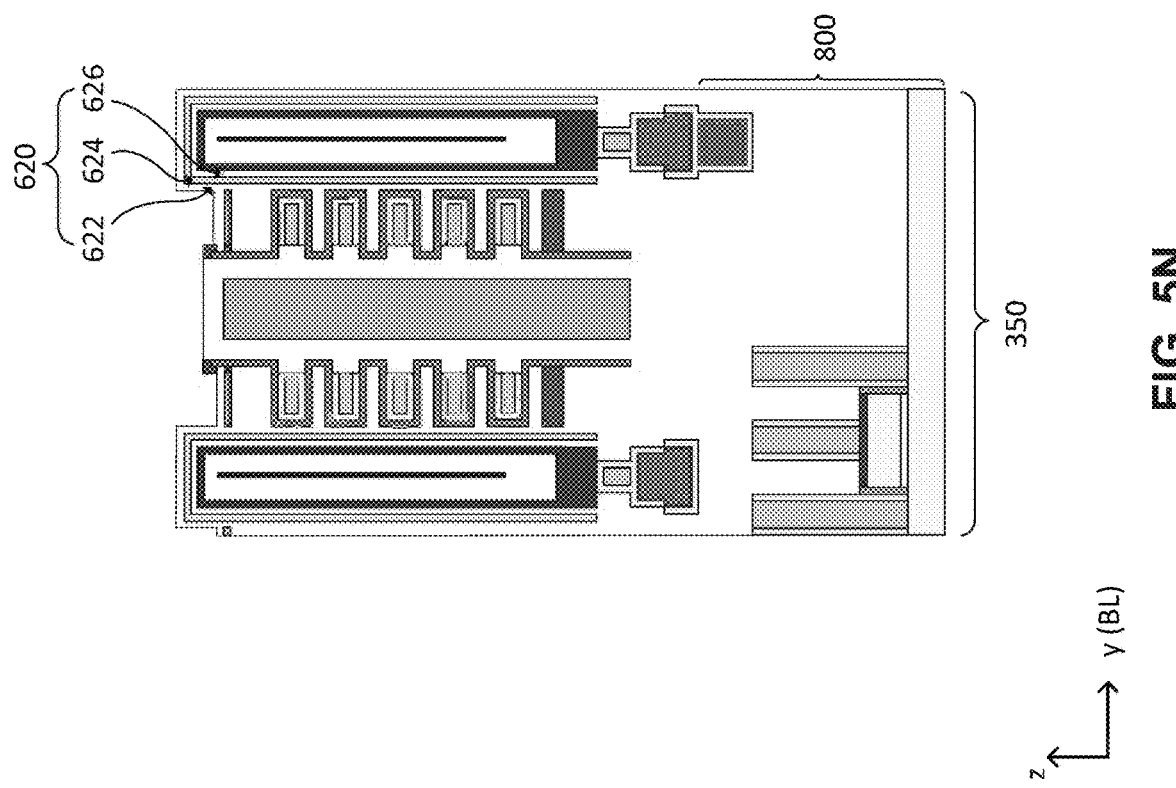
Figure 50:
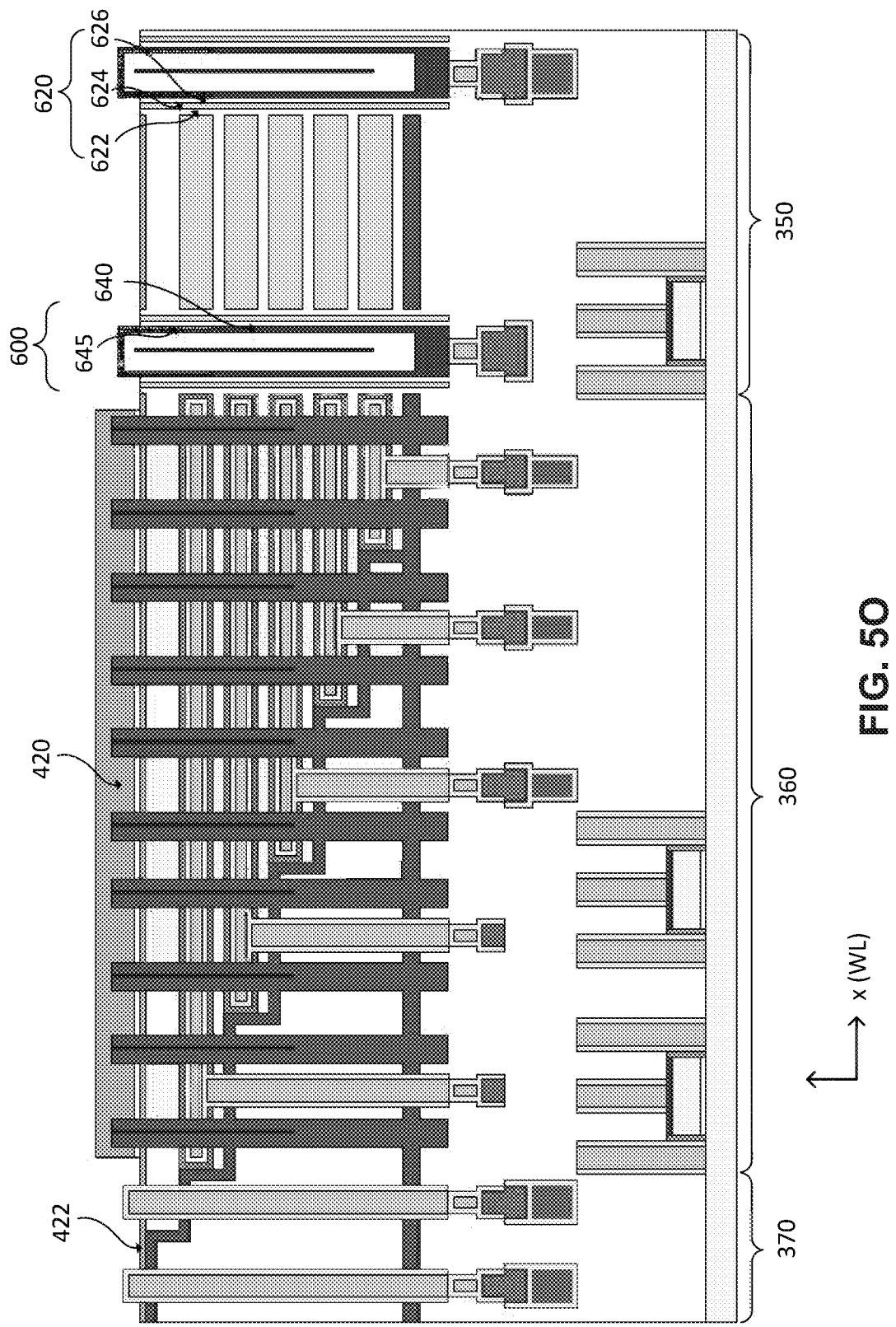

In some embodiments, operation S414 can further include removing portions of the first semiconductor layer 420 in the core array region 350 and periphery region 370, as shown in FIG. 5M (cross-sectional view in x-z plane) and FIG. 5N (cross-sectional view of core array region 350 in y-z plane). For example, using the remaining portion of the sacrificial dielectric layer 410 in the staircase region 360 as a mask, the portions of the first semiconductor layer 420 in the core array region 350 and periphery region 370 can be removed by a wet etching.

Referring back to FIG. 4, the method processed to operation S416, in which a portion of the functional layer of each channel structure can be removed to expose a portions of the channel layer of the channel structure, and the exposed portion of the channel layer can be doped.

Figure 5P:
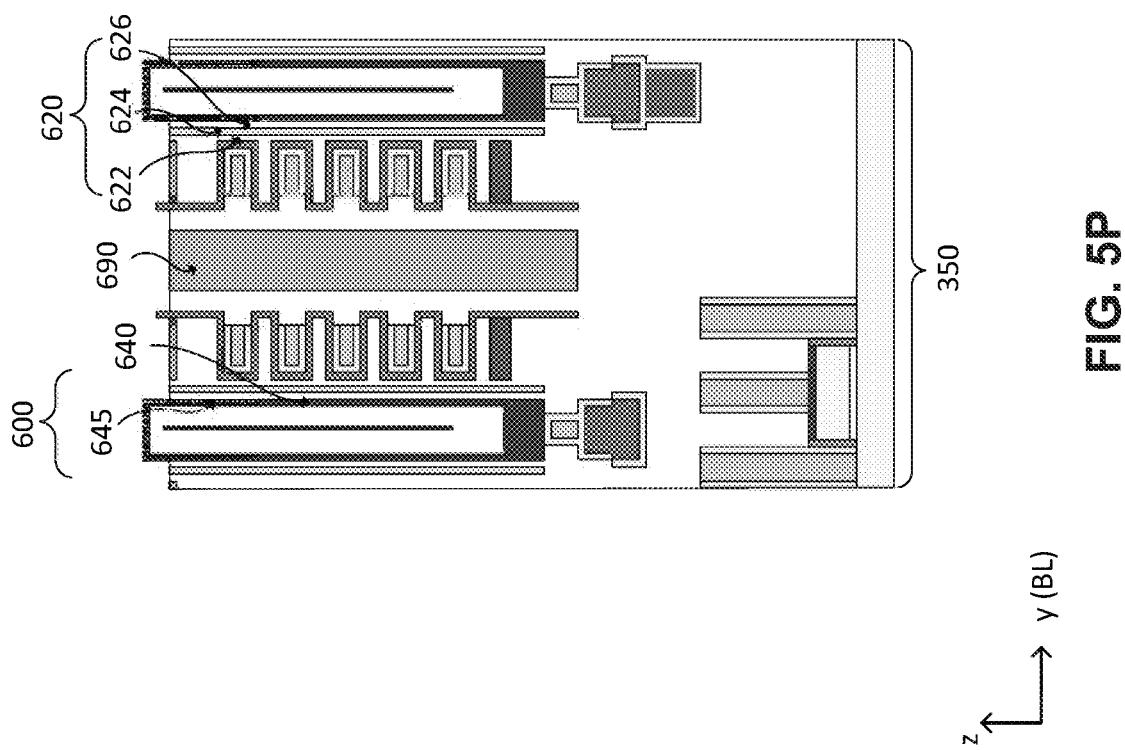

As shown in FIG. 5O (cross-sectional view in x-z plane) and FIG. 5P (cross-sectional view of core array region 350 in y-z plane), an upper portion of the functional layer 620 of each channel structure 600 can be removed. As described above, the functional layer 620 is a composite dielectric layer including a barrier layer 622, a storage layer 624, and a tunneling layer 626. As such, using the second semiconductor layer 422 as an etch stop layer, one or more selective etching processes can be performed to remove portions of the barrier layer 622, storage layer 624, and tunneling layer 626 of each channel structure 600 that are located above the second semiconductor layer 422. In some embodiments, the remaining portion of the sacrificial dielectric layer 410 in the staircase region 360 can be removed in the one or more selective etching processes as shown in FIG. 5O.

After the one or more selective etching processes, the channel layer 640 of each channel structure 600 can be exposed for a subsequent ion implantation (IMP) process to form a doped channel layer 645. In some embodiments, a portions of the channel layer 640 may be doped with p-type dopants (e.g., boron, indium, gallium, etc.), or n-type dopants (e.g., phosphorus, arsenic, etc.), or combinations thereof. For p-type in-situ doping, p-type doping precursors, such as, but not limited to, diborane ($B_2H_6$) and boron trifluoride ($BF_3$), can be used. For n-type in-situ doping, n-type doping precursors, such as, but not limited to, $PH_3$ and $AsH_3$, can be used.

Referring back to FIG. 4, the method processed to operation S418, in which a supplementary semiconductor layer can be formed to electrically connect with the doped channel layer of each channel structure and the one or more ACS contacts.

Figure 5Q:
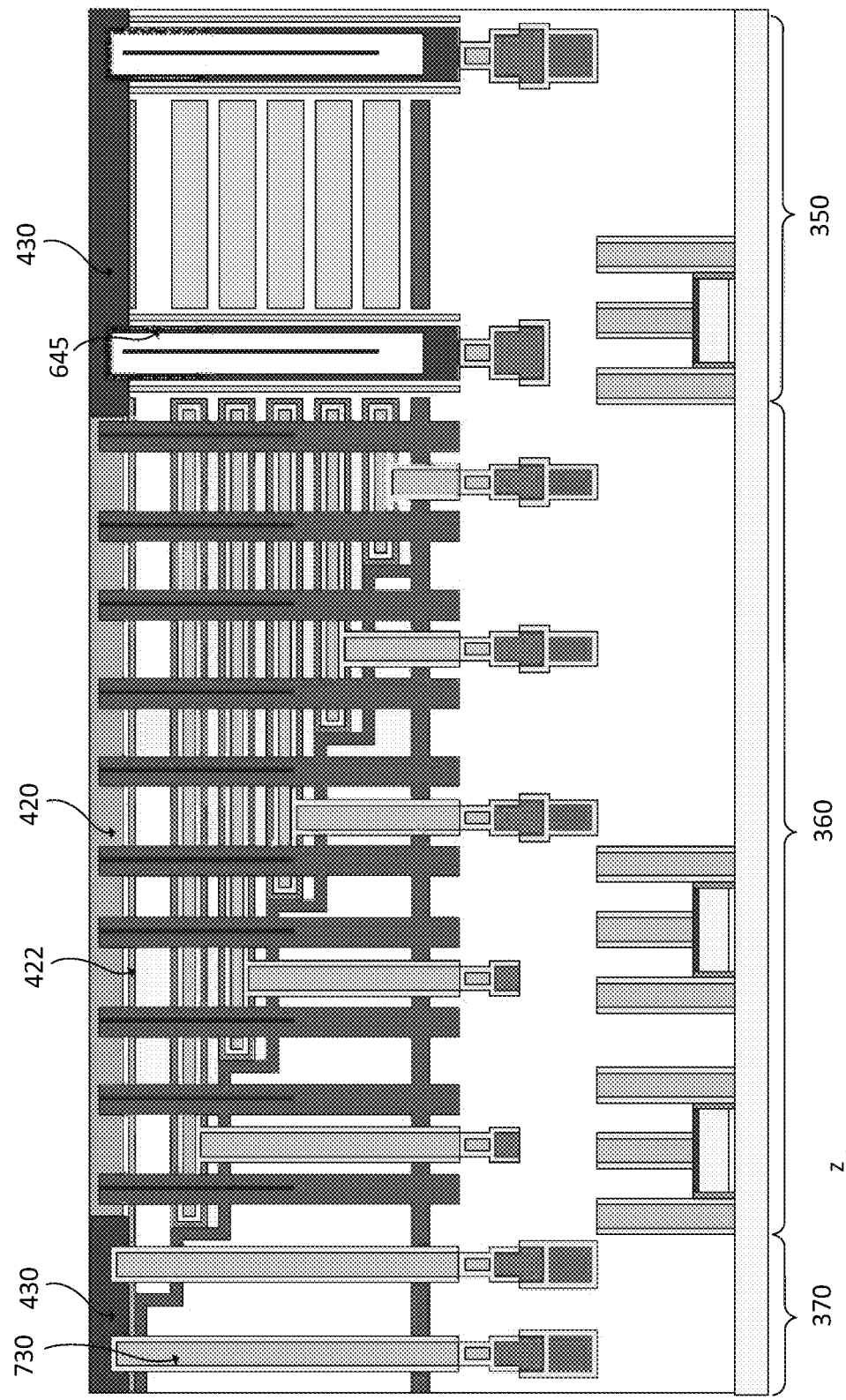
Figure 5R:
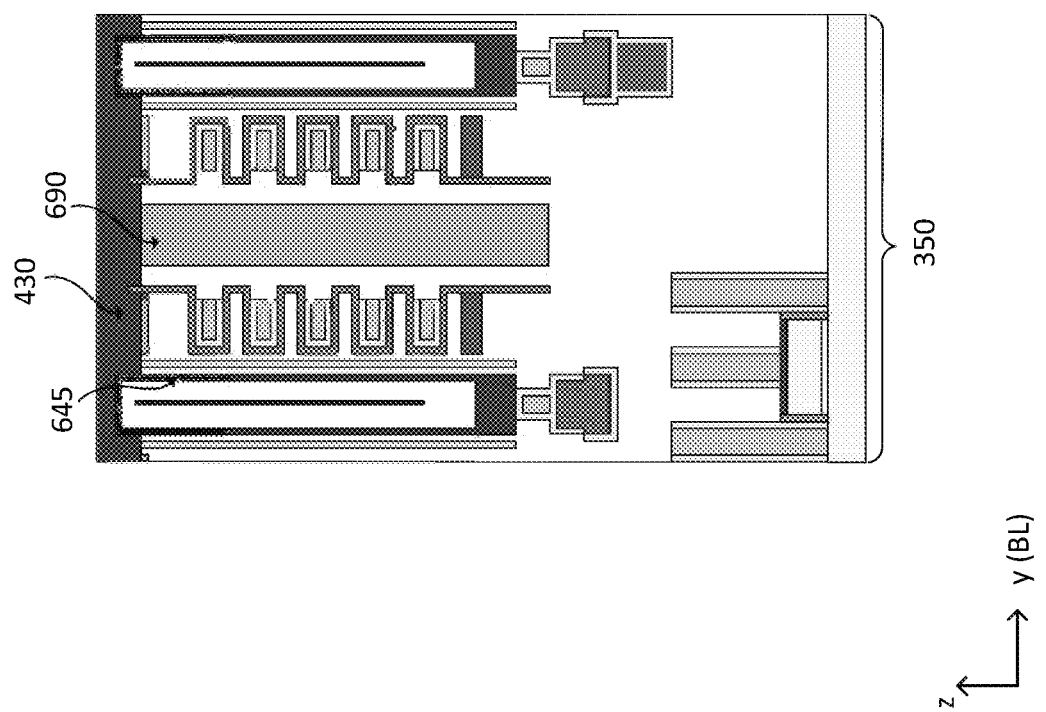

As shown in FIG. 5Q (cross-sectional view in x-z plane) and FIG. 5R (cross-sectional view of core array region 350 in y-z plane), the supplementary semiconductor layer 430 can be formed in the core array region 350 to electrically connected with the doped channel layer 645 of each channel structure 600. In some embodiments, the supplementary semiconductor layer 430 can be formed in the core array region 350 to electrically connected with the one or more ACS contacts 690. In some embodiments, the supplementary semiconductor layer 430 can be formed in the periphery region 370 to electrically connected with the multiple peripheral contacts 730. In some embodiments, the supplementary semiconductor layer 430 can be further formed in the staircase region 360 to fill the multiple recesses of dummy channel structures 650.

In some embodiments, fabricating processes of the supplementary semiconductor layer 430 can include depositing or epitaxially growing an silicon layer to cover the top surfaces of the structure as shown in FIG. 5O, and a followed chemical mechanical polishing (CMP) process to coplanarize the top surfaces of the amorphous silicon layer and the remaining portion of the first semiconductor layer 420. In some embodiments, the deposited semiconductor material or epitaxially-grown semiconductor material is the same material as the material of first semiconductor layer 420. In some embodiments, the deposited semiconductor material or epitaxially-grown semiconductor material includes a different material from the material of first semiconductor layer 420. The deposited semiconductor material or epitaxially-grown semiconductor material may include any suitable semiconductor material, such as silicon, germanium and silicon; compound semiconductor materials, such as gallium arsenide, and aluminum gallium arsenide; or a semiconductor alloy, such as silicon germanium and gallium arsenide phosphide.

In some embodiments, when the deposited semiconductor material is amorphous silicon, an activation process can then be performed to transform the amorphous silicon layer to a polycrystalline silicon layer. It is noted that, the activation process is optional, and can be performed in one or more predetermined regions of the structure. In some embodiments, the activation process may not be applied to the staircase region 360, such that the portions of the supplementary semiconductor layer 430 and the first semiconductor layer 420 in the staircase region 360 include amorphous silicon material. In some alternative embodiments, the activation process can be applied to the staircase region 360, such that at least exposed portions of the supplementary semiconductor layer 430 and first semiconductor layer 420 in the staircase region are transformed to polycrystalline silicon material.

Referring back to FIG. 4, the method processed to operation S420, in which a pad layer can be formed on the supplementary semiconductor to electrically connect with the channel layer of each channel structure and the and the one or more ACS contacts.

Figure 5S:
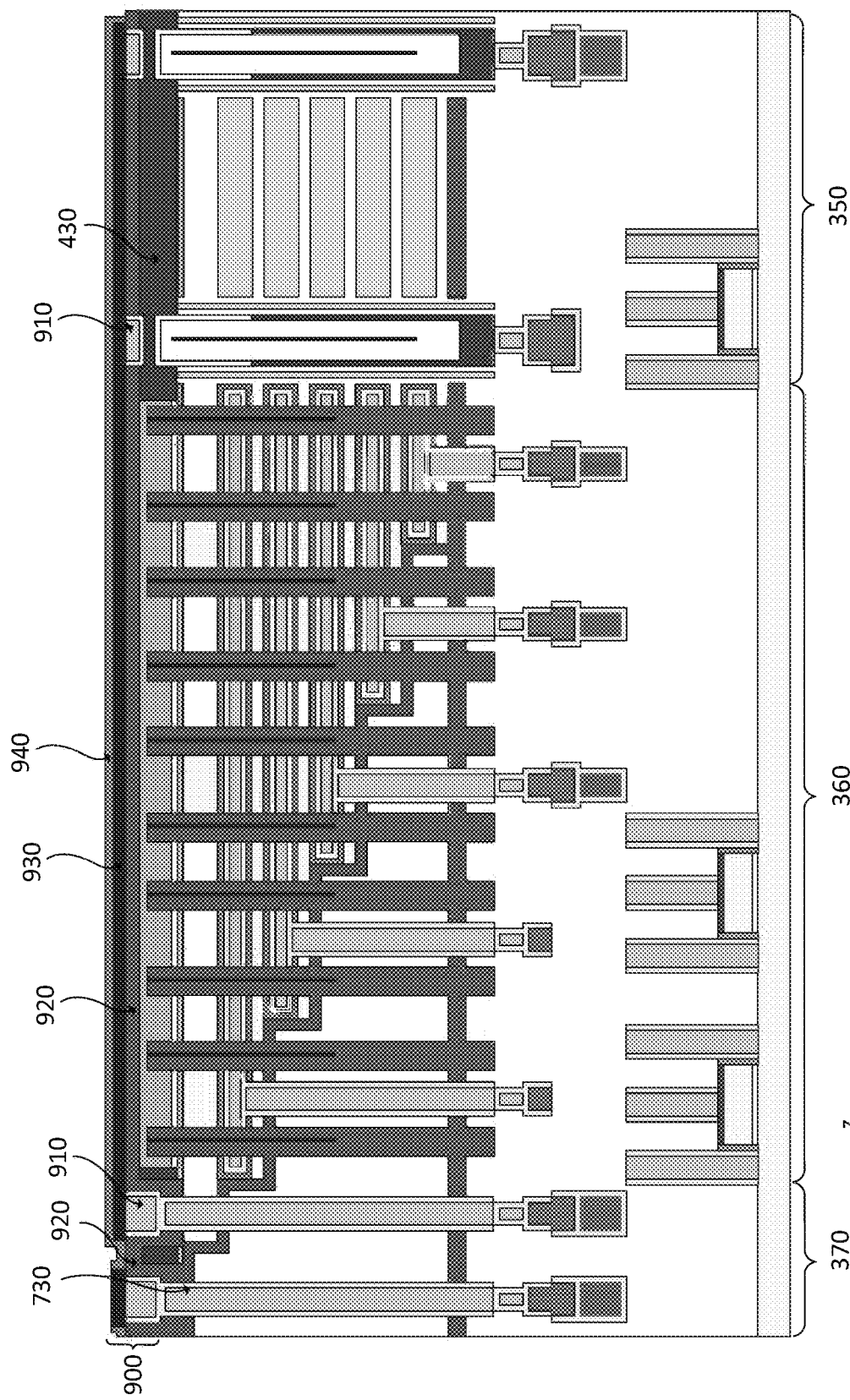
Figure 5T:
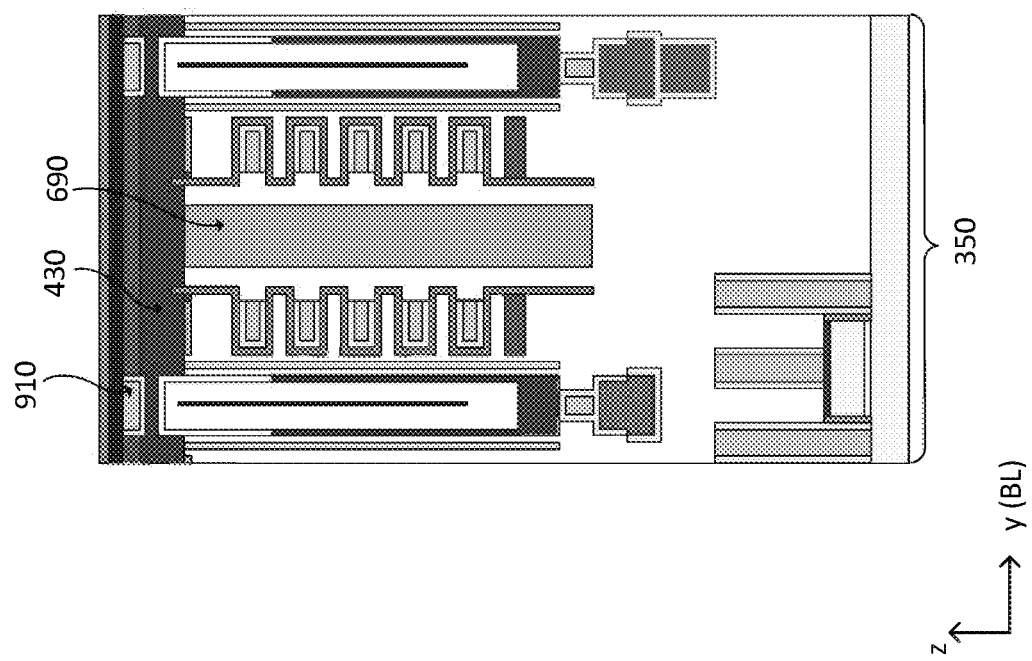

As shown in FIG. 5S (cross-sectional view in x-z plane) and FIG. 5T (cross-sectional view of core array region 350 in y-z plane), the pad layer 900 can include multiple pad structures 910 embedded in a dielectric layer 920 and in electric connection with the corresponding channel structure 600 or peripheral contact 730 respectively. The pad layer 900 can further include a wiring layer 930 on the pad structures 910 and the dielectric layer 920, and a protection layer 940 on the wiring layer 930.

The dielectric layer 920 can include one or more layers of dielectric materials such as silicon oxide, silicon nitride, silicon oxynitride, or any combination thereof, and can be formed by one or more thin film deposition processes, such as ALD, CVD, PVD, any other suitable processes, or any combination thereof. In some embodiments, before forming the dielectric layer 920, the supplementary semiconductor layer 430 in the periphery region 370 can be removed.

Each pad structure 910 can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof. The upper end of each pad structure 910 can be flush with one another at the top surface of dielectric layer 920, and the lower end of each pad structure 910 can be flush with one another at the bottom surface of the dielectric layer 920, and can be in contact with corresponding channel structure 600 or peripheral contact 730.

It is understood that, a contact process for forming the multiple pad structures 910 can include multiple processes, for example, photolithography, etching, thin film deposition, and CMP. In some embodiments, a hard mask layer can be formed on the dielectric layer 920, and multiple vertical through openings can be formed in the dielectric layer 920 by a wet etching and/or dry etching by using the hard mask layer. A followed deposition process can form the multiple pad structures 910 by filling the multiple vertical through openings with conductor materials using ALD, CVD, PVD, any other suitable processes, or any combination thereof. The conductor materials used for filling the multiple vertical through openings can include, but are not limited to, W, Co, Cu, Al, polysilicon, silicides, or any combination thereof.

The wiring layer 930 can be a patterned conductive layer formed on the pad structures 910 and the dielectric layer 920. In some embodiments, fabricating processes of forming wiring layer 930 can include forming a conductive layer over the pad structures 910 and the dielectric layer 920. After that, a resist mask is formed by a photolithography process, and an unnecessary portion is removed by etching to form wirings. In some embodiments, the resist mask used for forming the wiring layer 930 can be formed with an ink-jet method. The wiring layer 930 can be formed with a single-layer structure or a layered structure using any of metal materials such as molybdenum (Mo), titanium (Ti), chromium (Cr), tantalum (Ta), tungsten (W), aluminum (Al), copper (Cu), neodymium (Nd), scandium (Sc), etc., and an alloy material including any of these materials as a main component.

In some embodiments, the protection layer 940 can include an insulating sublayer and a polymer sublayer. The insulating sublayer can be a nitride layer, such as a metal nitride layer. The polymer sublayer can be any suitable nanoconfinement of polymers configured to prevent scratching of or damage to the wiring layer 930.

Accordingly, the present disclosure provides 3D NAND memory devices and fabricating methods thereof. In the disclosed methods, after removing the first substrate, the sacrificial dielectric layer is used as an etch stop layer. A single mask can be used to remove portions of the support stack in the core array region and the periphery region. Due to the existing of the sacrificial dielectric layer in the staircase region, after removing the first sacrificial semiconductor layer (e.g., polysilicon layer) in the core array region and the periphery region, the first sacrificial semiconductor layer in the staircase region can be kept to protect the dummy channel structures from damaging during the subsequent etching processes to remove the functional layer of channel structures, thereby avoid potential electric leakage between word lines and the substrate. Further, the disclosed methods have many advantages, such as simple fabricating processes, low product cost, desirable scalability between different generations of devices without being limited by the number of layers of stack, and wide process window, etc.

One aspect of the present disclosure provide a method for forming a three-dimensional (3D) memory device, comprising: forming an array wafer including a core array region, a staircase region, and a periphery region, comprising: forming an alternating dielectric stack on a first substrate, forming a plurality of channel structures in the alternating dielectric stack in the core array region, each channel structure including a functional layer and a channel layer, forming a staircase structure in the staircase region, and forming a plurality of dummy channel structures, and bonding a CMOS wafer to the array wafer; and removing the first substrate; removing a portion of functional layer of each channel structure to expose channel layer, and doping the exposed portion of the channel layer.

In some embodiments, the method can further comprises: before forming the alternating dielectric stack, forming a support stack on the first substrate, wherein the alternating dielectric stack is formed on the support stack; and before removing the portion of functional layer of each channel structure, removing portions of the support stack.

In some embodiments, forming the plurality of dummy channel structures comprises: forming the plurality of dummy channel structures penetrating the alternating dielectric stack and the support stack, and extending into the first substrate.

In some embodiments, forming the plurality of dummy channel structures comprises: forming the plurality of dummy channel structures penetrating the alternating dielectric stack without penetrating the support stack.

In some embodiments, forming the array wafer further comprises: forming a plurality of slits penetrating the alternating dielectric stack and the support stack; and forming an array common source contact in each slit.

In some embodiments, the method can further comprises: transforming the alternating dielectric stack into an alternating conductor/dielectric stack.

In some embodiments, forming the array wafer further comprises: forming a plurality of word line contacts in the staircase region; and forming a plurality of peripheral contacts in the peripheral region.

In some embodiments, forming the array wafer further comprises: forming an array joint layer including a plurality of interconnect contacts; wherein the CMOS wafer is bonded to the array joint layer of the array wafer.

In some embodiments, bonding the CMOS wafer to the array wafer comprises: preparing the CMOS wafer including a second substrate, a peripheral circuit layer on the second substrate, and a CMOS joint layer on the peripheral circuit layer; and bonding the CMOS joint layer of the CMOS wafer to the array joint layer of the array wafer to form a bonded structure.

In some embodiments, the method can further comprises: forming the support stack comprises: forming a sacrificial dielectric layer on the first substrate; forming a first semiconductor layer on the sacrificial dielectric layer; and forming a second semiconductor layer on the first semiconductor layer.

In some embodiments, removing the first substrate and portions of the support stack comprises: removing the first substrate by using the sacrificial dielectric layer as an etch stop layer; removing portions of the sacrificial dielectric layer in the core array region and periphery region; and removing portions of the first semiconductor layer in the core array region and periphery region.

In some embodiments, the method can further comprises: removing the portion of functional layer of each channel structure comprises: removing portions of a barrier layer, a storage layer, and a tunneling layer of each channel structure that are located above the second semiconductor layer; and simultaneously removing the portions of the sacrificial dielectric layer in the staircase region.

In some embodiments, the method can further comprises: forming a supplementary semiconductor layer electrically connected with the doped portion of the channel layer of each channel structure.

In some embodiments, the method can further comprises: forming a pad layer on the supplementary semiconductor layer and electrically connected with the channel layer of each channel structure.

In some embodiments, forming the alternating dielectric stack comprises: forming a plurality of dielectric layer pairs stacked on the support stack, each dielectric layer pair including a first dielectric layer and a second dielectric layer different from first dielectric layer.

In some embodiments, transforming the alternating dielectric stack into the alternating conductor/dielectric stack comprises: removing the plurality of second dielectric layers in the alternating dielectric stack through the slits to form a plurality of horizontal trenches; and forming a gate structure in each horizontal trench.

Another aspect of the three-dimensional (3D) memory device, comprising: a CMOS wafer; and an array wafer connected on the CMOS wafer, the array wafer including a core array region, a staircase region, and a periphery region, comprising: an alternating conductor/dielectric stack, including a staircase structure in the staircase region, and a plurality of channel structures in the alternating conductor/dielectric stack in the core array region, each channel structure including a functional layer and a channel layer, and the channel layer including a doped portion, a plurality of dummy channel structures penetrating the alternating conductor/dielectric stack, and a support stack in the staircase region.

In some embodiments, the device can further comprises: a supplementary semiconductor layer electrically connected with the doped portion of the channel layer of each channel structure; and a pad layer on the supplementary semiconductor layer and electrically connected with the channel layer of each channel structure.

In some embodiments, an upper end of each dummy channel structure is in contact with the supplementary semiconductor layer.

In some embodiments, an upper end of each dummy channel structure is in contact with a first semiconductor layer of the support stack.

In some embodiments, the device can further comprises: a plurality of slits penetrating the alternating conductor/dielectric stack; and an array common source contact in each slit and electrically connected to the supplementary semiconductor layer.

In some embodiments, the array wafer further comprises: a plurality of word line contacts in the staircase region; and a plurality of peripheral contacts in the peripheral region.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming an array wafer including a core array region, a staircase region, and a periphery region, comprising:
        forming a support stack on a first substrate,
        forming an alternating dielectric stack on the support stack,
        forming a plurality of channel structures in the alternating dielectric stack in the core array region, each channel structure including a functional layer and a channel layer,
        forming a staircase structure in the staircase region, and
        forming a plurality of dummy channel structures, and
    bonding a CMOS wafer to the array wafer;
    removing the first substrate;
    removing portions of the support stack; and
    removing a portion of the functional layer of each channel structure to expose a portion of the channel layer,
    wherein the support stack comprises a sacrificial dielectric layer, a first semiconductor layer, a second semiconductor layer, and an insulating layer between the first semiconductor layer and the second semiconductor layer,
    wherein the sacrificial dielectric layer is between the first semiconductor layer and the first substrate, and
    wherein the plurality of dummy channel structures extend through the alternating dielectric stack, the second semiconductor layer and the insulating layer, and extend into the first semiconductor layer.

2. The method of claim 1, further comprising:
    transforming the alternating dielectric stack into an alternating conductor/dielectric stack.

3. The method of claim 2, wherein forming the array wafer further comprises:
    forming a plurality of slits penetrating the alternating dielectric stack and the support stack, wherein each of the plurality of slits comprises a gate line spacer.

4. The method of claim 1, wherein forming the plurality of dummy channel structures comprises:
    forming the plurality of dummy channel structures penetrating the alternating dielectric stack and extending into the support stack.

5. The method of claim 1, wherein removing the first substrate and the portions of the support stack comprises:
    removing the first substrate by using the sacrificial dielectric layer as an etch stop layer;
    removing portions of the sacrificial dielectric layer in the core array region and the periphery region; and
    removing portions of the first semiconductor layer in the core array region and the periphery region.

6. The method of claim 1, further comprising:
    forming a supplementary semiconductor layer electrically connected with a doped portion of the channel layer of each channel structure; and
    forming a pad layer on the supplementary semiconductor layer and electrically connected with the channel layer of each channel structure.

7. A three-dimensional (3D) memory device, comprising:
    a CMOS structure; and
    an array structure on the CMOS structure, the array structure including a core array region, a staircase region, and a periphery region, comprising:
        an alternating conductor/dielectric stack, including a staircase structure in the staircase region, and a plurality of channel structures in the alternating conductor/dielectric stack in the core array region, each channel structure including a functional layer and a channel layer,
        a plurality of dummy channel structures penetrating the alternating conductor/dielectric stack, and
        a first semiconductor layer, a second semiconductor layer, and an insulating layer between the first semiconductor layer and the second semiconductor layer in the staircase region,
            wherein the second semiconductor layer is between the insulating layer and the alternating conductor/dielectric stack, and
            wherein the plurality of dummy channel structures extend through the alternating conductor/dielectric stack, the second semiconductor layer and the insulating layer, and extend into the first semiconductor layer.

8. The device of claim 7, further comprising:
    a supplementary semiconductor layer electrically connected with the channel layer of each channel structure.

9. The device of claim 8, further comprising:
    a pad structure electrically connected with the channel structures,
    wherein the supplementary semiconductor layer is between the pad structure and the alternating conductor/dielectric stack.

10. The device of claim 9, wherein the pad structure is embedded in a second dielectric layer, the second dielectric layer comprises one or more layers of dielectric material, and the dielectric material comprises at least one of silicon oxide, silicon nitride and silicon oxynitride.

11. The device of claim 8, wherein a material of the supplementary semiconductor layer is the same as that of the first semiconductor layer.

12. The device of claim 8, wherein a surface of the supplementary semiconductor layer away from the alternating conductor/dielectric stack is coplanar with a surface of the first semiconductor layer away from the alternating conductor/dielectric stack.

13. The device of claim 7, wherein an upper end of each dummy channel structure is in contact with the first semiconductor layer.

14. The device of claim 7, further comprising:
a plurality of slits penetrating the alternating conductor/dielectric stack, wherein each of the plurality of slits comprises a gate line spacer.

15. The device of claim 14, wherein the alternating conductor/dielectric stack comprises alternating gate structures and first dielectric layers, and the gate line spacer comprises a plurality of protrusions protruding toward corresponding gate structures of the alternating conductor/dielectric stack.

16. The device of claim 15, wherein each of the gate structures comprises a gate electrode surrounded by one or more insulating films.

17. The device of claim 14, wherein the alternating conductor/dielectric stack comprises alternating gate structures and first dielectric layers, and the first dielectric layers protrude toward the gate line spacer compared to the gate structures.

18. The device of claim 7, wherein the array structure further comprises:
a plurality of word line contacts in the staircase region; and
a plurality of peripheral contacts in the peripheral region.

19. The device of claim 18, wherein the array structure further comprises a filling insulating layer and a staircase insulating layer between the filling insulating layer and the staircase structure, and the word line contacts extend through the staircase insulating layer and contact with corresponding gate structures of the alternating conductor/dielectric stack.

* * * * *